US012635212B2

(12) United States Patent
Peng et al.

(10) Patent No.: US 12,635,212 B2
(45) Date of Patent: May 19, 2026

(54) SEMICONDUCTOR STRUCTURE WITH MODIFIED SPACER AND METHOD FOR FORMING THE SAME

(71) Applicant: Taiwan Semiconductor Manufacturing Company, Ltd., Hsinchu (TW)

(72) Inventors: Yu-Jiun Peng, Hsinchu (TW); Hsuan-Chih Wu, Hsinchu (TW); Cheng-Chung Chang, Kaohsiung (TW); Shu-Han Chen, Hsinchu (TW); Hsiu-Hao Tsao, Hsinchu (TW); Min-Chia Lee, Hsinchu (TW); Kai-Min Chien, Hsinchu (TW); Ming-Chang Wen, Kaohsiung (TW); Kuo-Feng Yu, Hsinchu County (TW); Chang-Jhih Syu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 916 days.

(21) Appl. No.: 17/831,130

(22) Filed: Jun. 2, 2022

(65) Prior Publication Data

US 2023/0187535 A1      Jun. 15, 2023

Related U.S. Application Data

(60) Provisional application No. 63/289,451, filed on Dec. 14, 2021.

(51) Int. Cl.

| | |
|---|---|
| *H10D 64/01* | (2025.01) |
| *H10D 30/01* | (2025.01) |
| *H10D 30/43* | (2025.01) |
| *H10D 30/67* | (2025.01) |

(Continued)

(52) U.S. Cl.
CPC ......... *H10D 64/021* (2025.01); *H10D 30/014* (2025.01); *H10D 30/43* (2025.01);
(Continued)

(58) Field of Classification Search
CPC .... H10D 64/021; H10D 30/014; H10D 30/43; H10D 30/6735; H10D 30/6757;
(Continued)

(56) References Cited

U.S. PATENT DOCUMENTS 9,484,406 B1 * 11/2016  Sun ........................ H10D 30/43
9,754,840 B2    9/2017  Lin et al.
(Continued)

FOREIGN PATENT DOCUMENTS

TW          201901960 A      1/2019

*Primary Examiner* — Duy T Nguyen
*Assistant Examiner* — Pratiksha Jayant Lohakare
(74) *Attorney, Agent, or Firm* — HAYNES AND BOONE, LLP

(57) ABSTRACT

Semiconductor structures and methods for manufacturing the same are provided. The method for manufacturing the semiconductor structure includes forming a fin structure protruding from a substrate, and the fin structure includes first semiconductor material layers and second semiconductor material layers alternately stacked. The method also includes forming a dummy gate structure across the fin structure and forming a gate spacer on a sidewall of the dummy gate structure. The method also includes partially oxidizing the gate spacer to form an oxide layer and removing the oxide layer to form a modified gate spacer. The method also includes removing the first semiconductor material layers to form gaps and forming a gate structure in the gaps to wrap around the second semiconductor material layers and over the second semiconductor material layers to cover the modified gate spacer.

20 Claims, 59 Drawing Sheets

(51) Int. Cl.
    *H10D 62/10*          (2025.01)
    *H10D 84/01*          (2025.01)
    *H10D 84/03*          (2025.01)

(52) U.S. Cl.
    CPC ..... *H10D 30/6735* (2025.01); *H10D 30/6757*
        (2025.01); *H10D 62/121* (2025.01); *H10D*
        *64/017* (2025.01); *H10D 84/0128* (2025.01);
        *H10D 84/013* (2025.01); *H10D 84/0147*
        (2025.01); *H10D 84/038* (2025.01)

(58) Field of Classification Search
    CPC .............. H10D 62/121; H10D 64/017; H10D
        84/0128; H10D 84/013; H10D 84/0147;
        H10D 84/038; H10D 30/797; H10D
        62/822; H10D 62/151; H10D 62/364;
        H10D 64/015; B82Y 10/00
    USPC ....................................................... 257/288
    See application file for complete search history.

(56)                References Cited

U.S. PATENT DOCUMENTS 9,818,872  B2    11/2017  Ching et al.
    10,032,627 B2     7/2018  Lee et al.

| 10,290,546 | B2 | 5/2019 | Chiang et al. | |
| 10,475,902 | B2 | 11/2019 | Lee et al. | |
| 10,950,731 | B1 | 3/2021 | Peng et al. | |
| 11,031,292 | B2 | 6/2021 | Ju et al. | |
| 2004/0262699 | A1* | 12/2004 | Rios | H10D 30/024 |
| | | | | 438/197 |
| 2005/0224800 | A1* | 10/2005 | Lindert | H10D 30/791 |
| | | | | 257/66 |
| 2005/0253203 | A1* | 11/2005 | Liaw | H10D 30/6212 |
| | | | | 257/397 |
| 2006/0163662 | A1* | 7/2006 | Kinoshita | H10D 84/038 |
| | | | | 257/E21.426 |
| 2007/0267694 | A1* | 11/2007 | Ko | H10D 64/021 |
| | | | | 257/E29.267 |
| 2013/0069161 | A1* | 3/2013 | Yang | H10D 64/665 |
| | | | | 257/E21.585 |
| 2013/0256764 | A1* | 10/2013 | Liaw | H10D 30/024 |
| | | | | 257/E29.022 |
| 2014/0339611 | A1 | 11/2014 | Leobandung | |
| 2015/0035071 | A1* | 2/2015 | Ching | H10D 84/0158 |
| | | | | 257/369 |
| 2020/0044060 | A1* | 2/2020 | Cheng | H10D 64/021 |
| 2021/0074829 | A1* | 3/2021 | Tang | H10D 30/024 |
| 2021/0233997 | A1* | 7/2021 | Chen | H01L 21/31116 |
| 2022/0262928 | A1* | 8/2022 | Chan | H10D 30/6735 |

* cited by examiner

SEMICONDUCTOR STRUCTURE WITH MODIFIED SPACER AND METHOD FOR FORMING THE SAME

PRIORITY CLAIM AND CROSS-REFERENCE

This Application claims the benefit of U.S. Provisional Application No. 63/289,451, filed on Dec. 14, 2021, the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. However, integration of fabrication of the GAA features can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIG. 2O-1 illustrates the diagrammatic top view of the semiconductor structure 100, in accordance with some embodiments.

FIG. 2O-2 illustrates a cross-sectional view of the semiconductor structure 100 shown along line B-B' of FIG. 2O-1, in accordance with some embodiments.

FIGS. 7A to 7F illustrate intermediate stages of manufacturing a semiconductor structure in accordance with some embodiments.

FIGS. 8A to 8D illustrate intermediate stages of manufacturing a semiconductor structure in accordance with some embodiments.

FIGS. 11A to 11G illustrate intermediate stages of manufacturing a semiconductor structure in accordance with some embodiments.

DETAILED DESCRIPTION

Figure 1A:
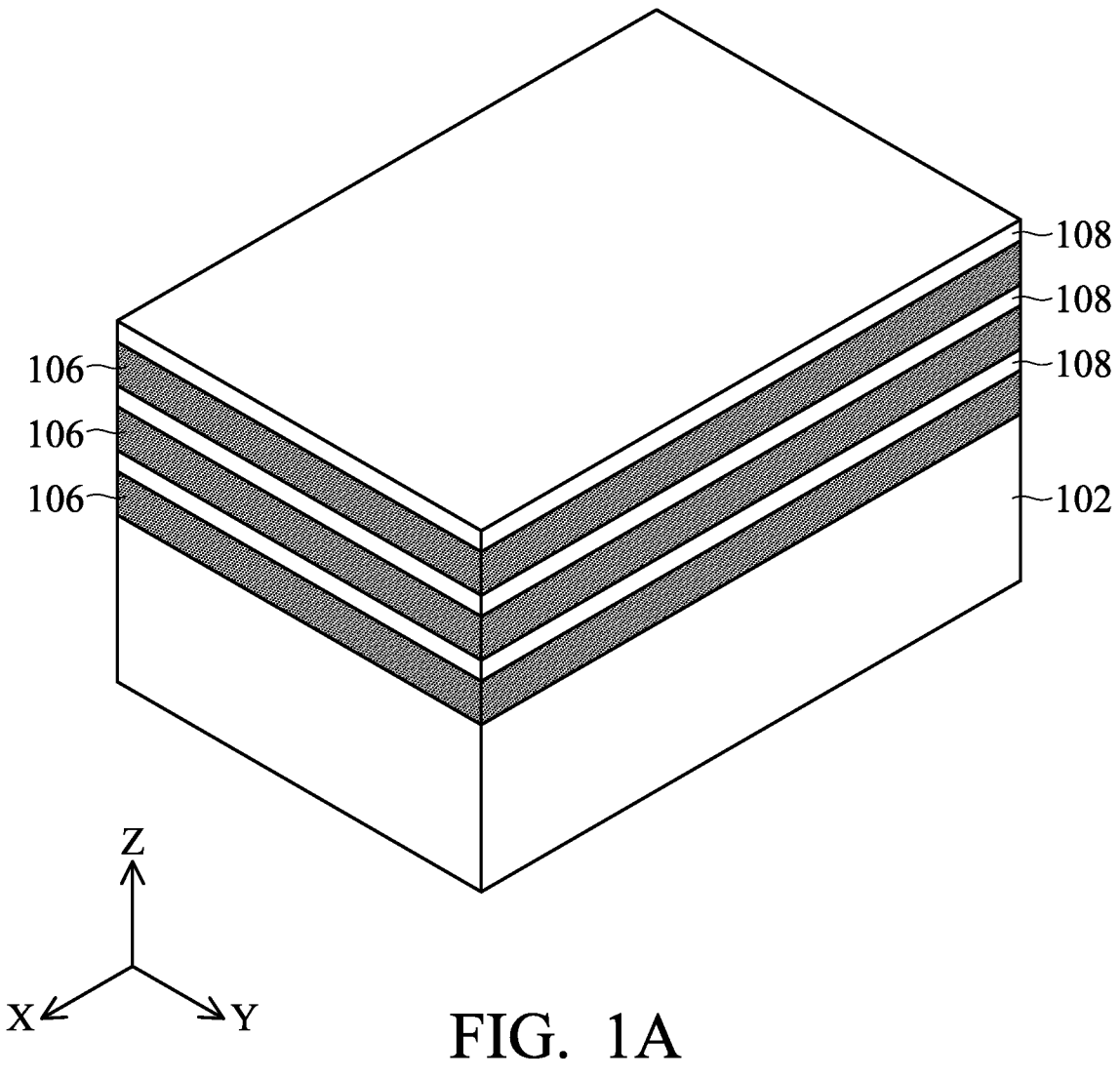
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistors (e.g. nanosheet transistors, nanowire transistors, multi-bridge channel transistors, nanoribbon FET, and gate all around (GAA) transistors) described below may be patterned by any suitable method.

Embodiments of semiconductor structures and methods for forming the same are provided. The method for forming the semiconductor structure may include forming a dummy gate structure and gate spacers on the sidewalls of the dummy gate structure. Afterwards, the dummy gate structure may be removed to form a gate trench and the shape of the gate trench may be modified. Since the gate structure may be formed in the modified gate trench, formation of voids and/or seams within the gate structure may be reduced or prevented. Accordingly, the performance of the resulting semiconductor structure may be improved.

Figure 1B:
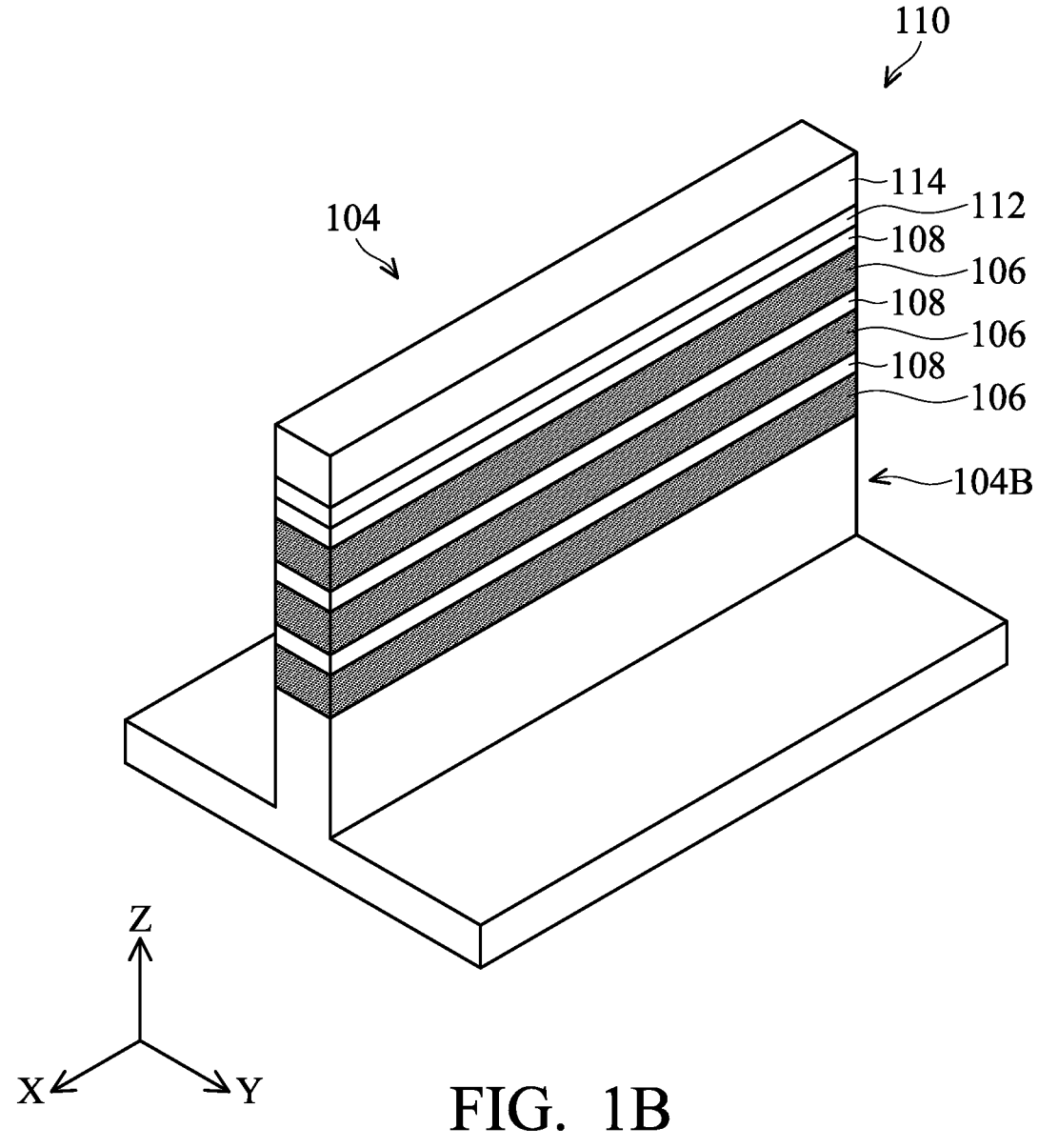
Figure 1C:
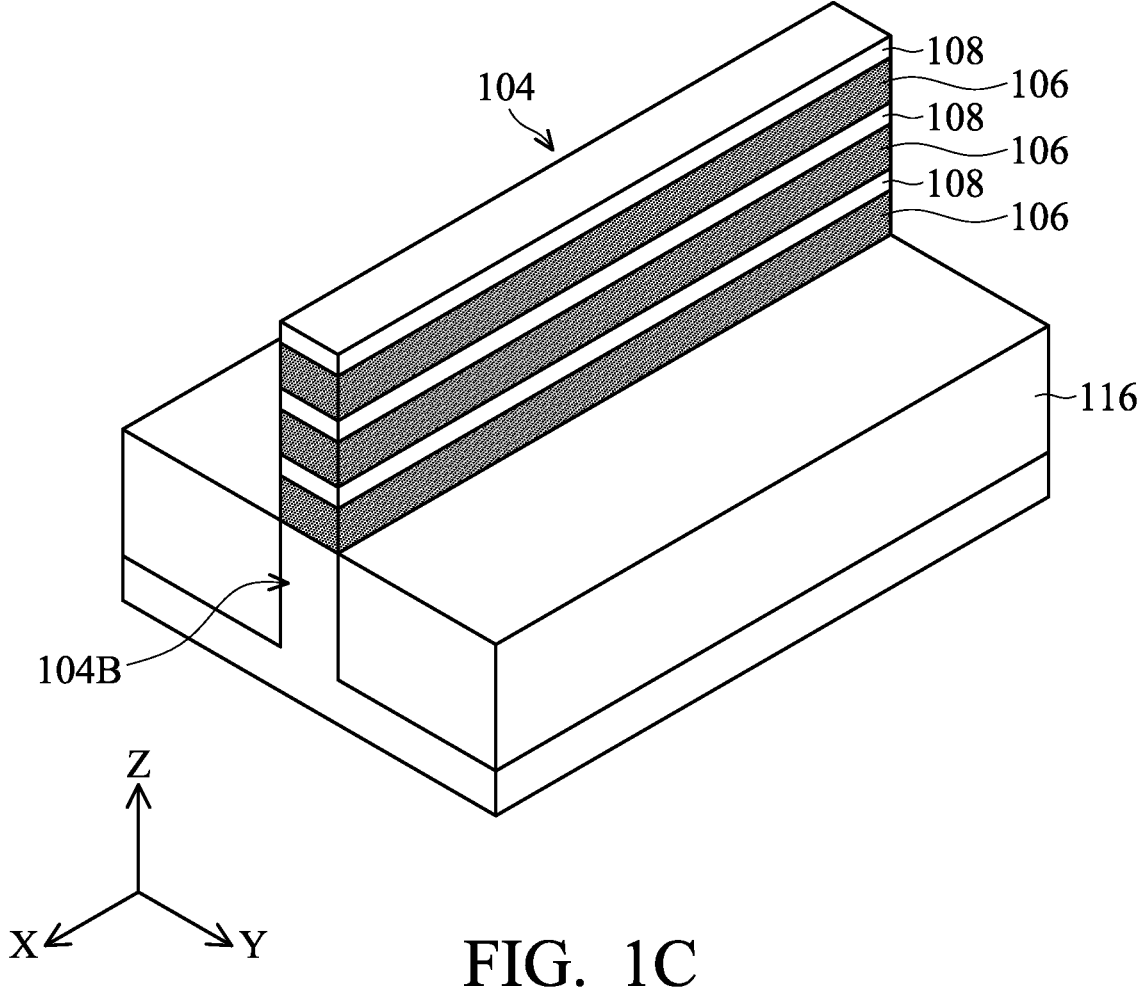
Figure 1D:
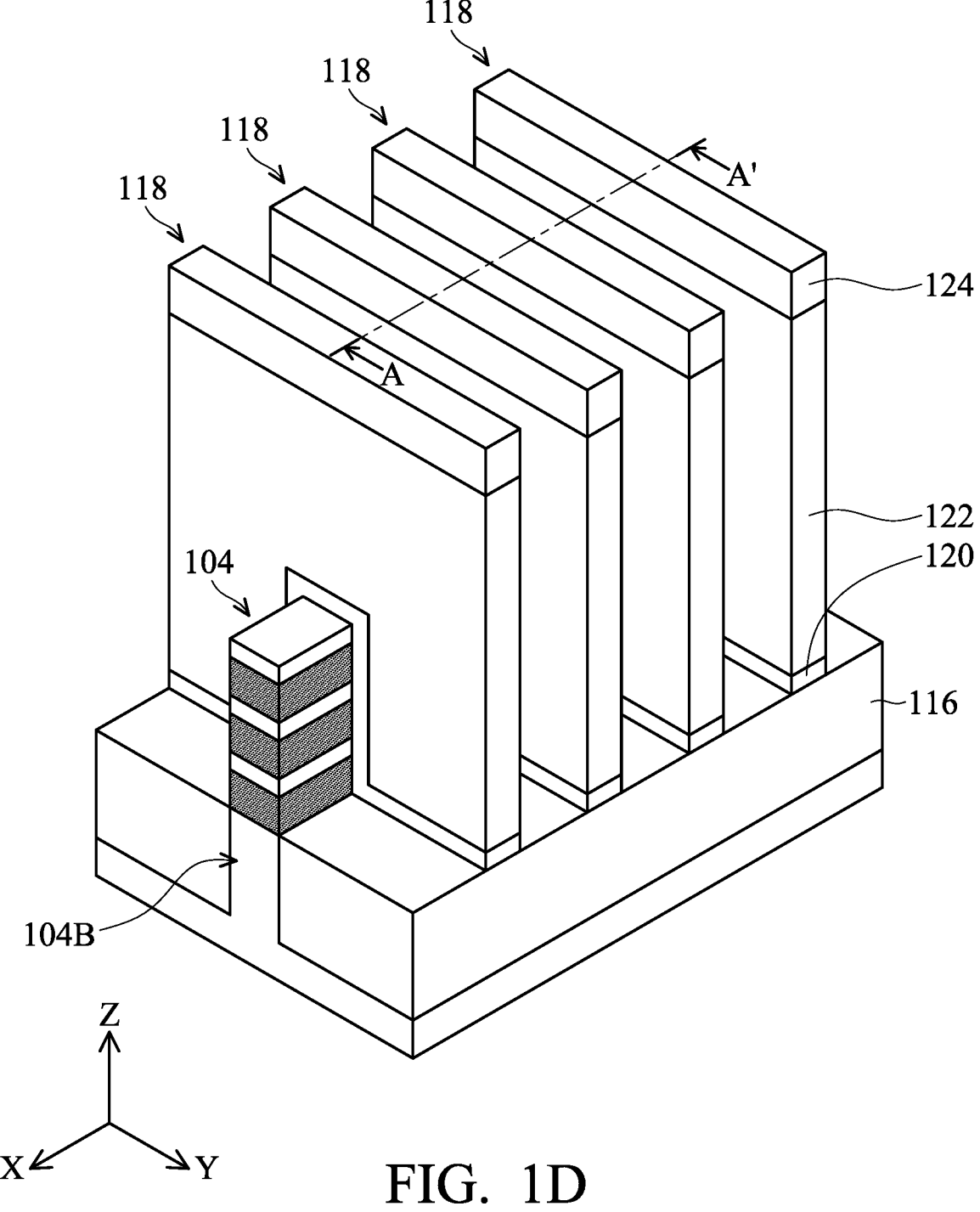
Figure 1E:
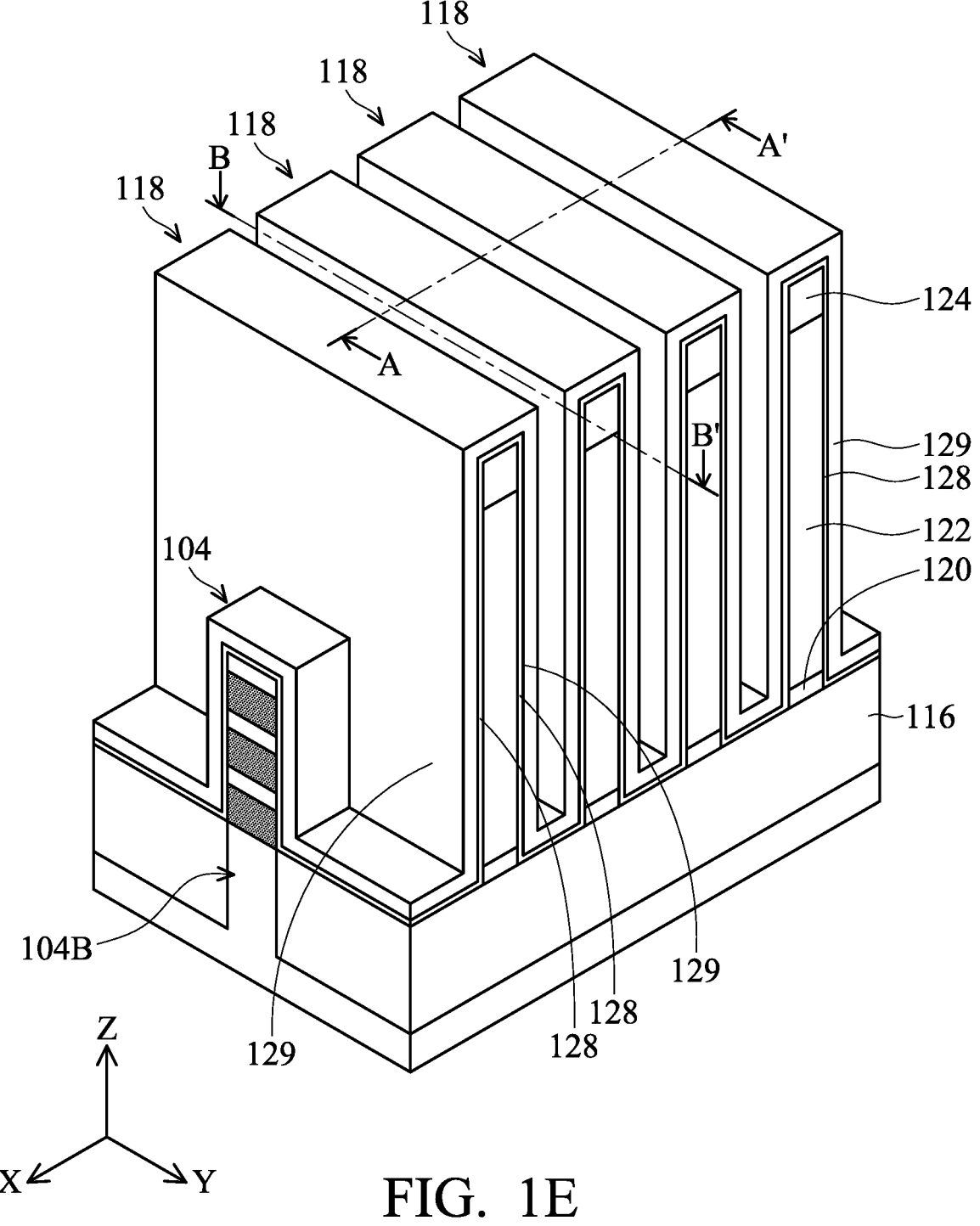
Figure 2A:
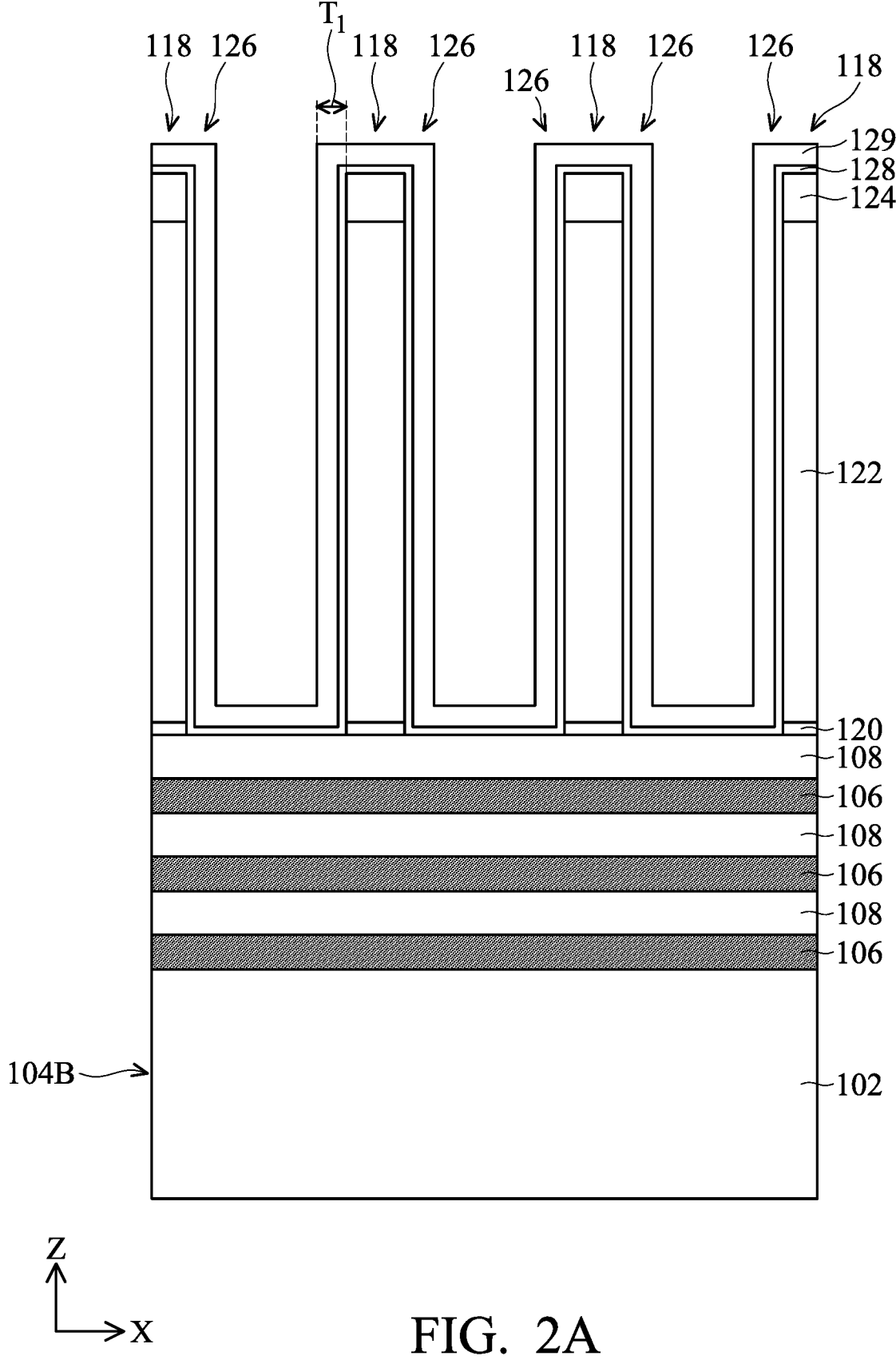
FIGS. 2A to 2O illustrate cross-sectional representations of various stages of manufacturing the semiconductor structure shown along line A-A' in FIG. 1E in accordance with some embodiments.
Figure 2B:
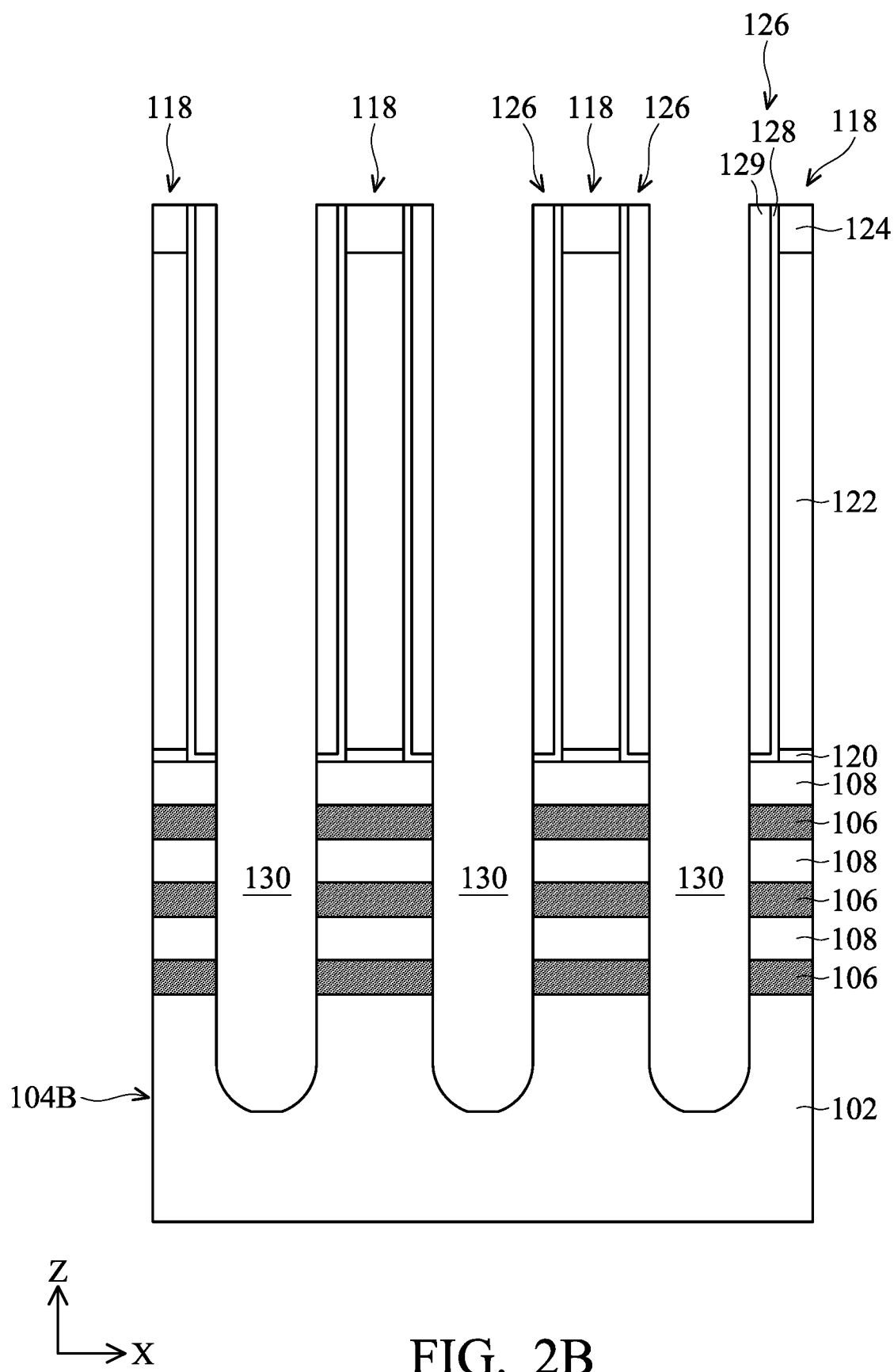

FIGS. 1A to 1E illustrate perspective views of intermediate stages of manufacturing a semiconductor structure 100 in accordance with some embodiments. FIGS. 2A to 2O illustrate cross-sectional representations of various stages of manufacturing the semiconductor structure 100 shown along line A-A' in FIG. 1E in accordance with some embodiments. More specifically, FIG. 2A illustrates the cross-sectional representation shown along line A-A' in FIG. 1E, and FIGS. 2B to 2O illustrate the processes afterwards in accordance with some embodiments.

As shown in FIG. 1A, first semiconductor material layers 106 and second semiconductor material layers 108 are formed over a substrate 102 in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked to form a semiconductor material stack over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or less numbers of the first semiconductor material layers 106 and the second semiconductor material layers 108. For example, the semiconductor structure may include two to five of the first semiconductor material layers 106 and the second semiconductor material layers individually.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

After the semiconductor material stack are formed over the substrate 102, the semiconductor material stack is patterned to form a fin structure 104 (e.g. extending along the X direction), as shown in FIG. 1B in accordance with some embodiments. In some embodiments, the fin structure 104 includes a base fin structure 104B and the semiconductor material stack of the first semiconductor material layers 106 and the second semiconductor material layers 108. For example, fin structures, such as the fin structure 104, may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to etch the substrate to form the fin structures.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or CVD, and the nitride layer 114 may be made of silicon nitride, which is formed by CVD, such as LPCVD or plasma-enhanced CVD (PECVD).

After the fin structure 104 is formed, an isolation structure 116 is formed around the fin structure 104, and the mask structure 110 is removed, as shown in FIG. 1C in accordance with some embodiments. The isolation structure 116 is configured to electrically isolate active regions (e.g. the fin structure 104) of the semiconductor structure 100 and is also referred to as shallow trench isolation (STI) feature in accordance with some embodiments.

The isolation structure 116 may be formed by depositing an insulating layer over the substrate 102, planarizing the insulating layer and recessing the planarized insulating layer so that the fin structure 104 is protruded from the isolation structure 116. In some embodiments, the isolation structure 116 is made of silicon oxide, silicon nitride, silicon oxynitride (SiON), another suitable insulating material, or a combination thereof. A single or multiple dielectric liner layers (not shown) may be formed before the isolation structure 116 is formed. In some embodiments, a dielectric liner is made of silicon nitride and the isolation structure formed over the dielectric liner is made of silicon oxide.

After the isolation structure 116 is formed, dummy gate structures 118 are formed across the fin structure 104 and extend over the isolation structure 116 (i.e. along the Y direction), as shown in FIG. 1D in accordance with some embodiments. The dummy gate structures 118 may be used to define the source/drain regions and the channel regions of the resulting semiconductor structure 100.

In some embodiments, each of the dummy gate structures 118 includes a dummy gate dielectric layer 120 and a dummy gate electrode layer 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, CVD, ALD, physical vapor deposition (PVD), another suitable method, or a combination thereof.

In some embodiments, the dummy gate electrode layers 122 are made of a conductive material. In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using CVD, PVD, or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material, such as polysilicon, may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

After the dummy gate structures 118 are formed, spacer layers are conformally deposited over the top and sidewall surfaces of the dummy gate structures 118 and the fin structure 104 and over the top surfaces of the isolation structure 116, as shown in FIGS. 1E and 2A in accordance with some embodiments.

In some embodiments, the spacer layers include a first spacer layer 128 and a second spacer layer 129. In some other embodiments, only one spacer layer is formed.

In some embodiments, the first spacer layers 128 and the second spacer layers 129 are made of different dielectric materials selected from silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the first spacer layers 128 and the second spacer layers 129 are made of different nitride base dielectric materials. In some embodiments, the dielectric constant (k) of the second spacer layer 129 is lower than the dielectric constant (k) of the first spacer layers 128. In some other embodiments, the first spacer layers 128 and the second spacer layers 129 are made of the same dielectric material such as SiN.

Next, the first spacer layers 128 and the second spacer layers 129 are pattered to formed gate spacers 126, and the source/drain regions of the fin structure 104 are recessed to form source/drain recesses 130, as shown in FIG. 2B in accordance with some embodiments. The gate spacers 126 may be configured to define the gate trench after the dummy gate structures 118 are removed. The formation of the gate spacers 126 may include performing an anisotropic etching process, such as dry plasma etching, to remove the first dielectric material and the second dielectric material covering the top surfaces of the dummy gate structures 118, the fin structure 104, and portions of the isolation structure 116.

In some embodiments, each of the first spacers 128 has a first portion extending along the sidewalls of the dummy gate structure 118 and a second portion formed on (e.g. laterally extending on) the top surface of the topmost layer of the second semiconductor material layers 108. In some embodiments, the first portion and the second portion of the first spacer layer 128 form a L shape in the cross-sectional view, as shown in FIG. 2A. In some embodiments, the second spacer layer 129 is vertically above the second portion of the first spacer layer 128. In some embodiments, the thickness Ti of the gate spacer 126 (i.e. the total thickness of the first spacer layer 128 and the second spacer layer 129) is in a range from about 1 nm to about 10 nm. The gate spacers 126 should be thick enough to maintain integrity of the gate trench during the gate replacement process performed afterwards. On the other hand, the gate spacers 126 should not be too thick or the device size may be increased. In some embodiments, the second spacer layer

129 is thicker than the first spacer layer 128. In some other embodiments, the first spacer layer 128 is thicker than, or has the same thickness with, the second spacer layer 129.

Next, the first semiconductor material layers 106 and second semiconductor material layers 108 not covered by the dummy gate structures 118 and the gate spacers 126 are etched in accordance with some embodiments. In addition, some portions of the base fin structure 104B are also recessed in accordance with some embodiments.

In some embodiments, the fin structure 104 is recessed by performing an etching process. The etching process may be an anisotropic etching process, such as dry plasma etching, and the dummy gate structure 118 and the gate spacers 126 are used as etching masks during the etching process. In some embodiments, the bottom surfaces of the source/drain recesses 130 are lower than the top surface of the isolation structure 116.

Figure 2C:
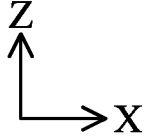

After the source/drain recesses 130 are formed, the first semiconductor material layers 106 exposed by the source/drain recesses 130 are laterally recessed to form notches 132, as shown in FIG. 2C in accordance with some embodiments. In some embodiments, an etching process is performed to laterally recess the first semiconductor material layers 106 of the fin structure 104 from the source/drain recesses 130. In some embodiments, during the etching process, the first semiconductor material layers 106 have a greater etching rate (e.g. etching amount) than the second semiconductor material layers 108, thereby forming notches 132 between the adjacent second semiconductor material layers 108. In some embodiments, the portions of the second semiconductor material layers 108 exposed by the source/drain recesses 130 are also partially etched when forming the notches 132, and therefore the depth of the notches 132 gradually decreases from the side closer to the source/drain region to the side closer to the channel region. In some embodiments, the etching process includes dry chemical etching, remote plasma etching, wet etching, other applicable technique, and/or a combination thereof.

Figure 2D:
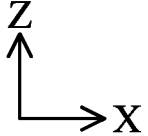

Next, inner spacers 134 are formed in the notches 132 between the second semiconductor material layers 108, as shown in FIG. 2D in accordance with some embodiments. The inner spacers 134 are configured to separate the source/drain structures and the gate structures formed in subsequent manufacturing processes in accordance with some embodiments. In some embodiments, the inner spacers 134 have curved (e.g. rounded) sidewalls facing the channel regions. In some embodiments, the thickness of each of the inner spacers 134 continuously decreases towards the channel region. In some embodiments, each of the inner spacers 134 is thicker at the side closer to the source/drain region and is thinner at the side closer to the channel region.

The inner spacers 134 may be formed by conformally forming a dielectric material layer in the notches 132 and covering sidewalls of the recesses 130 and the gate spacers 126 and etching the dielectric material layer to remove the dielectric material layer outside the notches 132. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

Figure 2E:
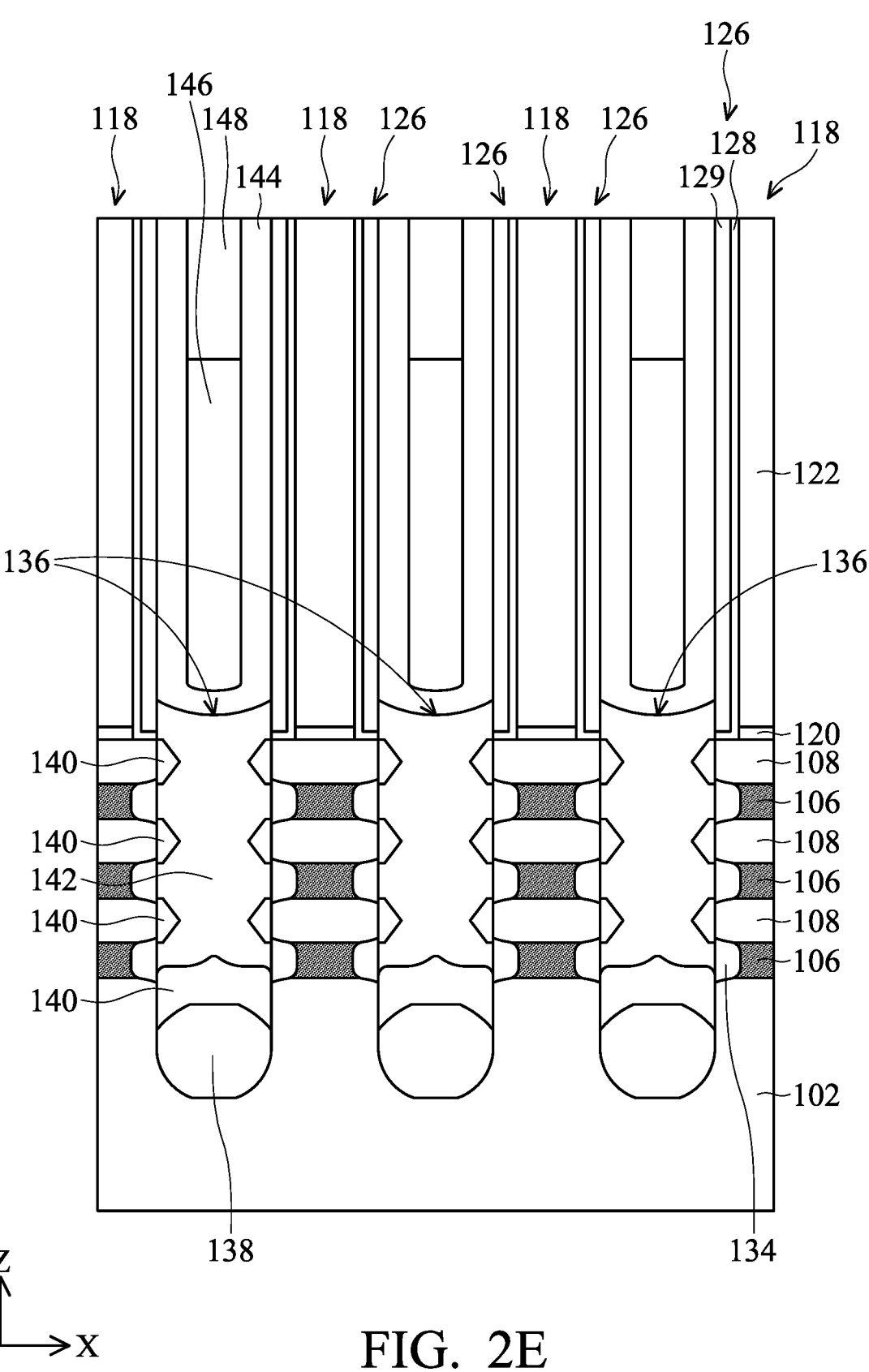

After the inner spacers 134 are formed, source/drain structures 136 are formed in the source/drain recesses 130, as shown in FIG. 2E in accordance with some embodiments. In some embodiments, each of the source/drain structures 136 includes a first portion 138, second portions 140, and third portions 142.

The first portions 138 of the source/drain structures 136 may be used as blocking layers to prevent backside leakage. In some embodiments, the first portions 138 are formed in the bottom regions of the source/drain recesses 130. In some embodiments, the topmost surface of the first portions 138 of the source/drain structures 136 is lower than the bottom-most layer of the first semiconductor material layers 106 and the second semiconductor material layers 108. In some embodiments, the first portions 138 of the source/drain structures 136 are thicker at the middle portions and have convex top surfaces.

In some embodiments, the first portions 138 of the source/drain structures 136 are made of an undoped semiconductor material, such as undoped Si or undoped SiGe. In some embodiments, the first portions 138 of the source/drain structures 136 are formed by performing an epitaxial growth process. The epitaxial growth process may be molecular beam epitaxy (MBE) process, metal organic chemical vapor deposition (MOCVD) process, vapor phase epitaxy (VPE) process, or other applicable techniques. An etching process may be performed after performing the epitaxial growth process to form the first portions 138 of the source/drain structures 136 with the designed thicknesses.

After the first portions 138 are formed, the second portions 140 and the third portions 142 are formed to fill the source/drain recesses 130, as shown in FIG. 2E in accordance with some embodiments. More specifically, the second portions 140 are formed to cover the top surface of the first portions 138 and are formed on the exposed sidewalls of the second semiconductor material layers 108 in accordance with some embodiments. The third portions 142 are then formed over and around the second portions 140 to fill the source/drain recesses 130 in accordance with some embodiments.

In some embodiments, the second portions 140 include separated portions grown from each of the exposed sidewalls of second semiconductor material layers 108 and bottom portions grown over the first portions 138. In some embodiments, the bottom portions of the second portions 140 are in direct contact with the first portions 138, the base fin structure 104B, and the inner spacers 134. In some embodiments, the top surfaces of the bottom portions of the second portions 140 are not flat and have slightly higher middle portions. In some embodiments, the third portions 142 are formed in the source/drain recesses 130 around the second portions 140. In some embodiments, the third portions 142 are in direct contact with the inner spacers 134. In some embodiments, the second portions 140 and the third portions 142 of the source/drain structures 136 are both formed by using an epitaxial growth process, such as MBE, MOCVD, VPE, other applicable epitaxial growth process, or a combination thereof.

In some embodiments, the second portions 140 and the third portions 142 are made of Si, Ge, SiGe, AlGaAs, GaAsP, SiP, SiC, SiCP, InAs, InGaAs, InSb, GaAs, GaSb, InAlP, InP, or a combination thereof. In some embodiments, the second portions 140 and the third portions 142 of the source/drain structures 136 are in-situ doped during the epitaxial growth process. In some embodiments, the second portions 140 and the third portions 142 are made of the same semiconductor material with the same dopants but with different dopant concentrations. In some embodiments, the dopant concentration in the third portions 142 is greater than the dopant concentration in the second portions 140. In some embodiments, the second portions 140 and the third portions 142 of the source/drain structures 136 include the epitaxially grown SiGe doped with boron (B), and the boron concentration in the third portions 142 is higher than the boron concentration in the second portions 140. In some other embodiments, the second portions 140 and the third portions 142 of the source/drain structures 136 include the epitaxially grown Si doped with carbon to form silicon:carbon (Si:C) source/drain features, phosphorous to form silicon:phosphorus (Si:P) source/drain features, or both carbon and phosphorous to form silicon carbon phosphor (SiCP) source/drain features. In some embodiments, the first portions 138, the second portions 140, and the third portions 142 are made of the same semiconductor material but the second portions 140 and the third portions 142 are doped with dopants while the first portion 138 are not.

After the source/drain structures 136 are formed, contact etch stop layer (CESL) 144 are conformally formed to cover the source/drain structures 136, as shown in FIG. 2E in accordance with some embodiments. In some embodiments, a cleaning process is performed to the top surface of the source/drain structures 136 before forming the contact etch stop layers 144, such that the top portions of the source/drain structures 136 are partially recessed. In some embodiments, the source/drain structures 136 have concave top surfaces. The contact etch stop layers 144 are then formed over the concave top surfaces of the source/drain structures 136 and over the sidewalls of the gate spacers 126 in accordance with some embodiments.

In some embodiments, the contact etch stop layers 144 are made of a dielectric materials, such as silicon nitride, silicon oxide, silicon oxynitride, other applicable dielectric materials, or a combination thereof. The dielectric material for the contact etch stop layers 144 may be conformally deposited over the semiconductor structure by performing CVD, ALD, other application methods, or a combination thereof.

Next, interlayer dielectric (ILD) layers 146 are formed over the contact etch stop layers 144, as shown in FIG. 2E in accordance with some embodiments. The interlayer dielectric layers 146 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layers 146 may be formed by chemical vapor deposition (CVD), physical vapor deposition, (PVD), atomic layer deposition (ALD), or other applicable processes.

After the contact etch stop layers 144 and the interlayer dielectric layers 146 are deposited, a planarization process such as CMP or an etch-back process may be performed until the gate electrode layers 122 of the dummy gate structures 118 are exposed in accordance with some embodiments. Afterwards, the top portions of the interlayer dielectric layers 146 may be removed to form recesses, and a mask material layer may be formed in the recesses and over the contact etch stop layer 144, the dummy gate structures 118, and the gate spacers 126. The mask material layer is then polished to form mask structures 148 in the recesses over the interlayer dielectric layers 146, as shown in FIG. 2E in accordance with some embodiments. In some embodiments, an etching process is performed to selectivity etch the interlayer dielectric layers 146 to form the recesses, while the contact etch stop layer 144, the dummy gate structures 118, and the gate spacers 126 are substantially unetched during the etching process. That is, the recesses may be formed in a self-aligned manner without using additional mask structures. In some embodiments, the mask structures 148 are made of a dielectric material different from that for forming the interlayer dielectric layers 146. In some embodiments, the mask structures 148 are made of SiN, SiCN, SiOC, SiOCN, $HfO_2$, $ZrO_2$, $HfAlO_x$, $HfSiO_x$, $Al_2O_3$, or the like. In some embodiments, the mask structures 148 are made of a nitride and the interlayer dielectric layer 146 is made of an oxide. In some embodiments, the mask structures 148 and the contact etch stop layers 144 are made of the same material (e.g. nitride). In some embodiments, the mask structures 148 and the contact etch stop layers 144 are made of different materials. The mask structure 148 and the contact etch stop layers 144 may be used to protect the structure underneath in subsequent etching process.

Figure 2F:
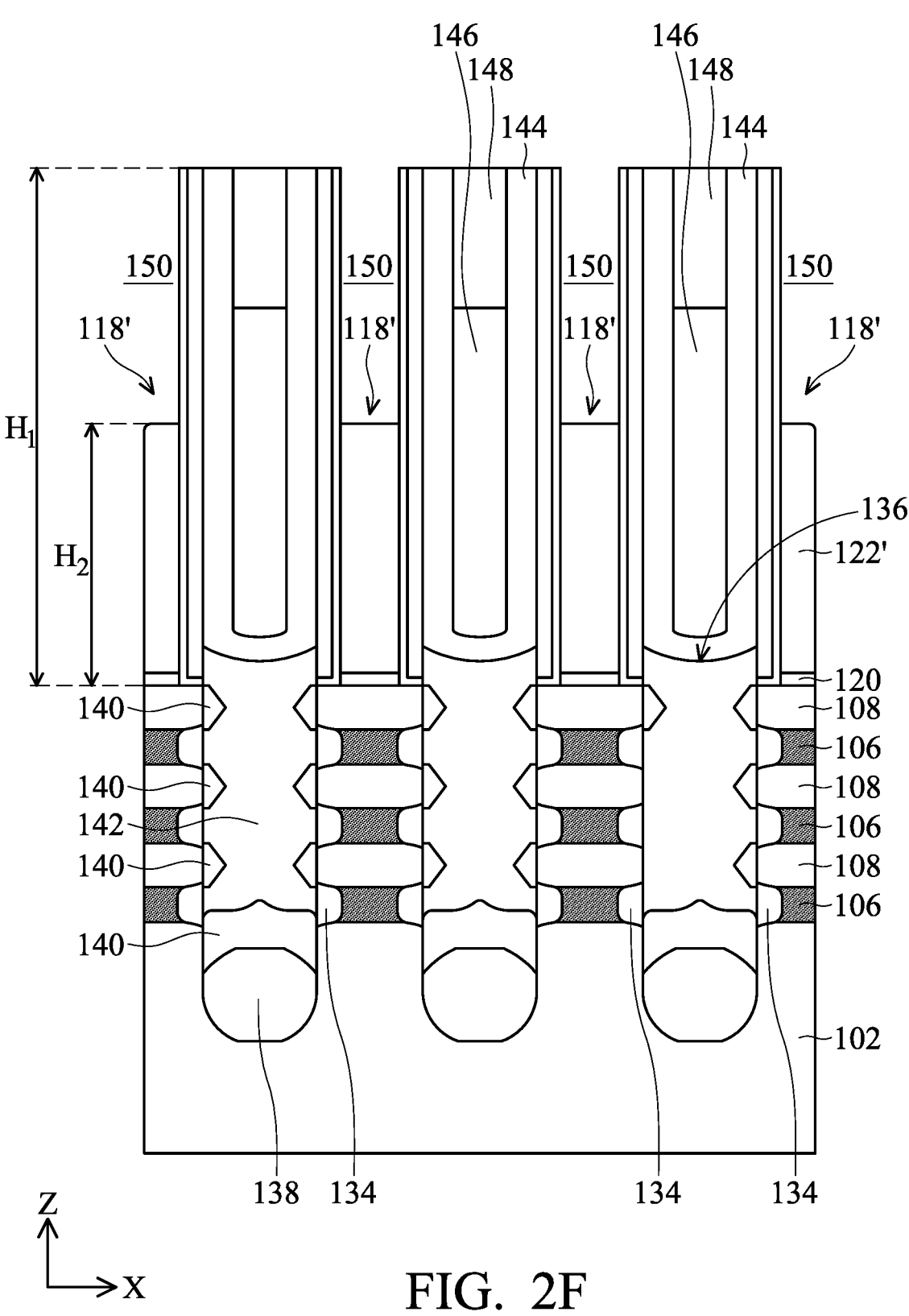

Next, the dummy gate structures 118 are recessed to form trenches 150 over shortened dummy gate structures 118', as shown in FIG. 2F in accordance with some embodiments. More specifically, the dummy gate electrode layers 122 are recessed to form shortened dummy gate electrode layers 122', and the trenches 150 expose the upper portions of the sidewalls of the gate spacers 126 in accordance with some embodiments. In some embodiments, the top surfaces of the shortened dummy gate electrode layers 122' are lower than the bottom surfaces of the mask structures 148. In embodiments of the present disclosure, the height $H_2$ of the shortened dummy gate structure 118' is smaller than the height $H_1$ of the original dummy gate structure 118 at the channel region. Generally speaking, a greater difference between the height $H_1$ and the height $H_2$ may increase the process window when forming the functional gate stacks that replace the dummy gate structures. That is, a greater difference between the height $H_1$ and the height $H_2$ may reduce void or seam in the functional gate stacks. In some instances a ratio of the height $H_2$ to the height $H_1$ may be between about 0.4 and 0.9. This ratio is not trivial. When the ratio is smaller than 0.4, the dummy gate shortening process is more likely to damage the mask structures 148 and the contact etch stop layer 144. When the ratio is greater than 0.9, the probability to have voids or seams in the functional gate stacks may still be too high to justify the additional dummy gate shortening process.

The dummy gate structures 118 may be recessed by performing an etching process. In some embodiments, the etching process includes dry chemical etching, remote plasma etching, wet etching, other applicable technique, and/or a combination thereof. In some embodiments, the etchant used in the etching process may include $NH_4OH$. The height of the shortened dummy gate structure 118' may be adjusted by controlling the time of performing the etching process.

Figure 2G:
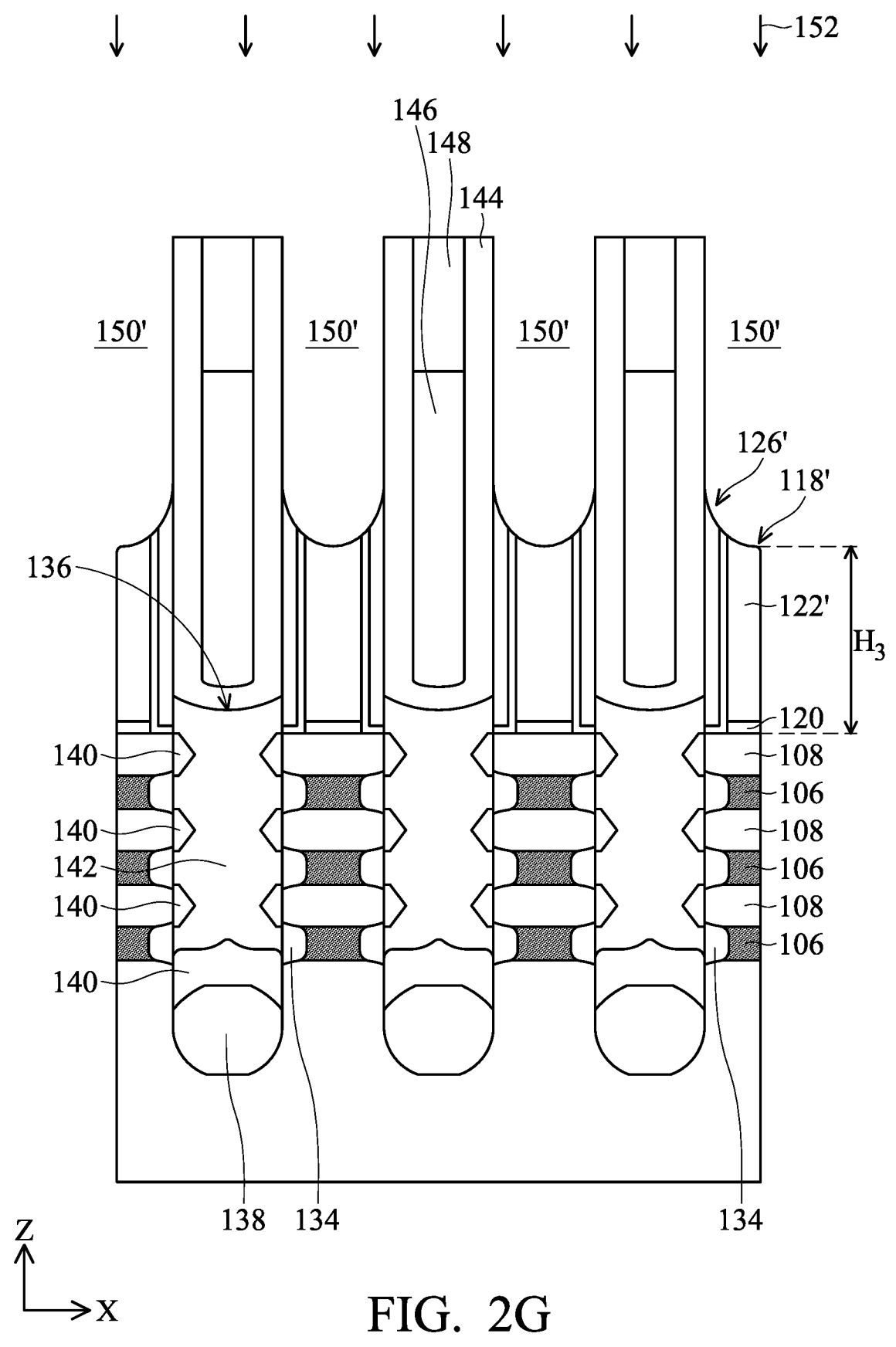

Next, the gate spacers 126 are partially removed to form shortened gate spacers 126' and therefore to form enlarged trenches 150', as shown in FIG. 2G in accordance with some embodiments. More specifically, an etching process 152 is performed to etch the portions of the gate spacers 126 exposed by the trenches 150 in accordance with some embodiments. The etching selectivity between the contact etch stop layers 144 and the gate spacers 126 may be relatively high during the etching process 152, so the contact etch stop layers 144 may not or only slightly etched. In some embodiments, the contact etch stop layers 144 have substantially straight sidewalls exposed by the enlarged trenches 150'. In addition, since the bottom sidewalls of the gate spacers 126 are covered by the shortened dummy gate structure 118', the bottom portions of the gate spacers 126 are protected during the etching process 152. In some embodiments, the etching process 152 includes dry chemical etching, remote plasma etching, wet etching, other applicable technique, and/or a combination thereof. In some embodiments, the etchants used in the etching process 152 include $CF_4$ or dilute HF. In some embodiments, the etching process 152 stop as the shortened gate spacers 126' have similar height with the shortened dummy gate electrode layers 122' (e.g. by controlling the performing time of the etching process 152).

In some embodiments, the shortened dummy gate electrode layers 122' are also partially etched during the etching process 152. In some embodiments, the shortened dummy gate structures 118' and the shortened gate spacers 126' have curved top surfaces after performing the etching process 152. In some embodiments, the middle portions of the shortened dummy gate structures 118' after performing the etching process 152 have the height $H_3$ less than the height $H_2$ before performing the etching process 152. After the etching process 152 is performed, the contact etch stop layers 144 are partially exposed by the enlarged trenches 150' in accordance with some embodiments. In some other embodiments, the heights of the shortened dummy gate electrode layers 122' are not further decreased during the etching process 152.

Figure 2H:
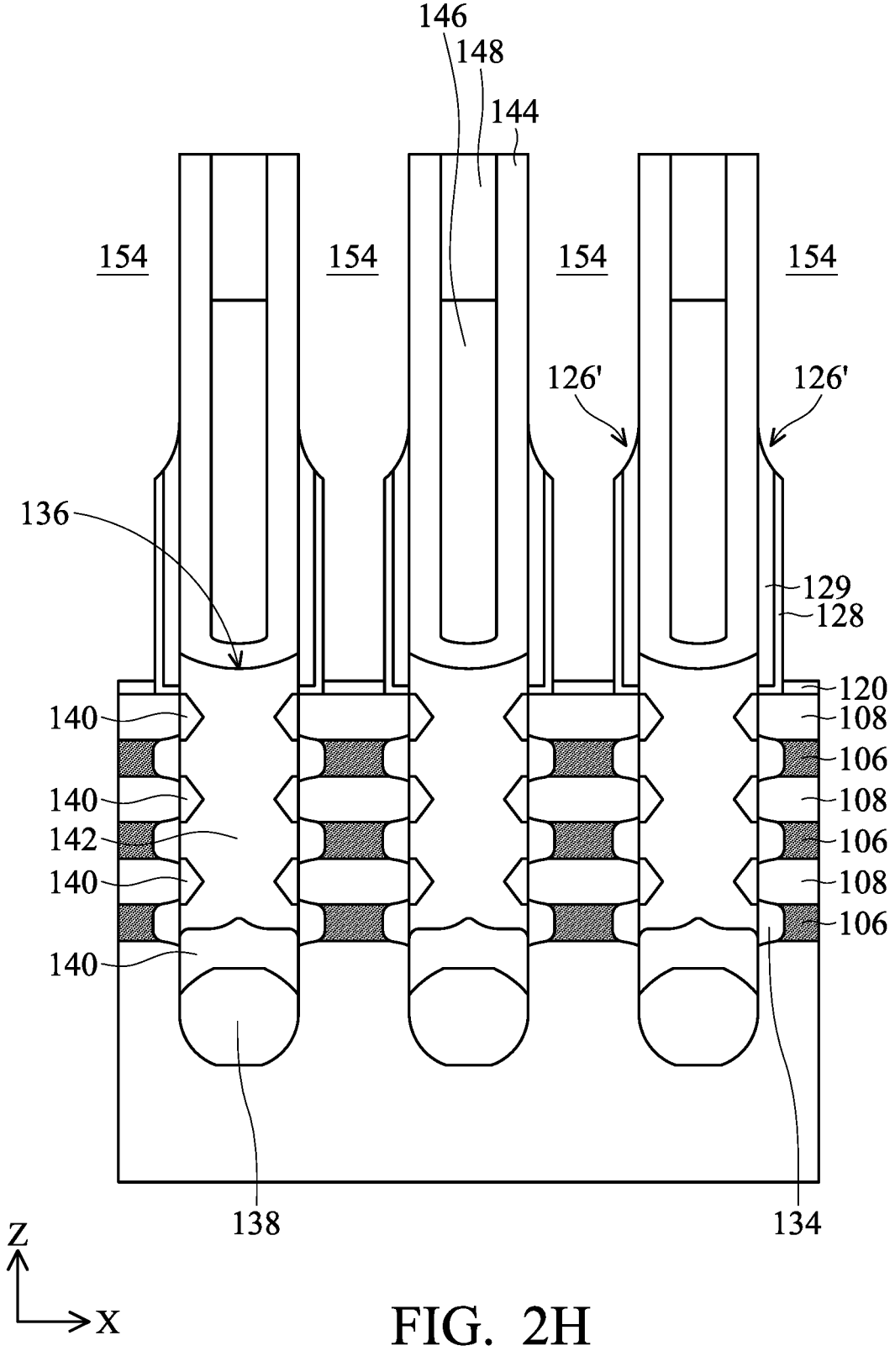

Next, the shortened dummy gate electrode layers 122' are completely removed to form gate trenches 154, as shown in FIG. 2H in accordance with some embodiments. More specifically, the shortened dummy gate electrode layers 122' are completely removed to expose the dummy gate dielectric layers 120 and the sidewalls of the shortened gate spacers 126' in accordance with some embodiments. In some embodiments, the shortened dummy gate electrode layers 122' are removed by performing a wet etching process. In some embodiments, a wet etchant such as a tetramethylammonium hydroxide (TMAH) solution may be used to selectively remove the shortened dummy gate electrode layers 122'. Since the second semiconductor material layers 108 are covered by the dummy gate dielectric layers 120, the second semiconductor material layers 108 are protected by the dummy gate dielectric layers 120 during the etching process for removing the shortened dummy gate electrode layers 122'.

Figure 2I:
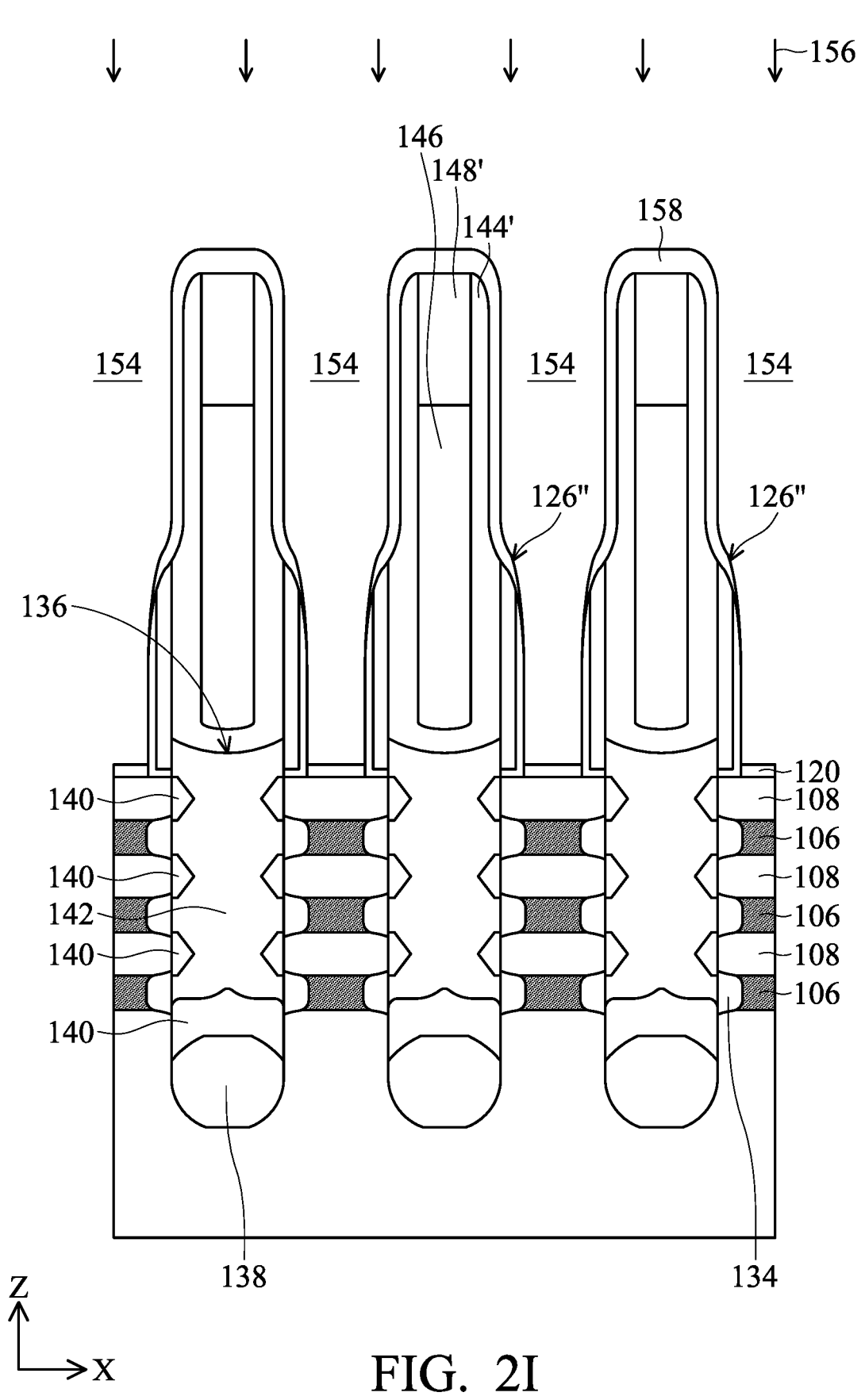

Afterwards, an oxidation treatment 156 is performed to form oxide layers 158, as shown in FIG. 2I in accordance with some embodiments. The oxidation treatment 156 is configured to shape the profile of the gate trenches 154, so that the uniformity of the formation of the gate structures formed therein in subsequent processes may be improved. More specifically, the exposed portions of the shortened gate spacers 126', the contact etch stop layer 144, and the mask structures 148 are partially oxidized during the oxidation treatment 156, and the oxide layers 158 are formed over modified gate spacers 126'', modified contact etch stop layer 144', and modified mask structures 148' in accordance with some embodiments.

In some embodiments, the oxidation treatment 156 is performed at a temperature in a range from about 300° C. to about 500° C. In some embodiments, the oxidation treatment 156 is performed for a time in a range from about 10 sec to about 180 sec. In some embodiments, the oxidation treatment 156 is performed using a gas including $O_2$, He, Ar, or $N_2$. In some embodiments, the flow rate of the gas used in the oxidation treatment 156 is in a range from about 100 sccm to about 1000 sccm. In some embodiments, the oxidation treatment 156 is performed under a plasma power in a range from about 200 W to about 2000 W. In some embodiments, the oxidation treatment 156 is performed under a pressure in a range from about 5 mTorr to about 300 mTorr. In some embodiments, the oxidation treatment 156 includes a decoupled plasma oxide (DPO) process. Generally, the plasma power is proportional to the ion density. That is, if more ion concentration is required, more plasma power may also be required. However, during the decoupled plasma oxide process, the relatively high ion concentration may be achieved under a relatively low plasma power. That is, the oxide layers 158 may be formed under a relatively low plasma power, so that other elements will not be damaged during the oxidation treatment 156.

Since the sharp corners of the shortened gate spacers 126', the contact etch stop layer 144, and the mask structures 148 exposed by the gate trenches 154 are oxidized during the oxidation treatment 156, the resulting modified gate spacers 126", modified contact etch stop layer 144', and modified mask structures 148' may have smoother profiles. In addition, during the oxidation treatment 156, the plasma is applied from the top of the structure, so that the upper portions of the structure may be oxidized more than the lower portions. In some embodiments, each of the oxide layers 158 has the greatest thickness over the top surface of the modified mask structures 148'. In some embodiments, the thickness of each of the oxide layer 158 continuously decreases from its top portion to its bottom portion. In some embodiments, the thickness of each of the oxide layer 158 over the top surface of the modified mask structures 148' is no greater than the thickness of the dummy gate dielectric layer 120, so that they may be fully removed in subsequent process. In some embodiments, the thickness of each of the oxide layer 158 over the top surface of the modified mask structures 148' is in a range from about 1 nm to about 5 nm. If the oxide layers 158 are too thick, other portions of the semiconductor structure may also be oxidized or damaged during the oxidation treatment 156. On the other hand, if the oxide layers 158 are not thick enough, the profiles of the gate trenches may not be modified. The thickness of the oxide layers 158 may be controlled by adjusting the power and/or the time for performing the oxidation treatment 156.

Figure 2J:
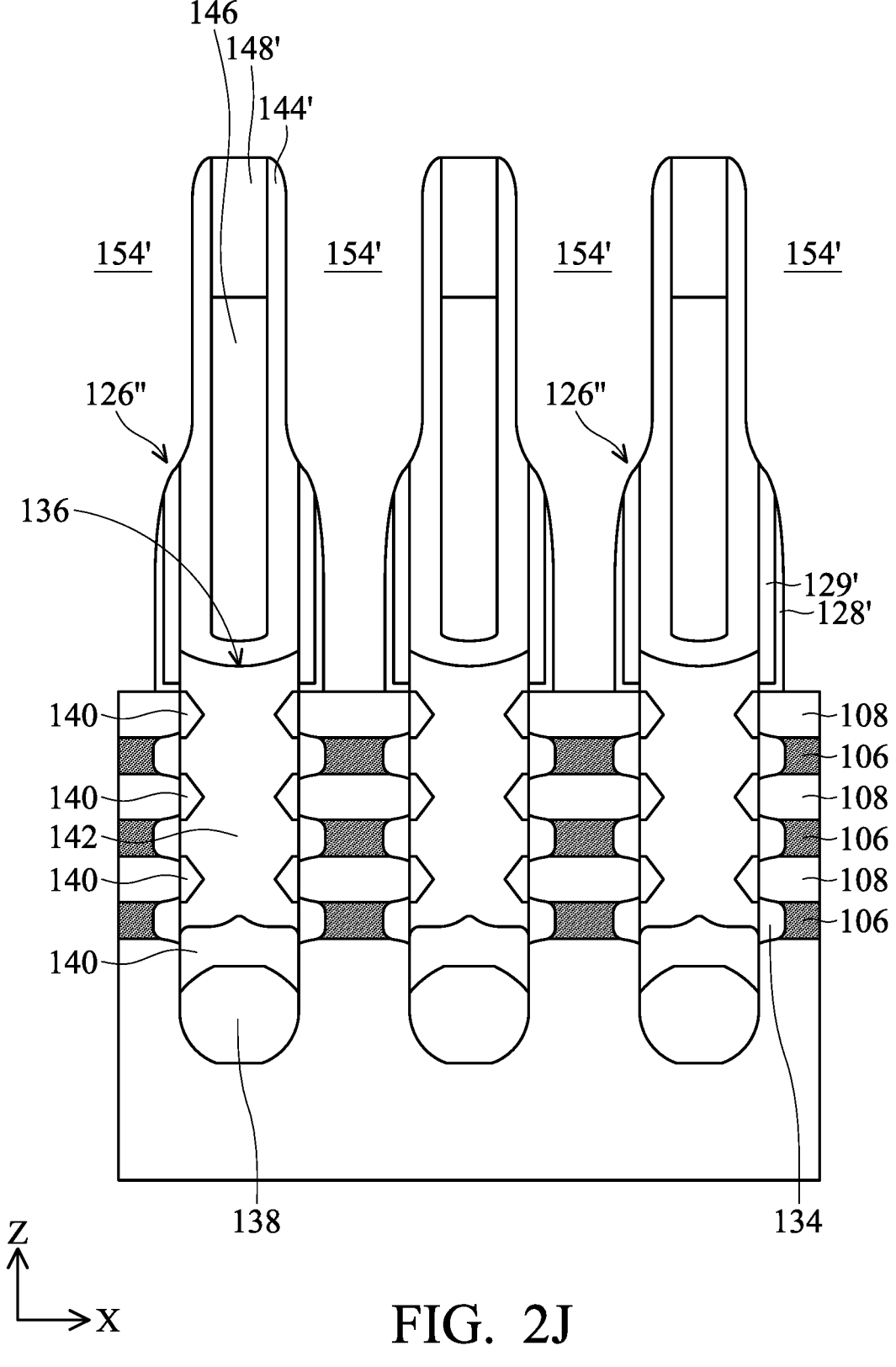

After the oxidation treatment 156 is performed, the oxide layers 158 and the dummy gate dielectric layers 120 are removed to expose the modified gate spacers 126", the modified contact etch stop layer 144', the modified mask structures 148', and the topmost layer of the second semiconductor material layers 108, as shown in FIG. 2J in accordance with some embodiments. In some embodiments, the oxide layers 158 and the dummy gate dielectric layers 120 are removed by performing an etching process. In some embodiments, the etching process includes dry chemical etching, remote plasma etching, wet etching, other applicable technique, and/or a combination thereof. In some embodiments, the etchant used in the etching process includes dilute HF. In some embodiments, the etchant used in the etching process includes HF and NH$_3$.

Since the oxide layers 158 are formed by oxidizing the shortened gate spacers 126', the contact etch stop layer 144, and the mask structures 148, the size of the modified gate spacers 126", the modified contact etch stop layer 144', and the modified mask structures 148' are smaller than those before performing the oxidation treatment 156 in accordance with some embodiments. Accordingly, after the oxide layers 158 are removed, the gate trenches 154 are enlarged to form the modified gate trenches 154' in accordance with some embodiments. In addition, the modified gate trenches 154' have smoother profiles (e.g. without sharp corners) than the original gate trenches 154 as shown in FIG. 2H. Therefore, the filling (e.g. deposition) of the gate structure formed in the modified gate trenches 154' can be better controlled.

In some embodiments, the modified mask structures 148' after the removal of the oxide layers 158 are thinner than the mask structures 148 before performing the oxidation treatment 156. In some embodiments, the modified contact etch stop layer 144' after the removal of the oxide layers 158 are shorter than the contact etch stop layer 144 before performing the oxidation treatment 156. In addition, each of the modified contact etch stop layers 144' has a narrower upper portion covering the sidewalls of the modified mask structures 148' and the upper portion of the interlayer dielectric layers 146 and has a wider bottom portion sandwiched between the interlayer dielectric layers 146 and the modified gate spacers 126".

In some embodiments, the modified gate spacers 126" after the removal of the oxide layers 158 are shorter than the shortened gate spacers 126' before performing the oxidation treatment 156. In addition, the modified gate spacers 126" have rounded corners in the modified gate trenches 154' and curved sidewalls. In some embodiments, each of the modified gate spacers 126" includes a modified first spacer layer 128' and a modified second spacer layer 129', and the modified first spacer layer 128' and the modified spacer layer 129' form the sloped sidewall of the modified gate spacer 126". In some embodiments, the topmost portion of the modified second spacer layer 129' is higher than the topmost portion of the modified first spacer layer 128'.

Figure 2K:
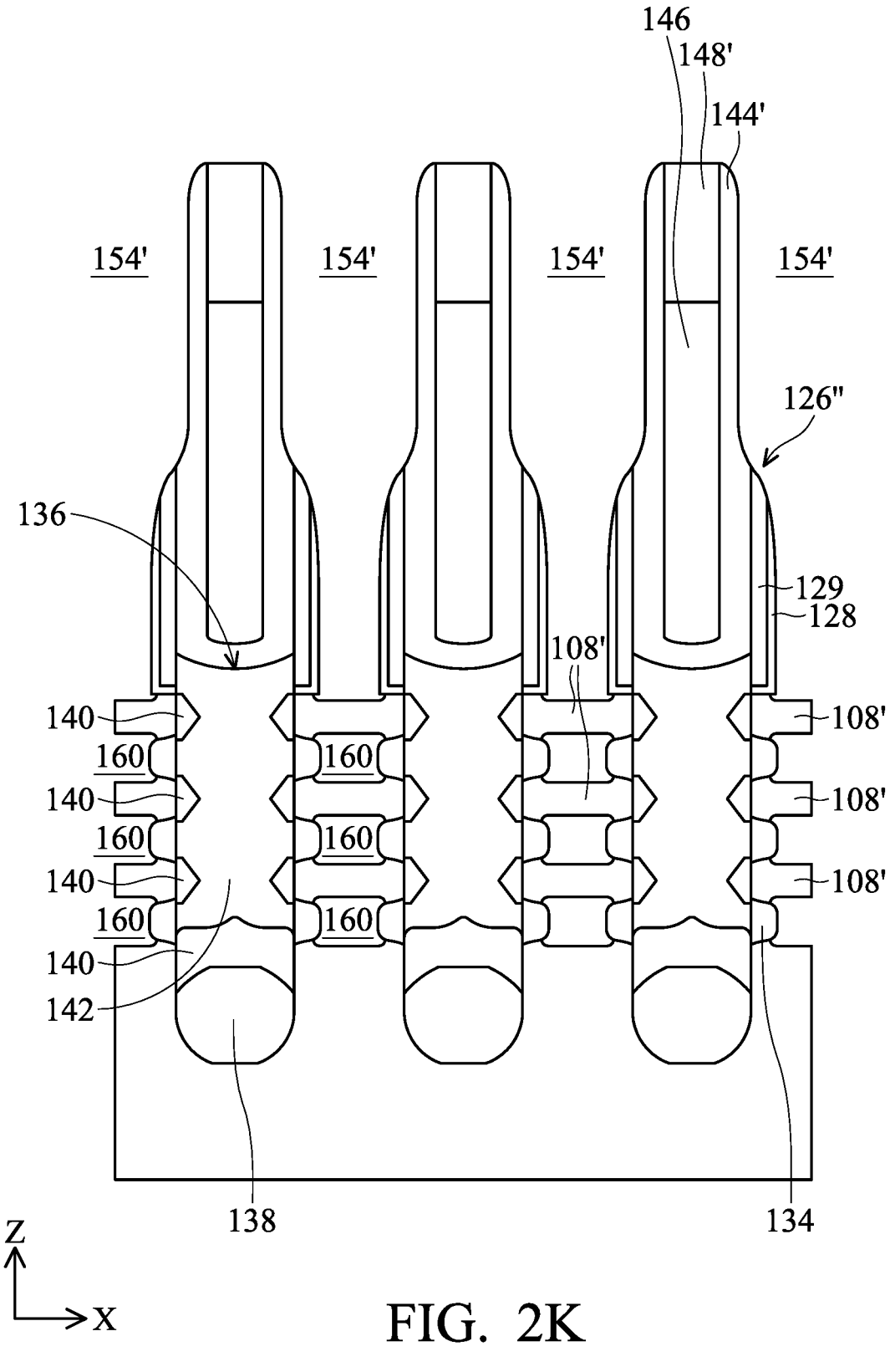

After the sharp corners of the contact etch stop layers 144 and the shortened gate spacers 126' are modified (i.e. rounded), the first semiconductor material layers 106 are removed to form channel layers 108', as shown in FIG. 2K in accordance with some embodiments. More specifically, the second semiconductor material layers 108 remaining in the channel region form the channel layers 108', and gaps 160 are formed between and around the channel layers 108' in accordance with some embodiments. The channel layers 108' are configured to function as channel regions in the resulting semiconductor structure 100 and may also be referred to as nanostructures, nanosheets, nanowires, or the like.

The first semiconductor material layers 106 may be removed by performing an etching process. The etching process may include a selective wet etching process, such as APM (e.g., ammonia hydroxide-hydrogen peroxide-water mixture) etching process. In some embodiments, the wet etching process uses etchants such as ammonium hydroxide (NH$_4$OH), TMAH, ethylenediamine pyrocatechol (EDP), and/or potassium hydroxide (KOH) solutions. In some embodiments, a trimming process is further performed to trim the exposed portions of the channel layers 108', so that the thicknesses of the channel layers 108' in the channel regions are narrower than those in the regions vertically overlapping the inner spacers 134.

Figure 2L:
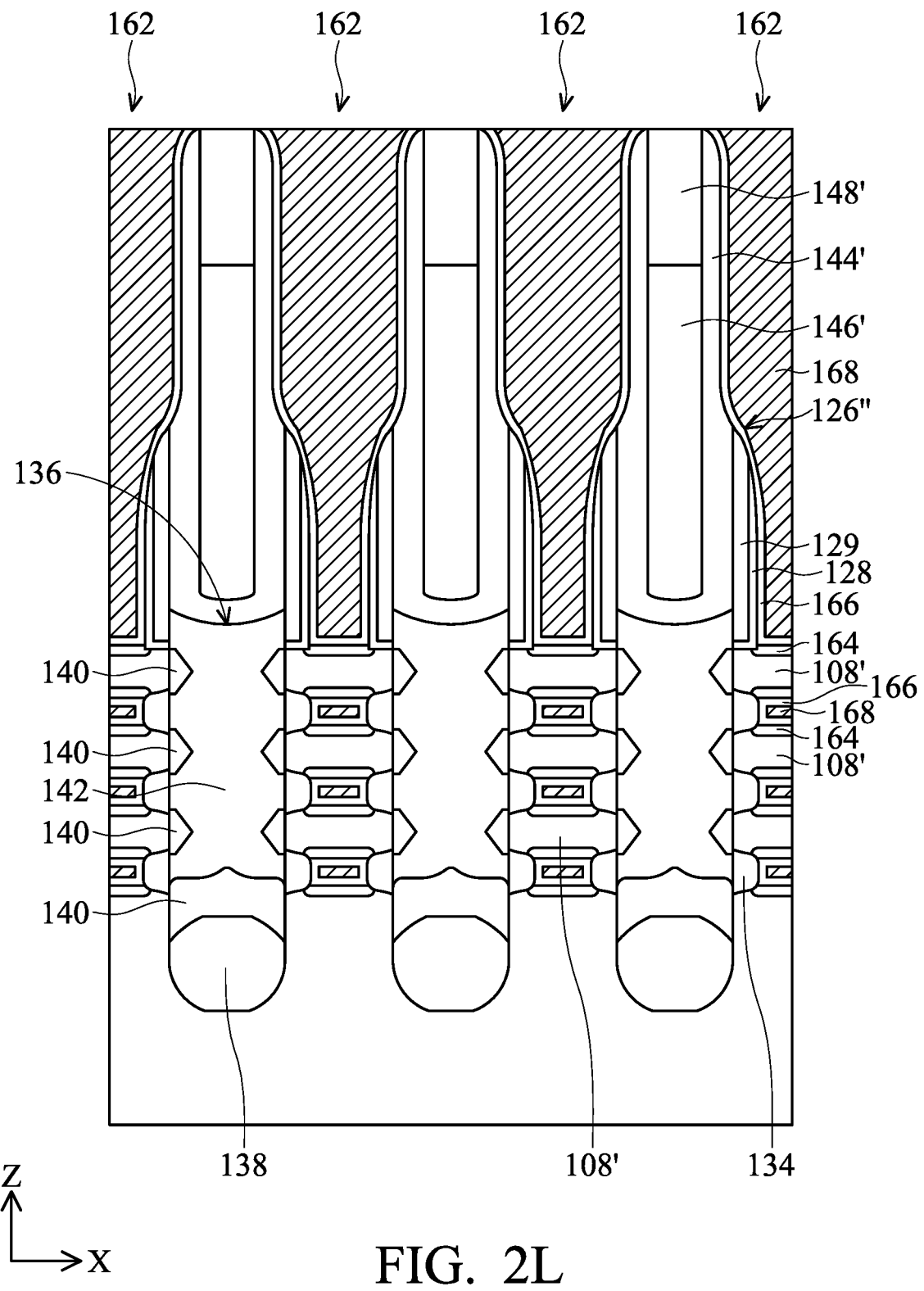

After the channel layers 108' are formed, gate stacks 162 are formed in the modified gate trenches 154' and the gaps 160 between and around the channel layers 108', as shown in FIG. 2L in accordance with some embodiments. The gate stacks 162 wrap around each of the channel layers 108' to form gate-all-around transistor structures in accordance with some embodiments. As described previously, the modified gate trenches 154' have smoother profile after performing the oxidation treatment 156 and the removal of the oxide layers 158. Therefore, the material layers of the gate stacks 162 may be formed in the modified gate trenches 154' with no (or less) voids and seams formed therein.

In some embodiments, the gate stacks 162 include interfacial layers 164, gate dielectric layers 166, and gate electrode layers 168. After the interfacial layers 154, the gate dielectric layers 156, and the gate electrode layers 158 are formed, a planarization process such as CMP or an etch-back process may be performed until the modified mask structures 148' are exposed, as shown in FIG. 2L in accordance with some embodiments.

In some embodiments, the interfacial layers 164 are oxide layers formed around (e.g. wrapping) the channel layers 108' and on the top surface of the base fin structure 104B. In some embodiments, the interfacial layers 164 are formed by performing a thermal process.

In some embodiments, the gate dielectric layers 166 are formed over the interfacial layers 164, so that the channel layers 108' are surrounded (e.g. wrapped) by the gate dielectric layers 166. In addition, the gate dielectric layers 166 also cover and in direct contact with the sloped sidewalls of the modified gate spacers 126", the sidewalls of the modified contact etch stop layer 144', and the inner spacers 134 in accordance with some embodiments. In some embodiments, the gate dielectric layers 166 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—Al2O$_3$) alloy, another suitable high-k dielectric material, or a combination thereof. In some embodiments, the gate dielectric layers 166 are formed using CVD, ALD, another applicable method, or a combination thereof.

The gate electrode layers 168 are formed on the gate dielectric layer 166 and filled in the modified gate trenches 154' and the gaps 160 between the channel layers 108', so that the channel layers 108' are wrapped by the gate stacks 162 in accordance with some embodiments. In some embodiments, the gate electrode layers 168 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 168 are formed using CVD, ALD, electroplating, another applicable method, or a combination thereof.

Other conductive layers, such as work function metal layers (not shown), may also be formed in the gate stacks 162, although they are not shown in the figures. For examples, the work function metal layers may be formed between the gate dielectric layers 166 and the gate electrode layers 168. In addition, the gaps 160 may be completely filled by the interfacial layers 164, the gate dielectric layers 166, and the work function metal layers, so that the gate electrode layers 168 are only formed in the modified gate trenches 154' in some other embodiments.

Figure 2M:
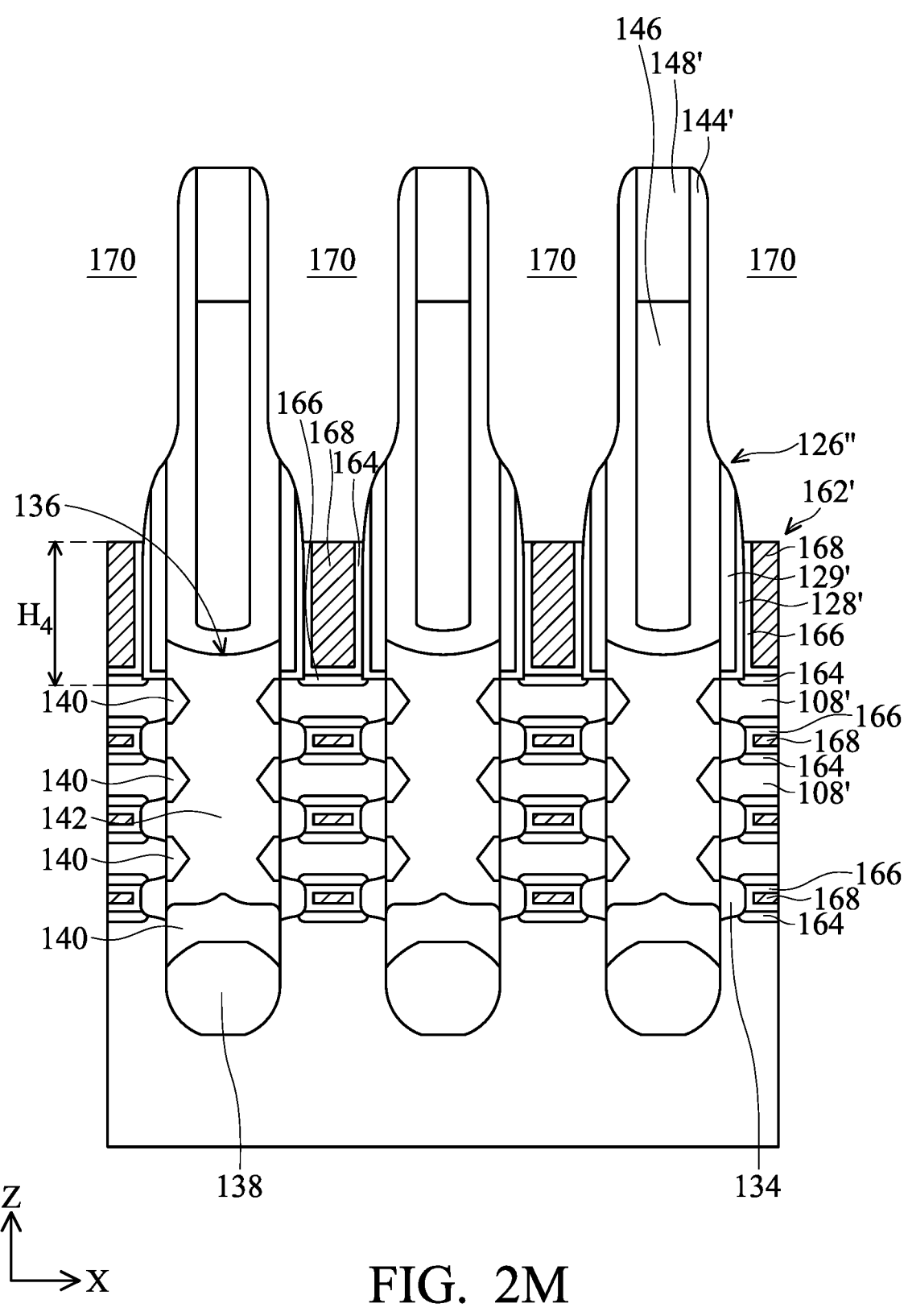

Next, the upper portions of the gate stacks 162 are removed to form recesses 170 over gate structures 162', as shown in FIG. 2M in accordance with some embodiments. In some embodiments, the upper portions of the gate stacks 162 are removed by performing an etching back process. In some embodiments, the etching process is a dry etching process. In some embodiments, the topmost surface of the gate structure 162' is lower than the topmost portion of the modified gate spacers 126". In some embodiments, the difference between the height $H_2$ of the shortened dummy gate structure 118' and the height $H_4$ of the gate structures 162' over the channel layers 108' is in a range from about 15 nm to about 40 nm. Since the height of the modified gate spacers 126" will be affected by the height $H_2$ of the shortened dummy gate structure 118', if the difference between the height $H_2$ and the height $H_4$ is not great enough, the modified gate spacers 126" may not be high enough to separate the gate structures 162' and the contacts formed afterwards. In some embodiments, the modified first spacer layers 128' and the modified second spacer layers 129' are both partially exposed by the recesses 170.

Figure 2N:
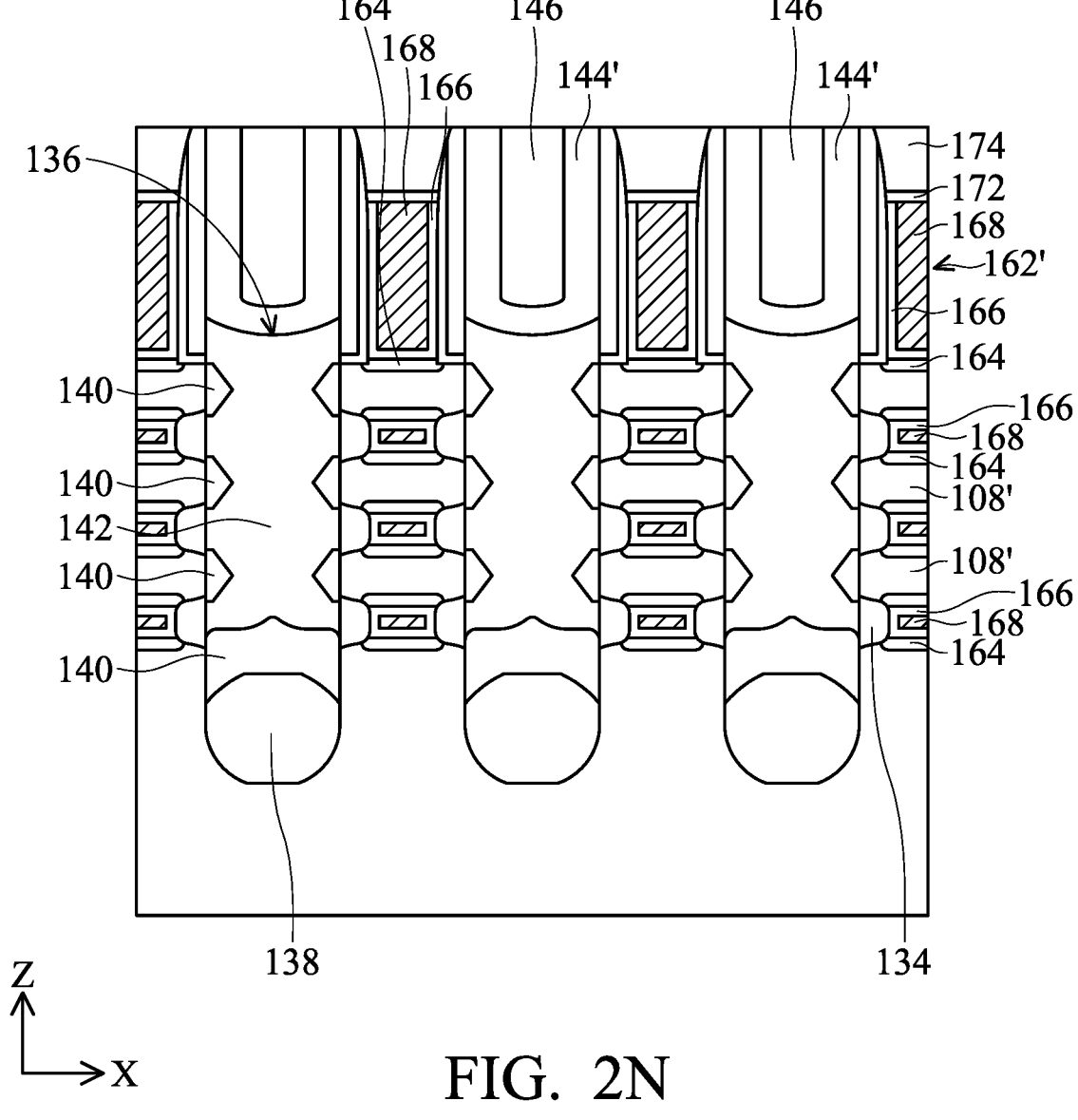
Figure 2O:
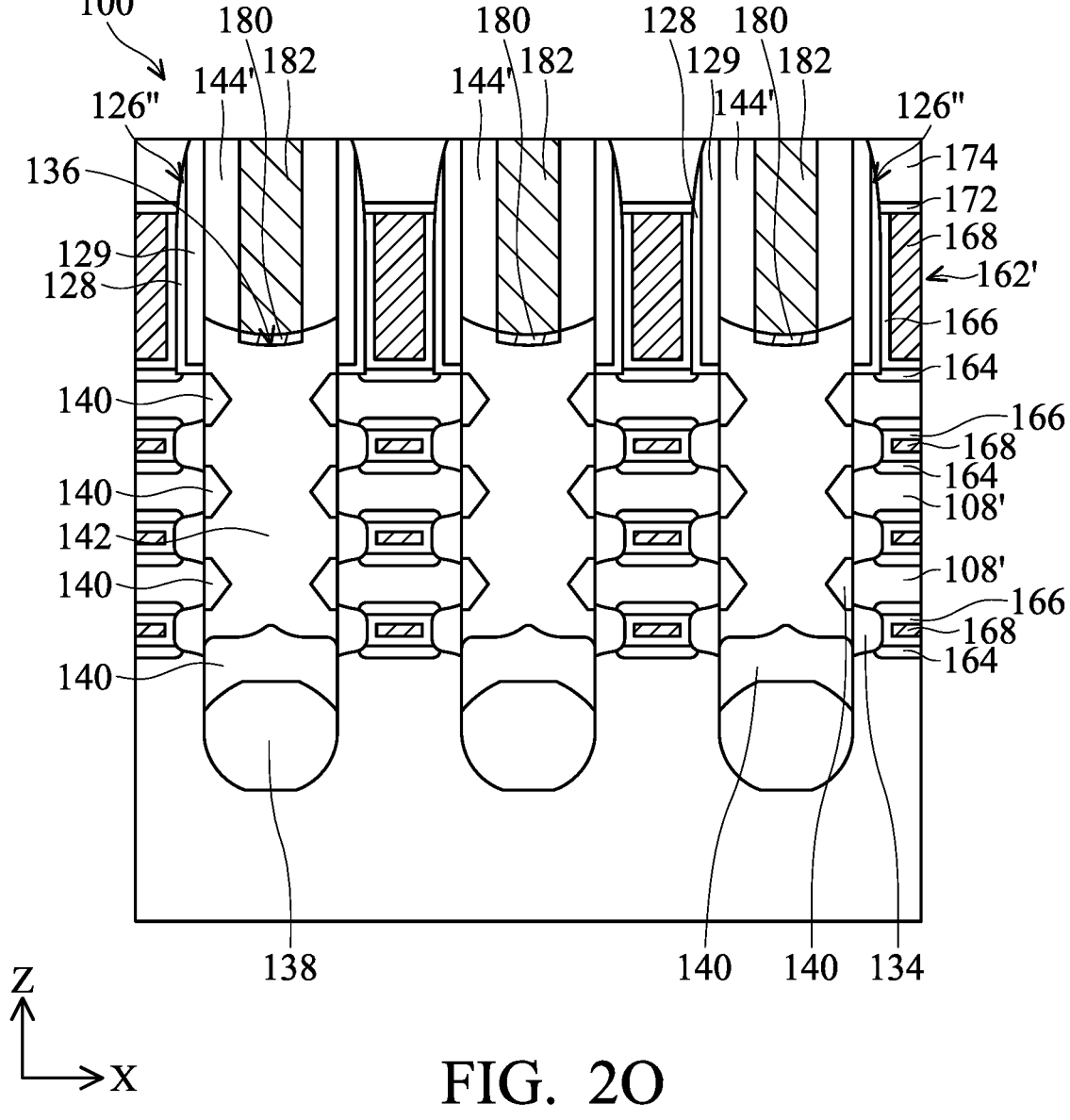
Figure 2O:
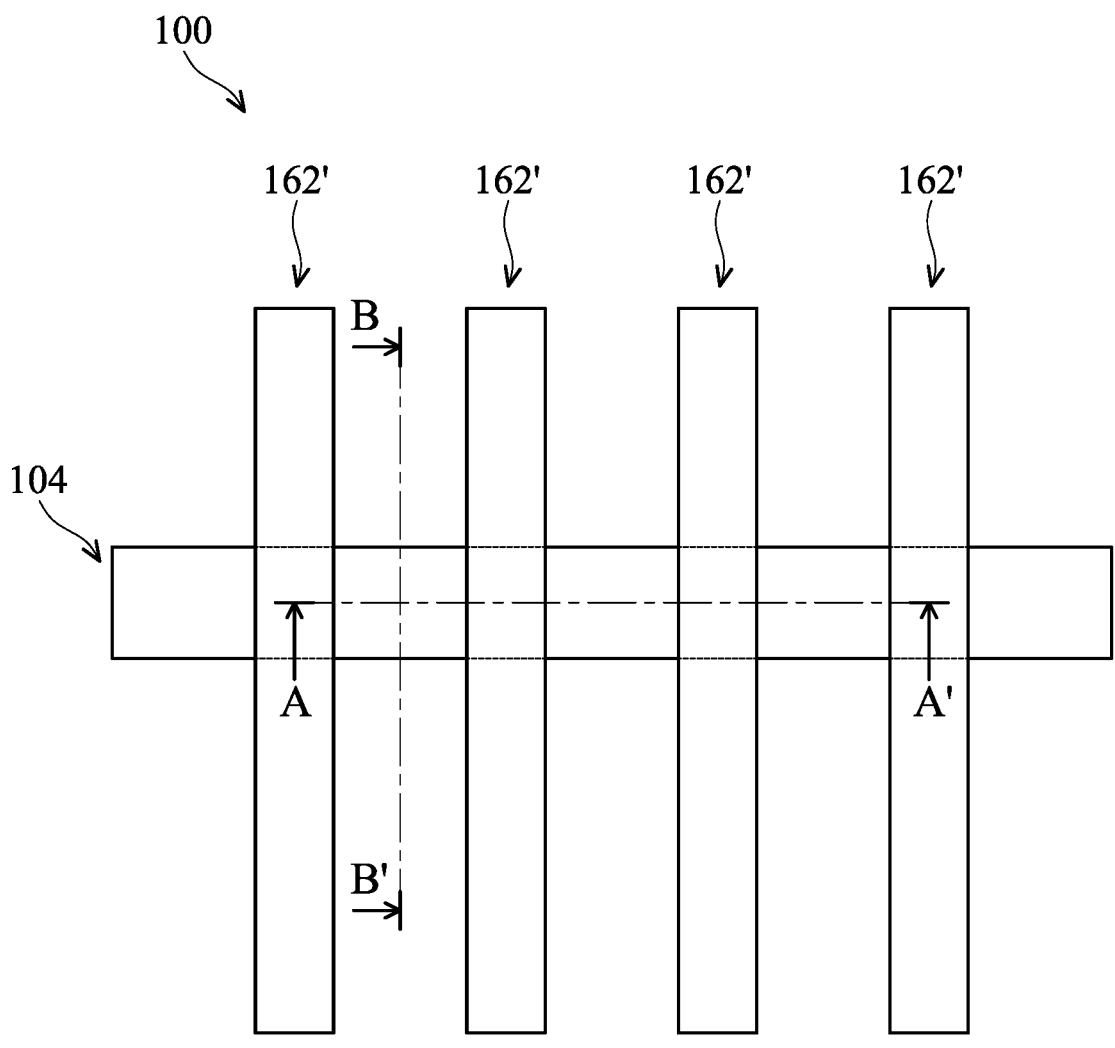

After the recesses 170 are formed, capping layers 172 are formed over the gate structures 162', as shown in FIG. 2N in accordance with some embodiments. In some embodiments, the capping layers 172 are made of metal such as W, Re, Ir, Co, Ni, Ru, Mo, Al, Ti, Ag, Al, other applicable metals, or multilayers thereof. In some embodiments, the capping layers 172 is made of W. In some embodiments, the capping layers 172 and the gate electrode layers 168 are made of different materials. In some embodiments, the capping layers 172 covers both the gate dielectric layers 166 and the gate electrode layers 168 and are in contact with the sidewalls of the modified gate spacers 126". In some embodiments, the top surfaces of the capping layers 172 are lower than the top portions of the modified gate spacers 126".

After the capping layers 172 are formed, the mask structures 174 are formed in the recesses 170 over the capping layers 172, as shown in FIG. 2N in accordance with some embodiments. The mask structures 174 are configured to protect the gate structures 162' during the subsequent etching process for forming contact structures. In some embodiments, the mask structures 174 have narrower bottom portions and wider top portions. In some embodiments, mask structures 174 are made of dielectric material such as silicon oxide ($SiO_2$), silicon nitride (SiN), silicon oxynitride (SiON), silicon carbon nitride (SiCN), silicon oxycarbonitride (SiOCN), oxygen-doped silicon carbonitride (Si(O)CN), or a combination thereof. In some embodiments, the mask structures 174 are made of silicon nitride. In some embodiments, the mask structures 174 are formed by depositing a dielectric material using such as CVD (such as FCVD, LPCVD, PECVD, HDP-CVD or HARP), ALD, or the like. After the dielectric material is formed, a planarization process is performed, as shown FIG. 2N in accordance with some embodiments. More specifically, the modified mask structures 148' are completely removed during the planarization process, and the interlayer dielectric layers 146, the modified contact etch stop layers 144', and the modified gate spacers 126" are also partially removed during the planarization process. The planarization process may be a CMP, an etching back process, or a combination thereof.

Figure 1:
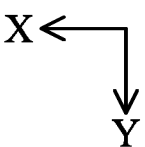
Figures 2, 2O:
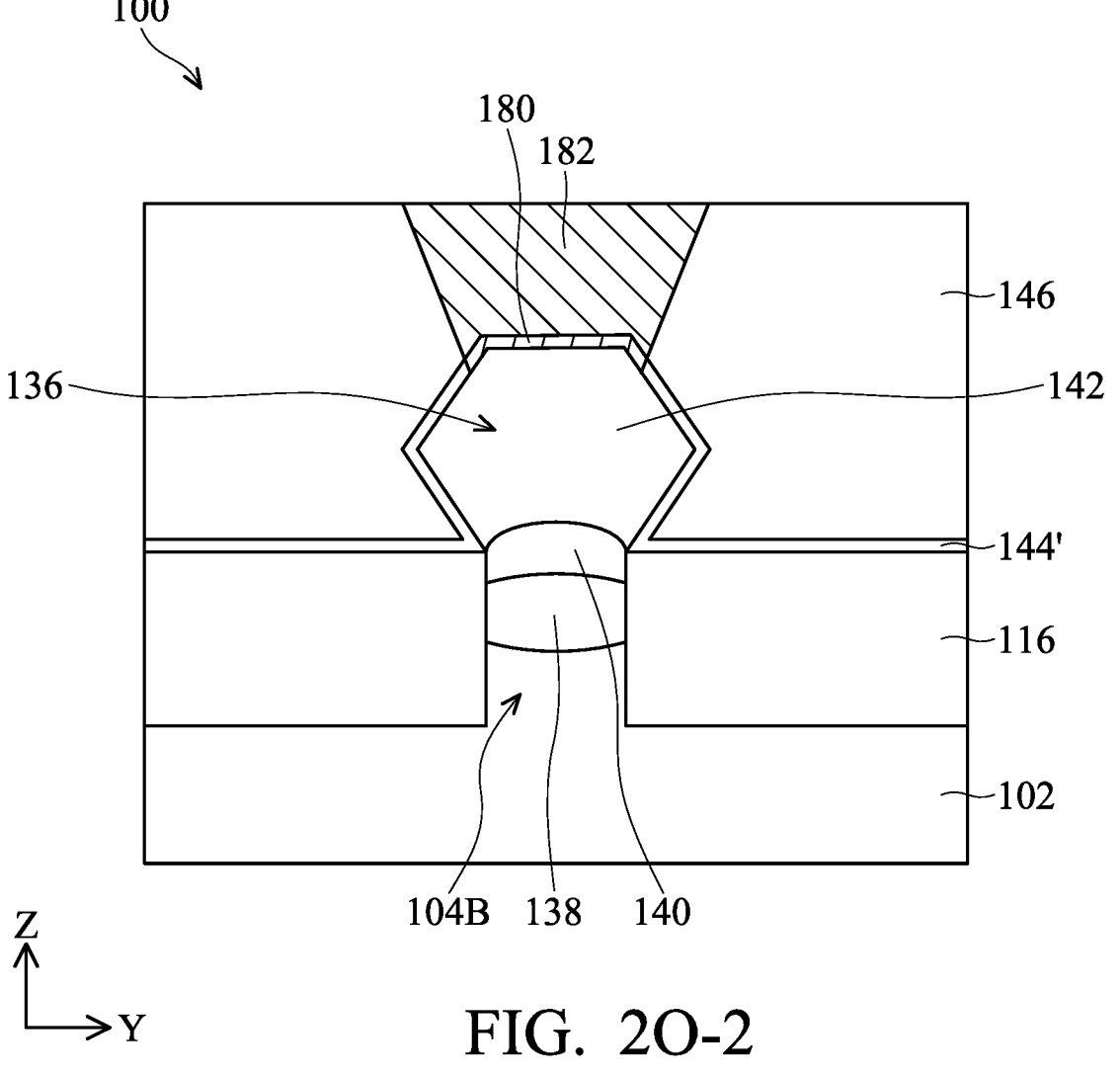

Afterwards, silicide layers 180 and contacts 182 are formed over the source/drain structures 136, as shown in FIGS. 2O, 2O-1, and 2O-2 in accordance with some embodiments. More specifically, FIG. 2O-1 illustrates the diagrammatic top view of the semiconductor structure 100, which has been simplified for the sake of clarity to better understanding the concept of the disclosure, and FIG. 2O-2 illustrates a cross-sectional view of the semiconductor structure 100 shown along line B-B' of FIG. 2O-1 (the line B-B' are also shown in FIG. 2E) in accordance with some embodiments.

After the mask structures 174 are formed and the planarization process is performed, contact openings may be formed through the modified contact etch stop layer 144' and the interlayer dielectric layer 146 to partially expose the top surfaces of the source/drain structures 136, and the silicide layers 180 and the contacts 182 may be formed in the contact openings. The contact openings may be formed using a photolithography process and an etching process. In addition, some portions of the source/drain structures 136 exposed by the contact openings may also be etched during the etching process.

After the contact openings are formed, the silicide layers 180 may be formed by forming a metal layer over the top surface of the source/drain structures 136 and annealing the metal layer so the metal layer reacts with the source/drain structures 136 to form the silicide layers 180. The unreacted metal layer may be removed after the silicide layers 180 are formed. Afterwards, the contacts 182 are formed over the silicide layers 180 in the contact openings, as shown in FIGS. 2O and 2O-2 in accordance with some embodiments.

In some embodiments, the contacts 182 are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The contacts 182 may further include a liner and/or a barrier layer. For example, a liner (not shown) may be formed on the sidewalls and bottom of the contact trench. The liner may be made of silicon nitride, although any other applicable dielectric may be used as an alternative. The liner may be formed using a plasma enhanced chemical vapor deposition (PECVD) process, although other applicable processes, such as physical vapor deposition or a thermal process, may be used as an alternative. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

As described above, before forming the gate structures 162', the gate spacers 126 are shortened to enlarge the top portions of the gate trenches 154 in accordance with some embodiments. Afterwards, the corners of the shortened gate spacers 126' and the contact etch stop layers 144 are modified to have smooth profile with rounded corners, and therefore the gate structures 162' formed in the modified gate trenches 154' will have less or no voids and/or seams therein. Accordingly, the gate resistance of the resulting semiconductor structure 100 may be reduced, and the performance and the yield of the manufacturing processes may be improved.

In addition, although the gate spacers 126 are shorted and modified to form the modified gate spacers 126" having thinner upper portions and thicker bottom portions, the portions of the modified gate spacers 126" sandwiched the gate structures 162' and contacts 182 have substantially the same, or similar, thickness. Accordingly, the modified gate spacers 126" can still separate the gate structures 162' and contacts 182 to prevent short circuit or current break though. Furthermore, the capacitance will not be undermined since the portions of the modified gate spacers 126" sandwiched the gate structures 162' and contacts 182 are not too thin.

Figure 3A:
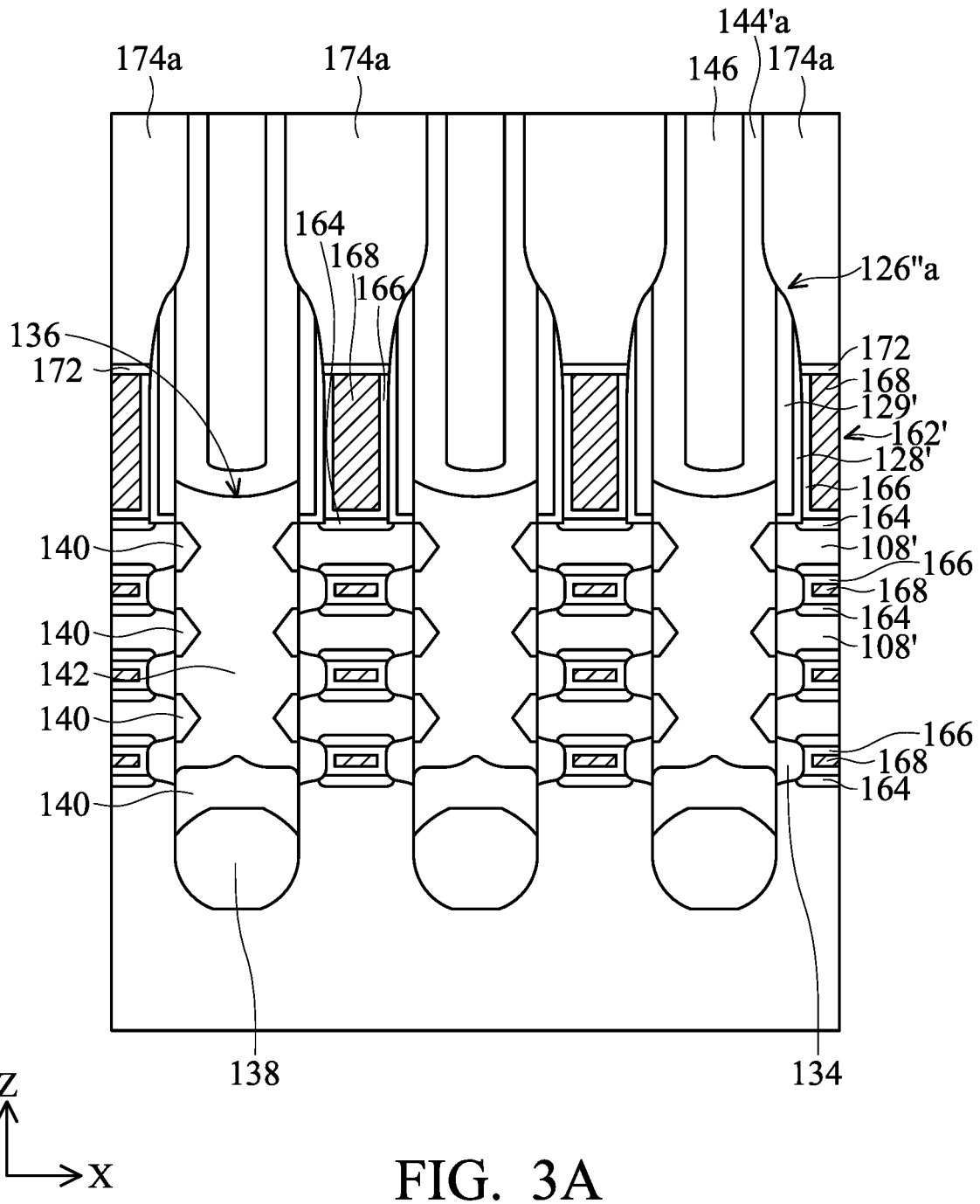
FIGS. 3A and 3B illustrate intermediate stages of manufacturing a semiconductor structure in accordance with some embodiments.
Figure 3B:
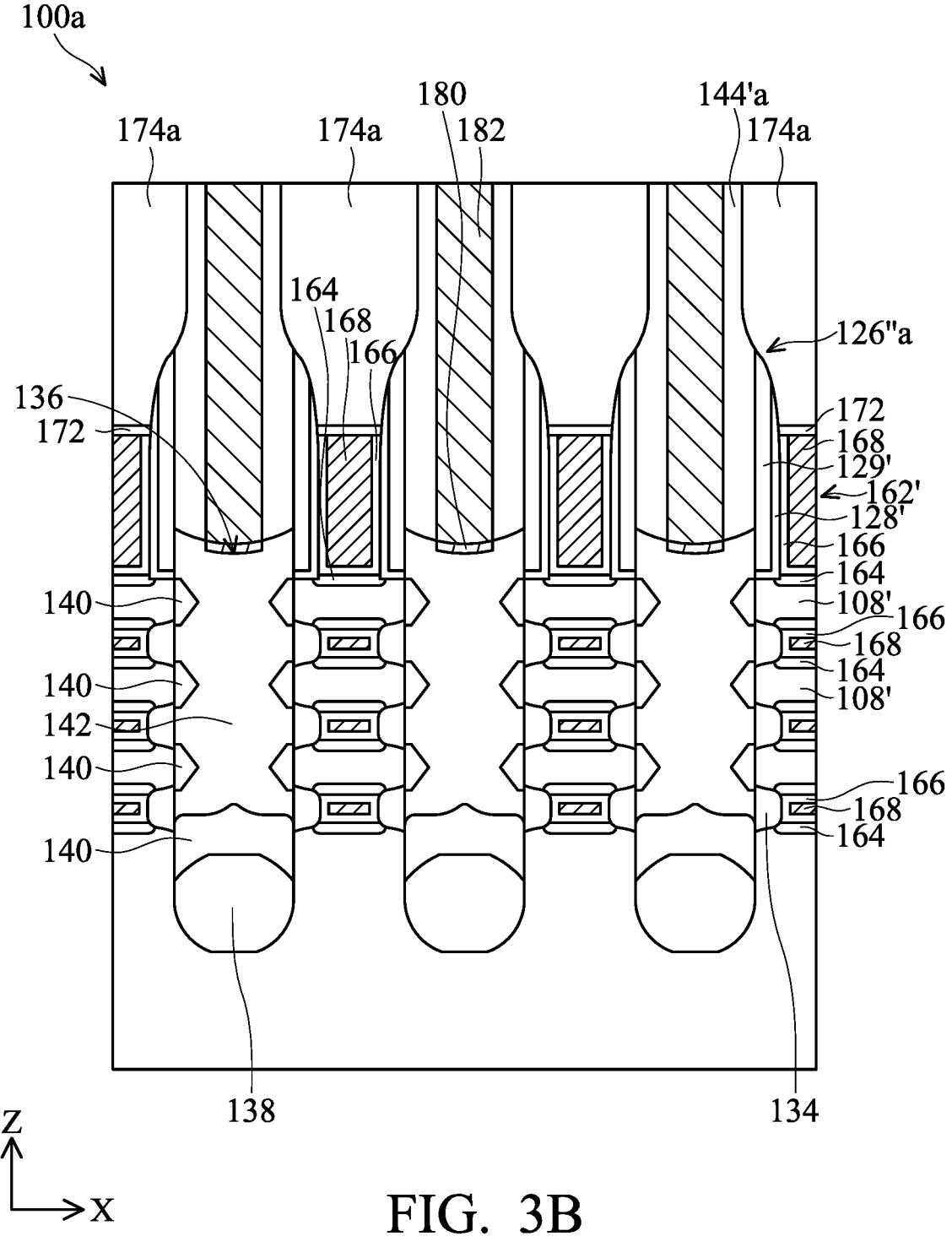

FIGS. 3A and 3B illustrate intermediate stages of manufacturing a semiconductor structure 100a in accordance with some embodiments. The semiconductor structure 100a may be similar to the semiconductor structure 100 described previously, except its mask structures 174a are thicker than those shown in the semiconductor structure 100 in accordance with some embodiments.

More specifically, the processes shown in FIGS. 2A to 2M described previously are performed, and then the capping layers 172 and the mask structures 174a are formed over the gate structures 162' and between modified gate spacers 126"a and contact etch stop layers 144'a, as shown in FIG. 3A in accordance with some embodiments. Similar to those in FIG. 2N, the modified mask structures (i.e. the modified mask structures 148' shown in FIG. 2M) over the interlayer dielectric layers 146 are completely removed in accordance with some embodiments. However, the interlayer dielectric layers 146 and modified contact etch stop layers 144'a are only slightly removed, and modified gate spacers 126"a are not removed during the planarization process for forming the mask structures 174a in accordance with some embodiments. That is, the top surfaces of the interlayer dielectric layers 146 are higher than the top portions of the modified gate spacers 126"a in accordance with some embodiments.

Afterwards, the processes shown in FIG. 2O described previously are performed to form the semiconductor structure 100a, as shown in FIG. 3B in accordance with some embodiments. In some embodiments, the top portions of the modified contact etch stop layers 144'a sandwiched between the mask structures 174a and the contacts 182 are narrower than the bottom portions of the modified contact etch stop layers 144'a sandwiched between the modified gate spacers 126"a and the contacts 182.

Processes and materials for forming the semiconductor structure 100a may be similar to, or the same as, those for forming the semiconductor structure 100 described previously and are not repeated herein. In addition, the processes and materials for forming the modified gate spacers 126"a, the modified contact etch stop layers 144'a, and the mask structures 174a are similar to, or the same as, those for forming the modified gate spacers 126", the modified contact etch stop layers 144', and the mask structures 174 described previously and are not repeated herein.

Figure 4A:
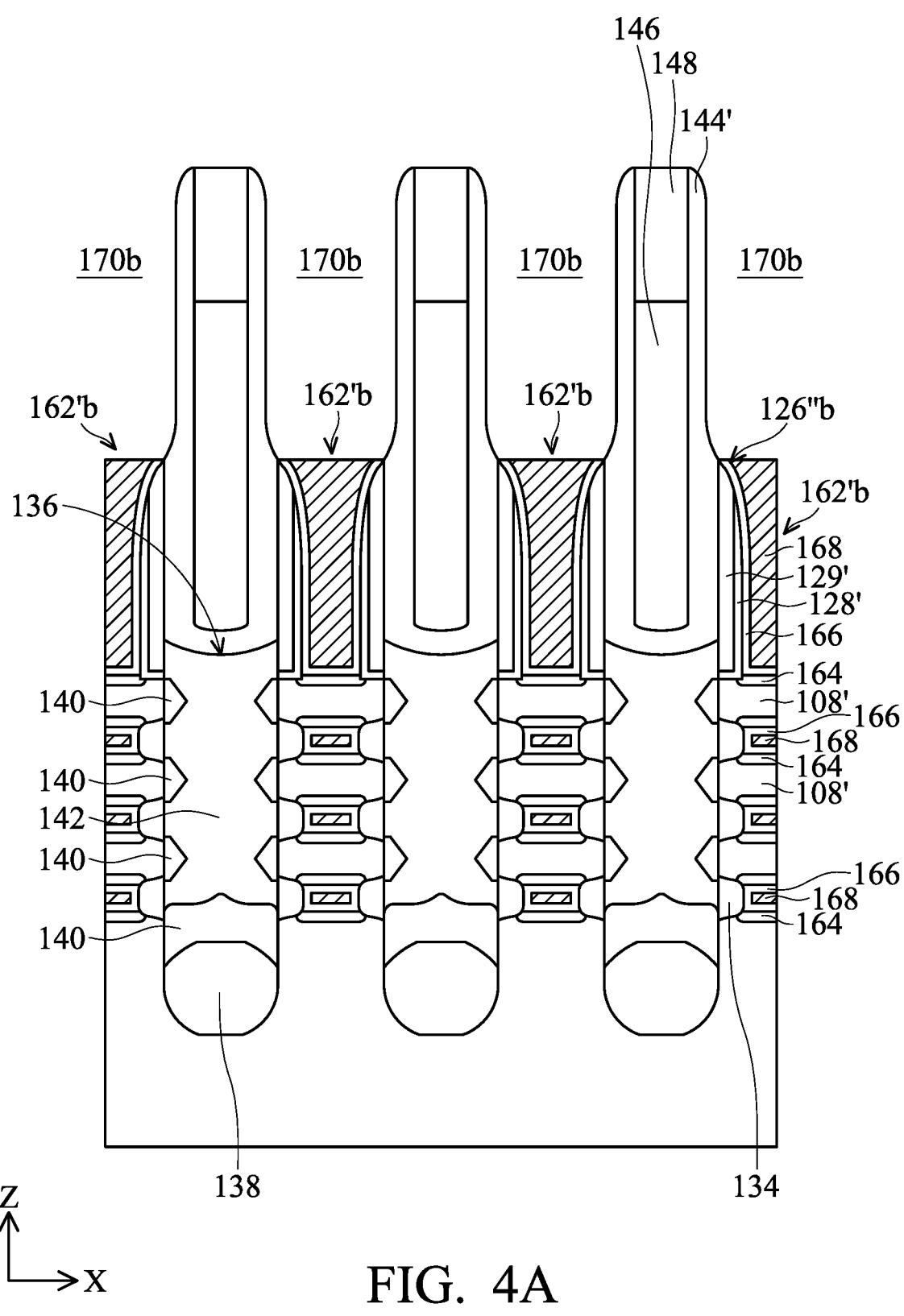
FIGS. 4A and 4B illustrate intermediate stages of manufacturing a semiconductor structure in accordance with some embodiments.
Figure 4B:
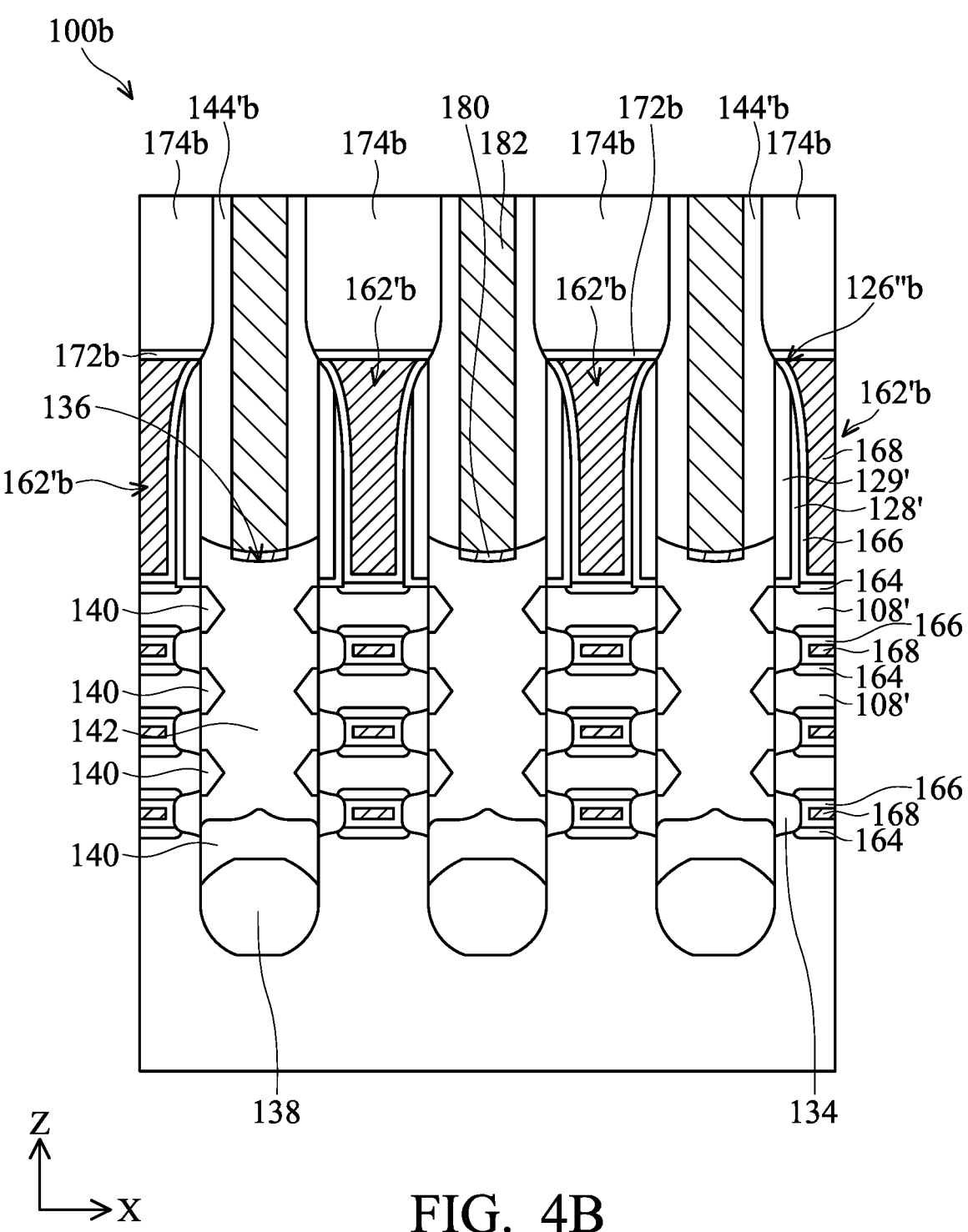

FIGS. 4A and 4B illustrate intermediate stages of manufacturing a semiconductor structure 100b in accordance with some embodiments. The semiconductor structure 100b may be similar to the semiconductor structure 100 described previously, except its gate structures 162'b are thicker than those shown in the semiconductor structure 100 in accordance with some embodiments.

More specifically, the processes shown in FIGS. 2A to 2L described previously are performed to form the gate stacks (e.g. the gate stacks 162 shown in FIG. 2L) around the channel layers 108' and between the modified gate spacers 126"b, and then the upper portions of the gate stacks are removed to form recesses 170b over the gate structures 162'b, as shown in FIG. 4A in accordance with some embodiments. Similar to those in FIG. 2M, the upper portions of the gate stacks are removed by performing an etching back process in accordance with some embodiments. However, the top surface of the gate structures 162'b are substantially level with the topmost portion of the modified gate spacers 126"b in accordance with some embodiments. That is, the sloped sidewalls of the modified gate spacers 126"b are completely covered by the gate structures 162'b in accordance with some embodiments. In some other embodiments, the gate structures 162'b are slightly higher than the modified gate spacers 126"b.

Afterwards, the processes shown in FIGS. 2N and 2O described previously are performed to form the semiconductor structure 100b, as shown in FIG. 4B in accordance with some embodiments. In some embodiments, the gate structures 162'b has a wider top surface and a narrower bottom surface. In some embodiments, the capping layers 172b are in contact with modified contact etch stop layer 144'b. In some embodiments, the mask structures 174b are in contact with the modified contact etch stop layer 144'b but are separated from the modified gate spacers 126"*b*. In addition, the top portions of the modified contact etch stop layers 144'*b* sandwiched between the mask structures 174*b* and the contacts 182 are narrower than the bottom portions of the modified contact etch stop layers 144'*b* sandwiched between the modified gate spacers 126"*b* and the contacts 182 in accordance with some embodiments.

Processes and materials for forming the semiconductor structure 100*b* may be similar to, or the same as, those for forming the semiconductor structure 100 described previously and are not repeated herein. In addition, the processes and materials for forming the modified gate spacers 126"*b*, the modified contact etch stop layers 144'*b*, the mask structures 174*b*, the recesses 170*b*, the capping layer 172*b*, and the gate structures 162'*b* are similar to, or the same as, those for forming the modified gate spacers 126", the modified contact etch stop layers 144', the mask structures 174, the recesses 170, the capping layer 172, and the gate structures 162' described previously and are not repeated herein.

Figure 5A:
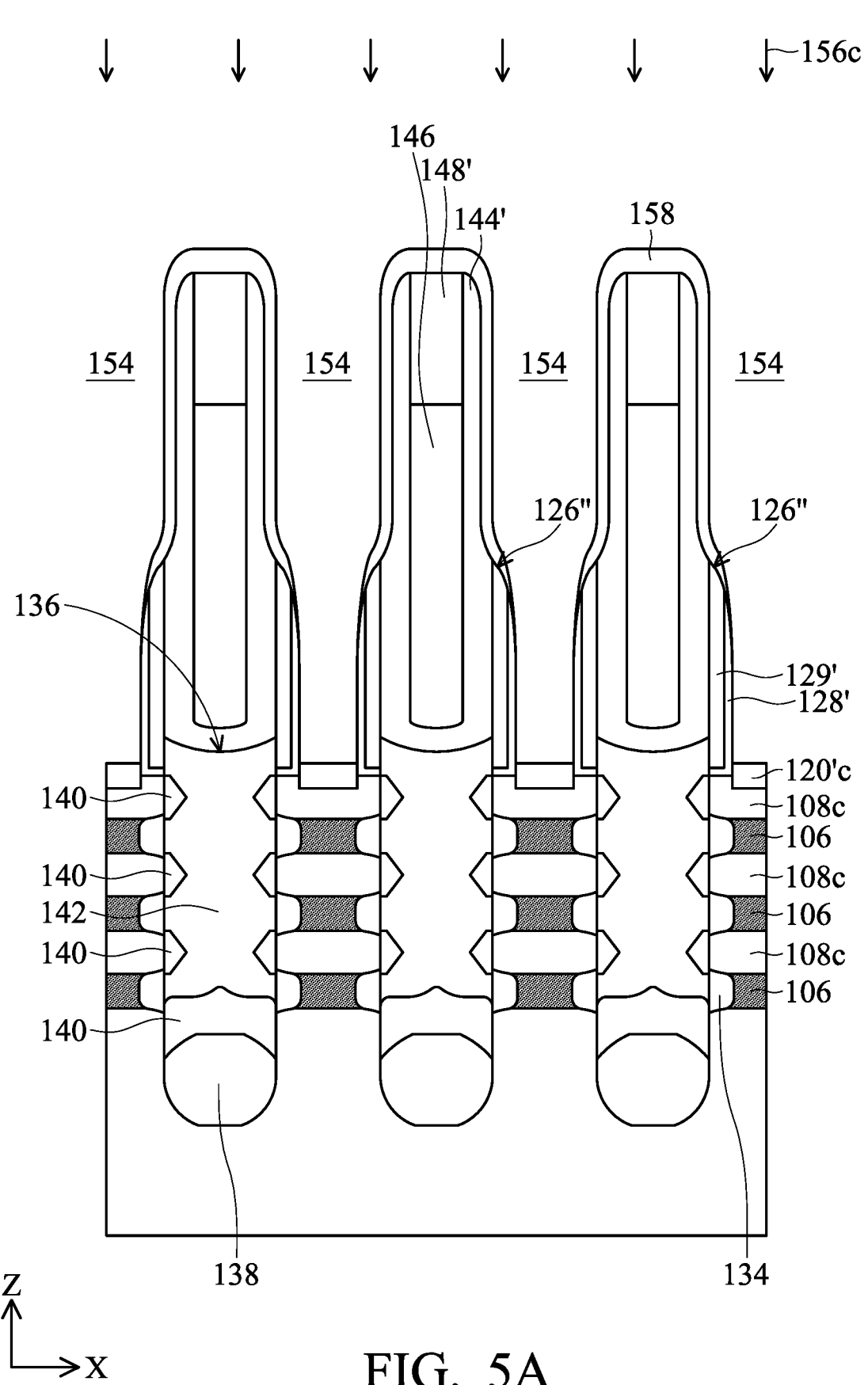
FIGS. 5A to 5C illustrate intermediate stages of manufacturing a semiconductor structure in accordance with some embodiments.
Figure 5B:
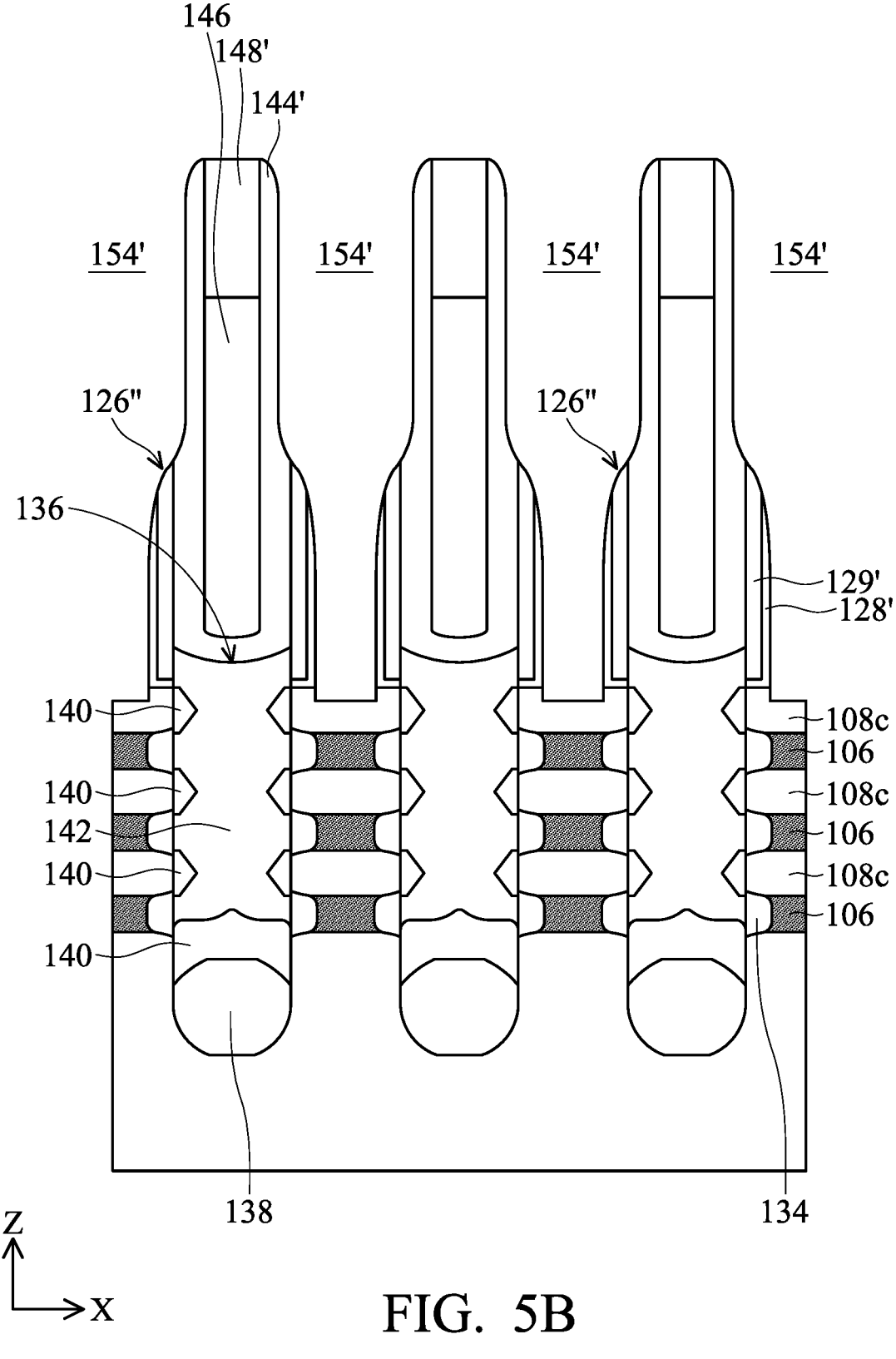
Figure 5C:
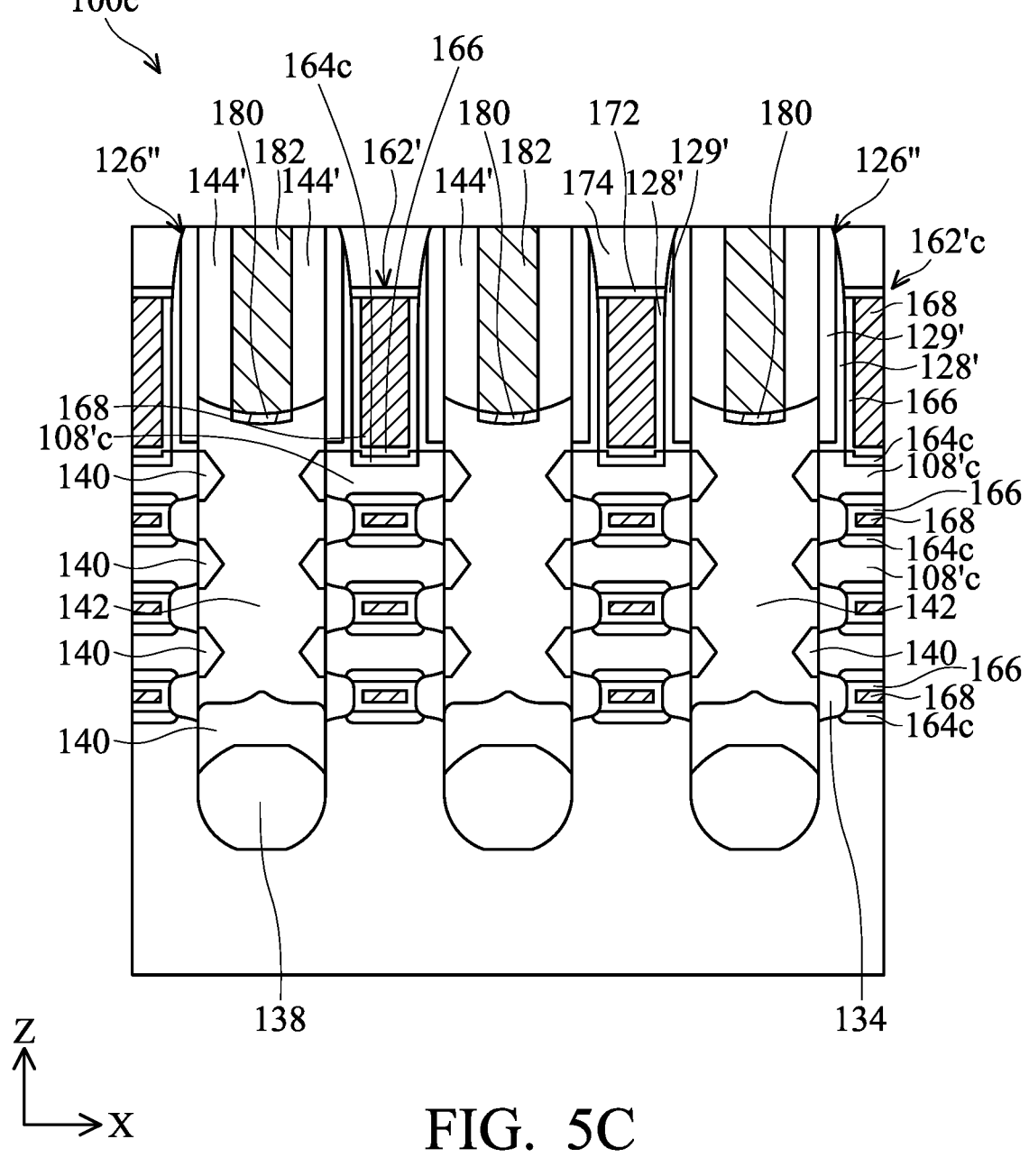

FIGS. 5A to 5C illustrate intermediate stages of manufacturing a semiconductor structure 100*c* in accordance with some embodiments. The semiconductor structure 100*c* may be similar to the semiconductor structure 100 described previously, except its dummy gate dielectric layers are thickened during the oxidation treatment in accordance with some embodiments.

More specifically, the processes shown in FIGS. 2A to 2H described previously are performed, and then an oxidation treatment 156*c* is performed to form the oxide layers 158 and to form thickened dummy gate dielectric layers 120'*c*, as shown in FIG. 5A in accordance with some embodiments. Similar to the oxidation treatment 156 shown in FIG. 2I, the exposed portions of the shortened gate spacers 126', the contact etch stop layers 144, and the mask structures 148 are partially oxidized, and the oxide layers 158 are formed over the modified gate spacers 126", the modified contact etch stop layer 144', and the modified mask structures 148' in accordance with some embodiments. In addition, the top portions of the topmost layer of second semiconductor material layers 108*c* in direct contact with the dummy gate dielectric layers (e.g. the dummy gate dielectric layers 120 shown in FIG. 2H) are also oxidized during the oxidization treatment 156*c*, so that the dummy gate dielectric layers are thickened to form the thickened dummy gate dielectric layers 120'*c* in accordance with some embodiments. After the oxidation treatment 156*c* is performed, the bottommost portion of the thickened dummy gate dielectric layers 120'*c* are lower than the topmost surface of the topmost layer of second semiconductor material layers 108*c* (i.e. the top surface directly below the modified gate spacers 126") in accordance with some embodiments. The oxidation treatment 156*c* may be similar to the oxidation treatment 156 described previously, except the oxidation treatment 156*c* is performed for a longer time, compared to the oxidation treatment 156.

After the oxidation treatment 156*c* is performed, the oxide layers 158 and the thickened dummy gate dielectric layers 120'*c* are removed to expose the modified gate spacers 126", the modified contact etch stop layer 144', the modified mask structures 148', and the topmost layer of the second semiconductor material layers 108*c*, as shown in FIG. 5B in accordance with some embodiments. Since the topmost layer of the second semiconductor material layers 108*c* are partially oxidized during the oxidation treatment 156*c*, the topmost layer of the second semiconductor material layers 108*c* at the channel regions are narrower than other second semiconductor material layers 108*c* (e.g. the bottommost layer of the second semiconductor material layers 108*c*) at the channel regions in accordance with some embodiments.

Afterwards, the processes shown in FIGS. 2K to 2O described previously are performed to form the semiconductor structure 100*c*, as shown in FIG. 5C in accordance with some embodiments. Since the topmost layer of the second semiconductor layers 108*c* are partially oxidized during the oxidization treatment 156*c*, the topmost layer of channel layers 108'*c* formed of the second semiconductor material layers 108*c* also has thinner portions at the channel region and thicker portions under the modified gate spacers 126". In some embodiments, the topmost layer of the channel layers 108'*c* has recessed portions at the channel regions, and the topmost interfacial layers 164*c* of the gate structures 162"*c* are formed in and around the recessed portions.

Processes and materials for forming the semiconductor structure 100*c* may be similar to, or the same as, those for forming the semiconductor structure 100 described previously and are not repeated herein. In addition, the processes and materials for forming the second semiconductor material layers 108*c*/the channel layers 108'*c* and the interfacial layers 164*c* of the gate structures 162"*c* are similar to, or the same as, those for forming the second semiconductor material layers 108/the channel layers 108' and the interfacial layers 164 of the gate structures 162" described previously and are not repeated herein.

Figure 6A:
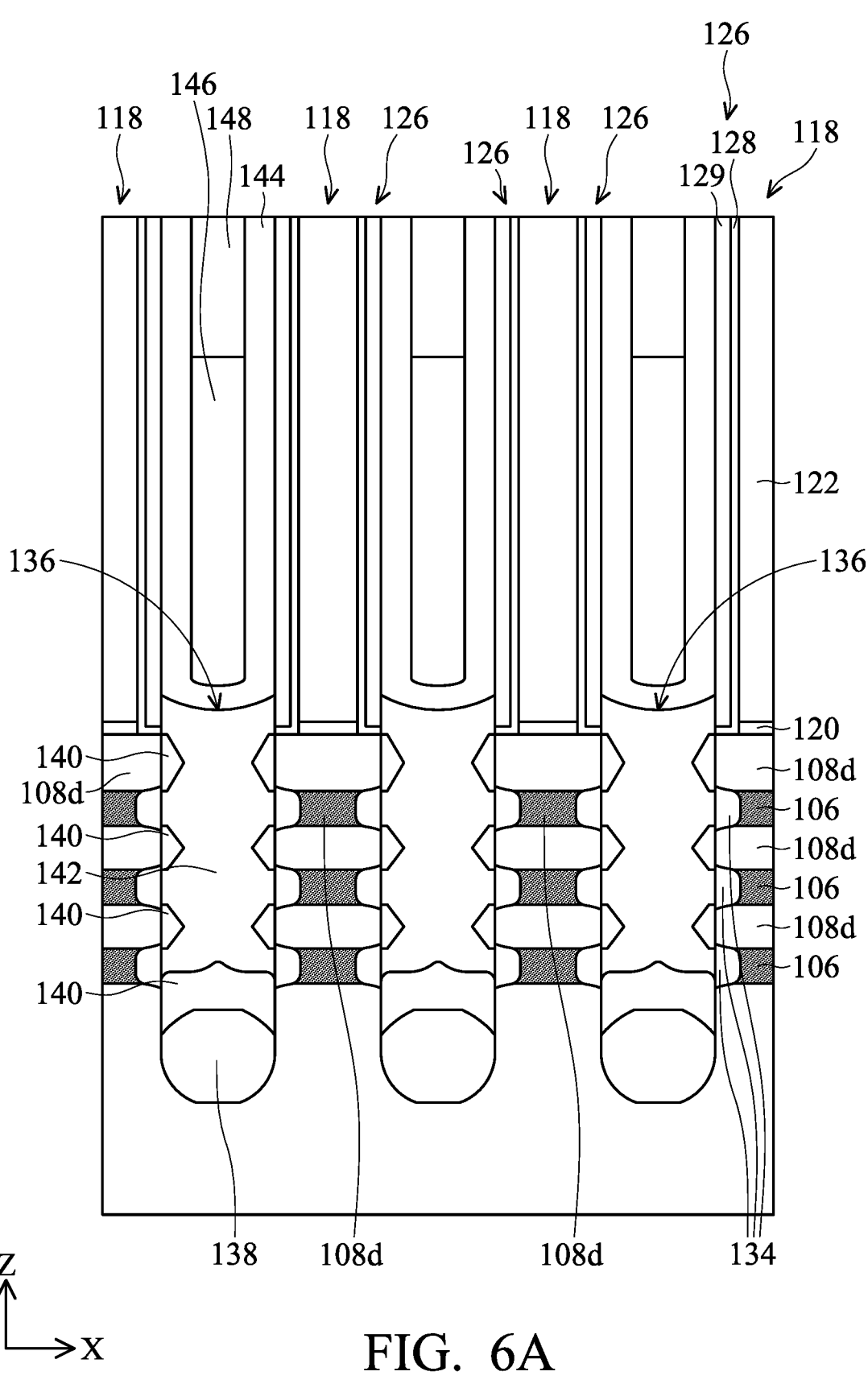
FIGS. 6A to 6C illustrate intermediate stages of manufacturing a semiconductor structure in accordance with some embodiments.
Figure 6B:
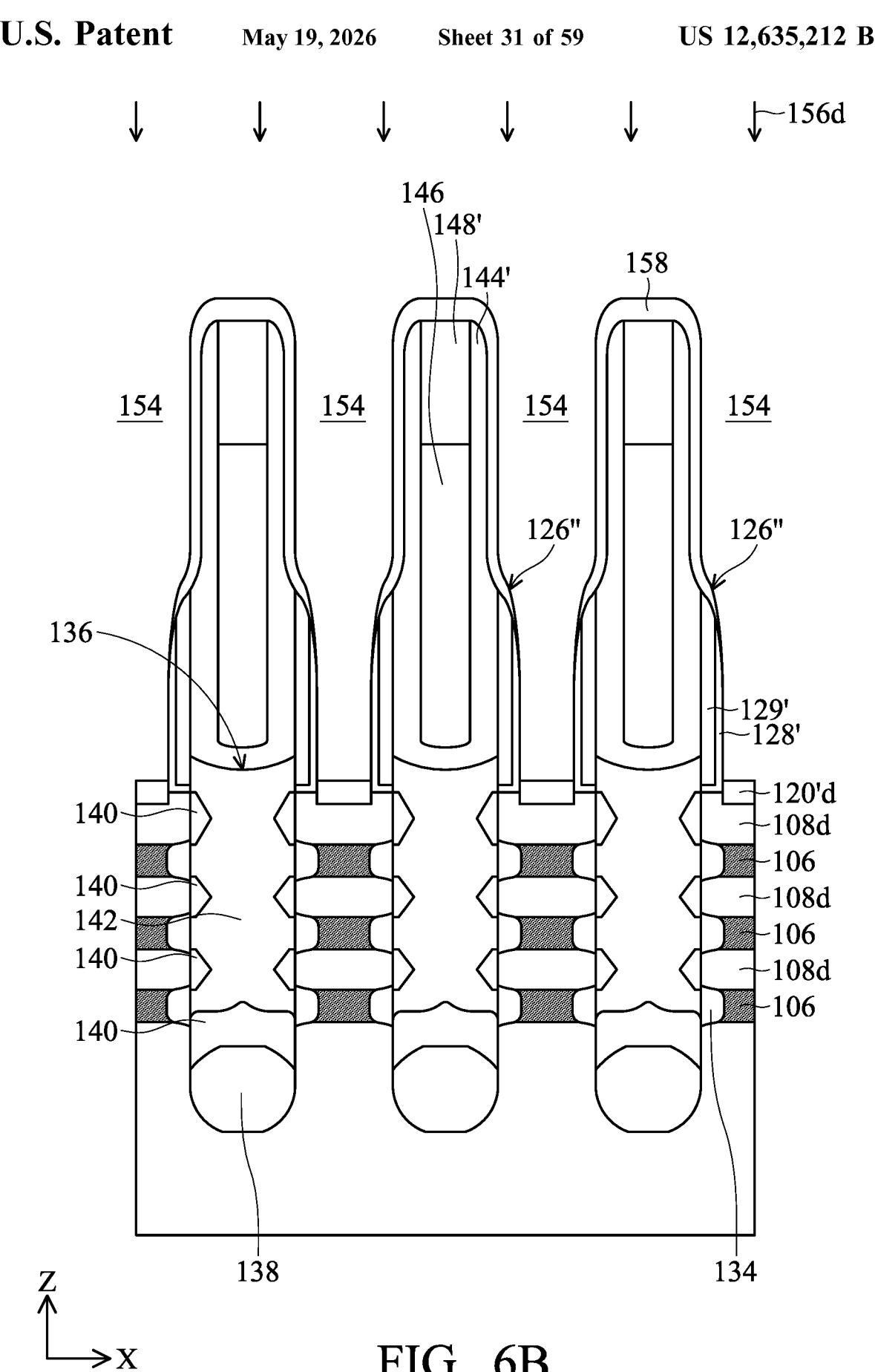
Figure 6C:
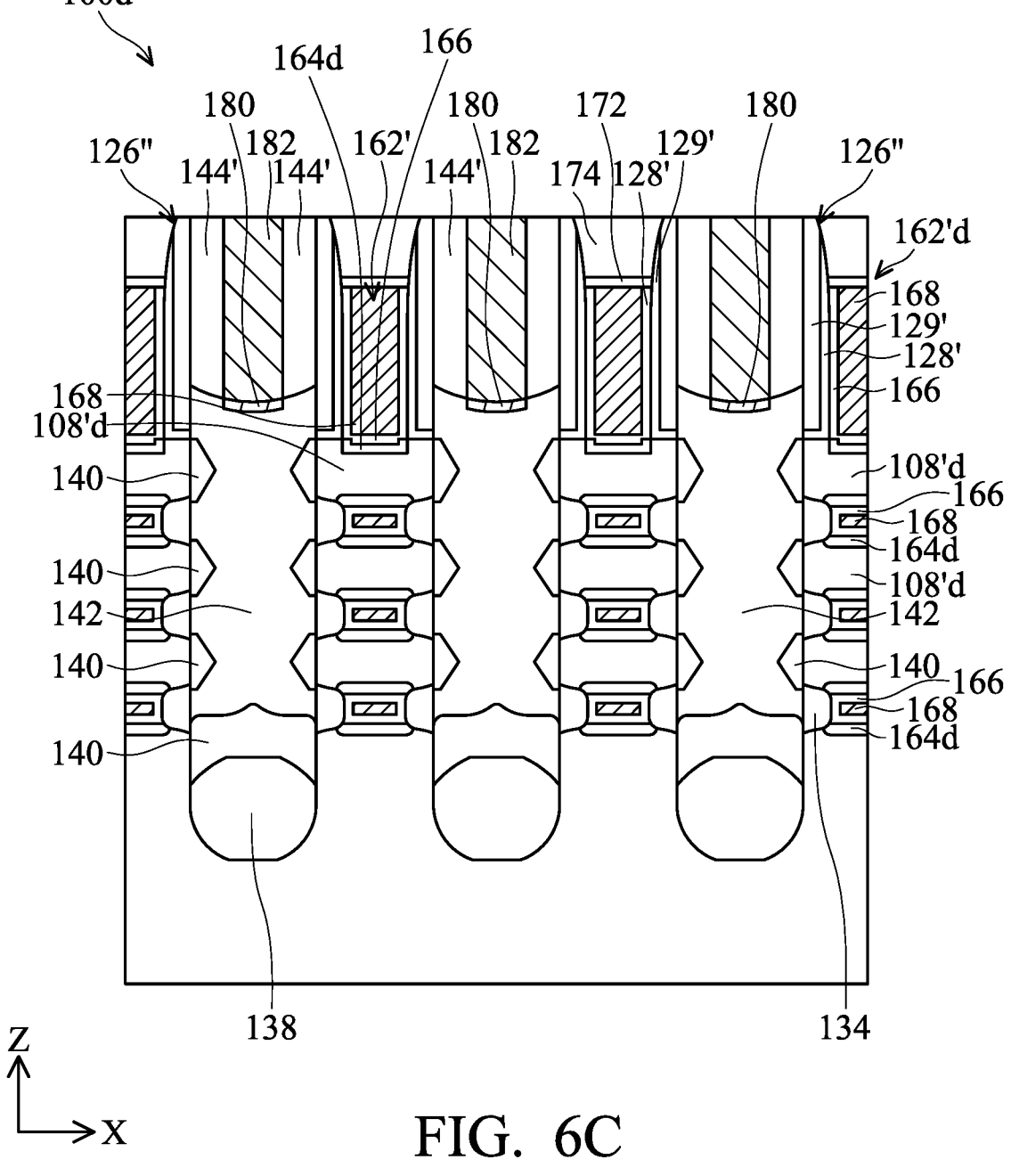

FIGS. 6A to 6C illustrate intermediate stages of manufacturing a semiconductor structure 100*d* in accordance with some embodiments. The semiconductor structure 100*d* may be similar to the semiconductor structure 100*c* described previously, except the topmost layer of second semiconductor layers 108*d* are thicker than other second semiconductor layers 108*d* in accordance with some embodiments.

More specifically, the first semiconductor material layers 106 and the second semiconductor material layers 108*d* are alternately stacked to form a semiconductor material stack over the substrate 102, and the topmost layer of the second semiconductor material layers 108*d* are thicker than other layers of the second semiconductor material layers 108*d* (e.g. the bottommost layer of the second semiconductor material layers 108*d*) in accordance with some embodiments. After the semiconductor stack is formed, the processes shown in FIGS. 2A to 2E described previously are performed to form the dummy gate structures 118 across the semiconductor stack, as shown in FIG. 6A in accordance with some embodiments.

Next, the processes shown in FIGS. 2F to 2H are performed, and an oxidation treatment 156*d* is performed to form the oxide layers 158 and thickened dummy gate dielectric layers 120'*d*, as shown in FIG. 6B in accordance with some embodiments. In some embodiments, the oxidation treatment 156*d* is the same as the oxidation treatment 156*c*. That is, the top portions of the topmost layer of second semiconductor material layers 108*d* in direct contact with the dummy gate dielectric layers (e.g. the dummy gate dielectric layers 120 shown in FIG. 2H) are also oxidized during the oxidization treatment 156*d*, so that the thickened dummy gate dielectric layers 120'*d* are formed in accordance with some embodiments.

After the oxidation treatment 156*d* is performed, the processes shown in FIGS. 2J to 2O described previously are performed to form the semiconductor structure 100*d*, as shown in FIG. 6C in accordance with some embodiments. Although the topmost layer of the second semiconductor layers 108*d* are partially oxidized during the oxidization treatment 156*d*, the topmost layer of channel layers 108'*d* formed of the second semiconductor material layers 108d at the channel regions has substantially the same thickness with the other layers of the channel layers 108'd (e.g. the bottommost layer of the channel layers 108'd) at the channel regions, since the topmost semiconductor layer 108d is originally thicker than the other semiconductor layers 108d in accordance with some embodiments. Accordingly, the Vt of each channel layers 108'd may be more uniform, and the performance of the gate structures 162'd will not be undermined. Meanwhile, the topmost layer of channel layers 108'd directly under the modified gate spacer 126" are thicker than the other layers of the channel layers 108'd (e.g. the bottommost layer of the channel layers 108'd) directly under the inner spacers 134 in accordance with some embodiments. In some embodiments, the topmost layer of the channel layers 108'd has recessed portions at the channel regions, and interfacial layers 164d of the gate structures 162'd are formed in and around the recessed portions.

Processes and materials for forming the semiconductor structure 100d may be similar to, or the same as, those for forming the semiconductor structures 100 and 100c described previously and are not repeated herein. In addition, the processes and materials for forming the second semiconductor material layers 108d/the channel layers 108'd and the interfacial layers 164d of the gate structures 162'd are similar to, or the same as, those for forming the second semiconductor material layers 108/the channel layers 108' and the interfacial layers 164 of the gate structures 162' described previously and are not repeated herein.

FIGS. 7A to 7F illustrate intermediate stages of manufacturing a semiconductor structure 100e in accordance with some embodiments. The semiconductor structure 100e may be similar to the semiconductor structure 100 described previously, except its shortened dummy gate structures 118'e are higher than those shown in the semiconductor structure 100 in accordance with some embodiments.

Figure 7A:
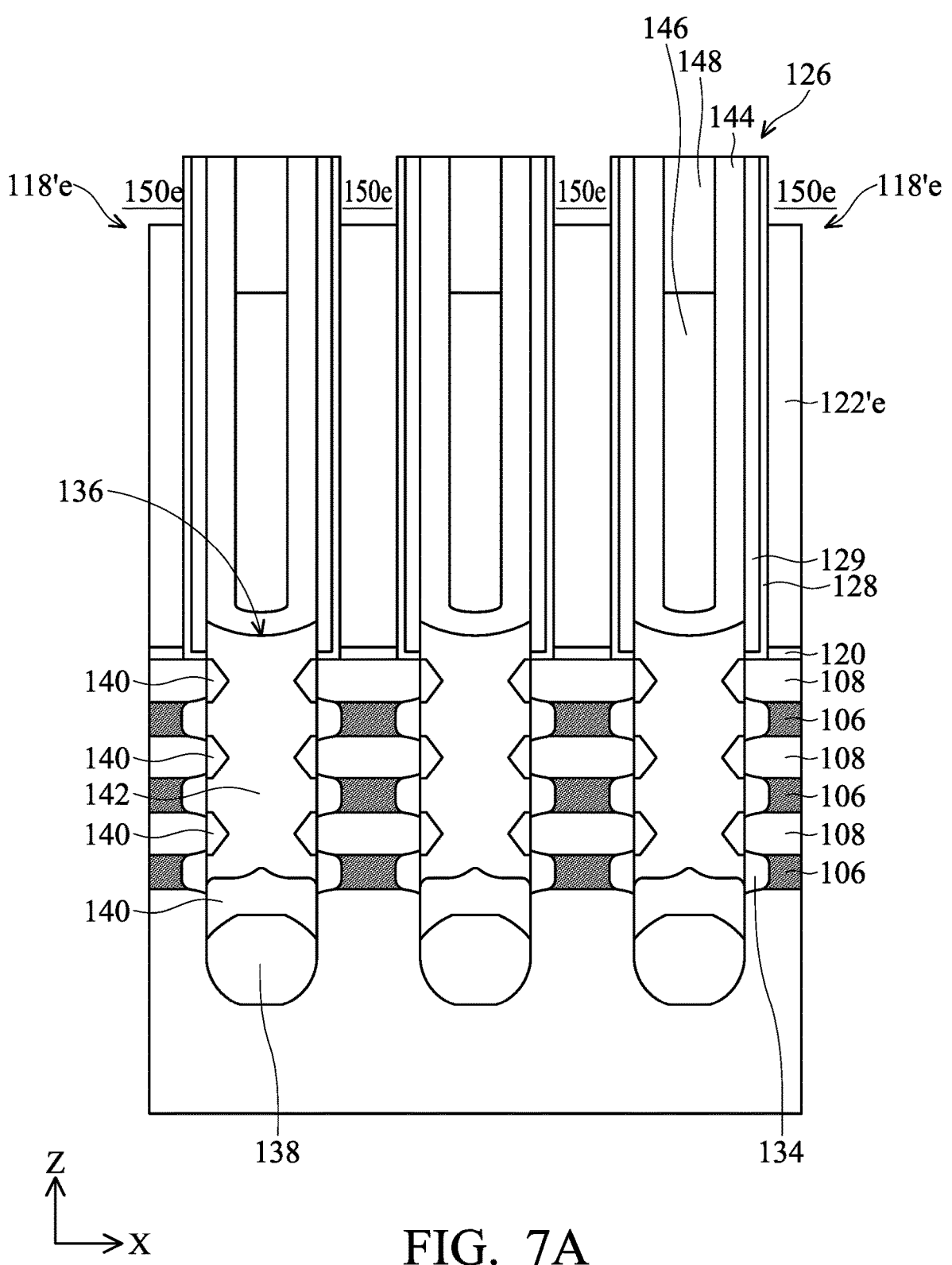

More specifically, the processes shown in FIGS. 2A to 2E described previously are performed, and the dummy gate structures (e.g. the dummy gate structures 118 shown in FIG. 2E) are recessed to form trenches 150e over the shortened dummy gate structures 118'e, as shown in FIG. 7A in accordance with some embodiments. Similar to those in FIG. 2F, the upper portions of the dummy gate structures are removed to expose the upper portions of the sidewalls of the gate spacers 126 in accordance with some embodiments. However, the top surfaces of the shortened dummy gate structures 118'e are still higher than the bottom surface of the mask structures 148 in accordance with some embodiments.

Figure 7B:
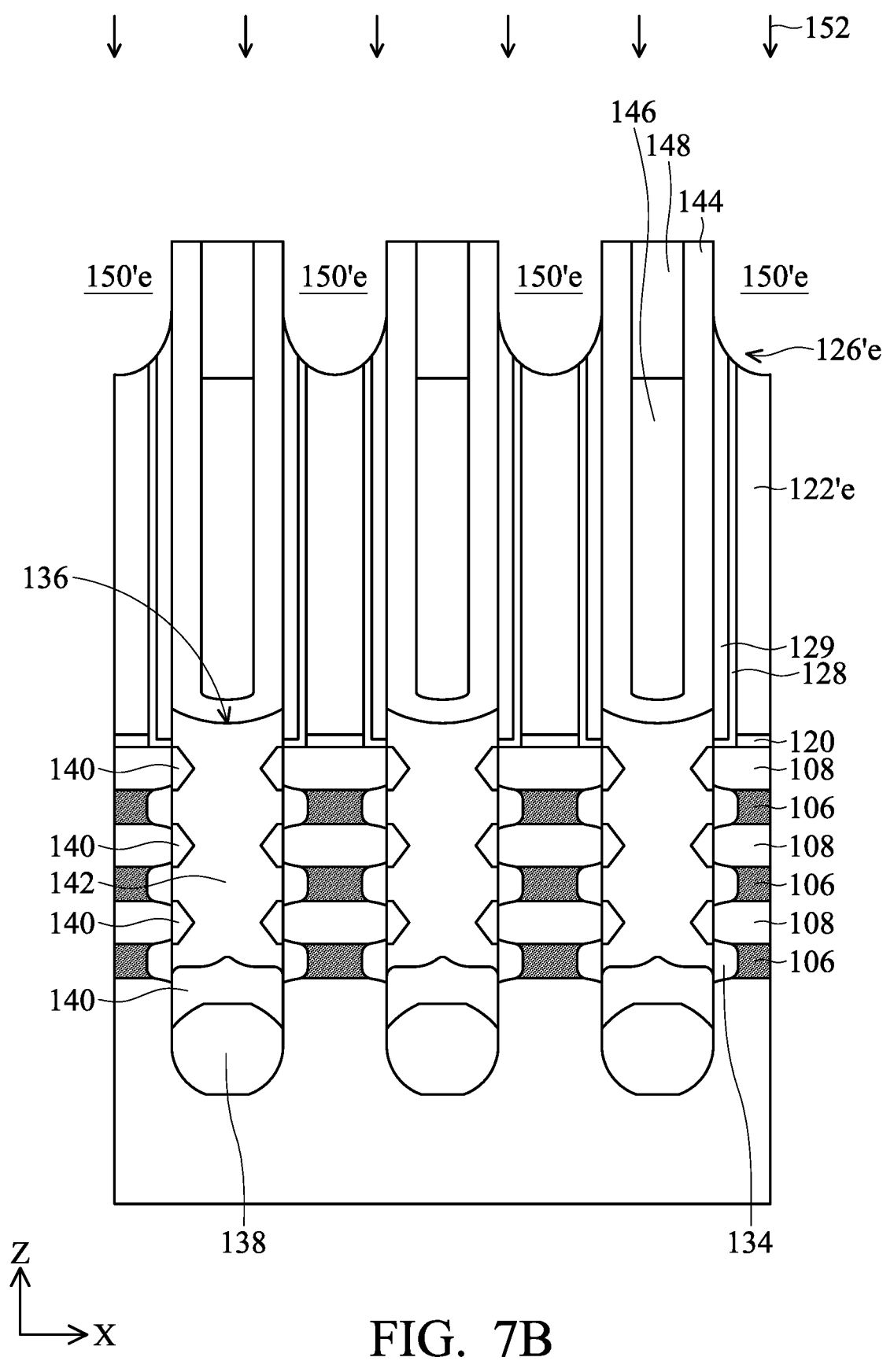

Next, the gate spacers 126 are partially removed to form shortened gate spacers 126'e and therefore to form enlarged trenches 150'e, as shown in FIG. 7B in accordance with some embodiments. Similar to the process shown in FIG. 2G and described above, the etching process 152 is performed to etch the portions of the gate spacers 126 exposed by the trenches 150e in accordance with some embodiments. In some embodiments, the shortened dummy gate electrode layers 122'e are also etched during the etching process 152. In some embodiments, the shortened dummy gate structures 118'e and the shortened gate spacers 126'e have curved top surfaces after performing the etching process 152. After the etching process 152 is performed, the contact etch stop layer 144 is partially exposed by the enlarged trenches 150'e in accordance with some embodiments.

Figure 7C:
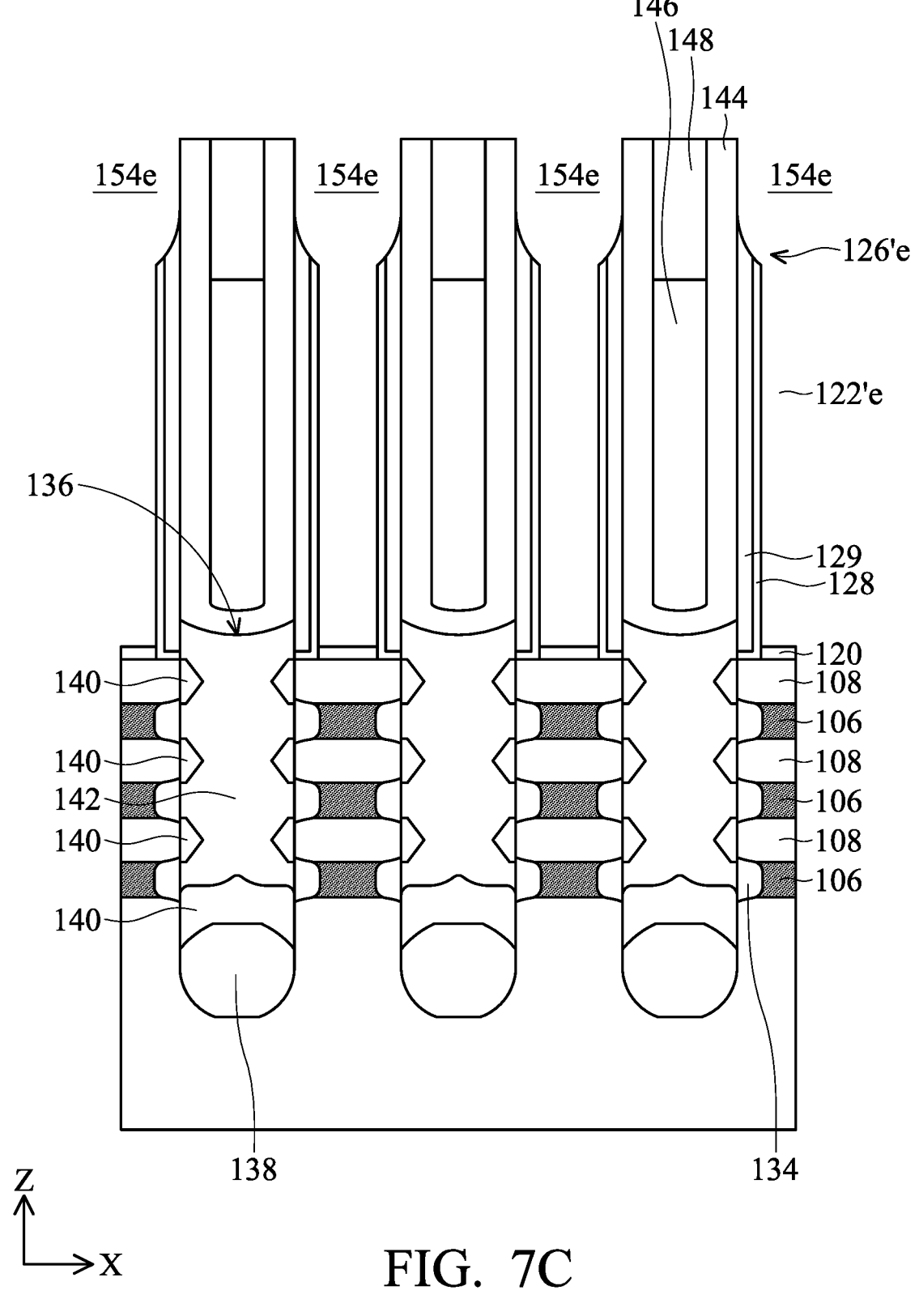

Next, the shortened dummy gate electrode layers 122'e are completely removed to form gate trenches 154e, as shown in FIG. 7C in accordance with some embodiments. Similar to the process shown in FIG. 2H and described above, the shortened dummy gate electrode layers 122'e are removed to expose the dummy gate dielectric layers 120 and the sidewalls of the shortened gate spacers 126'e in accordance with some embodiments.

Figure 7D:
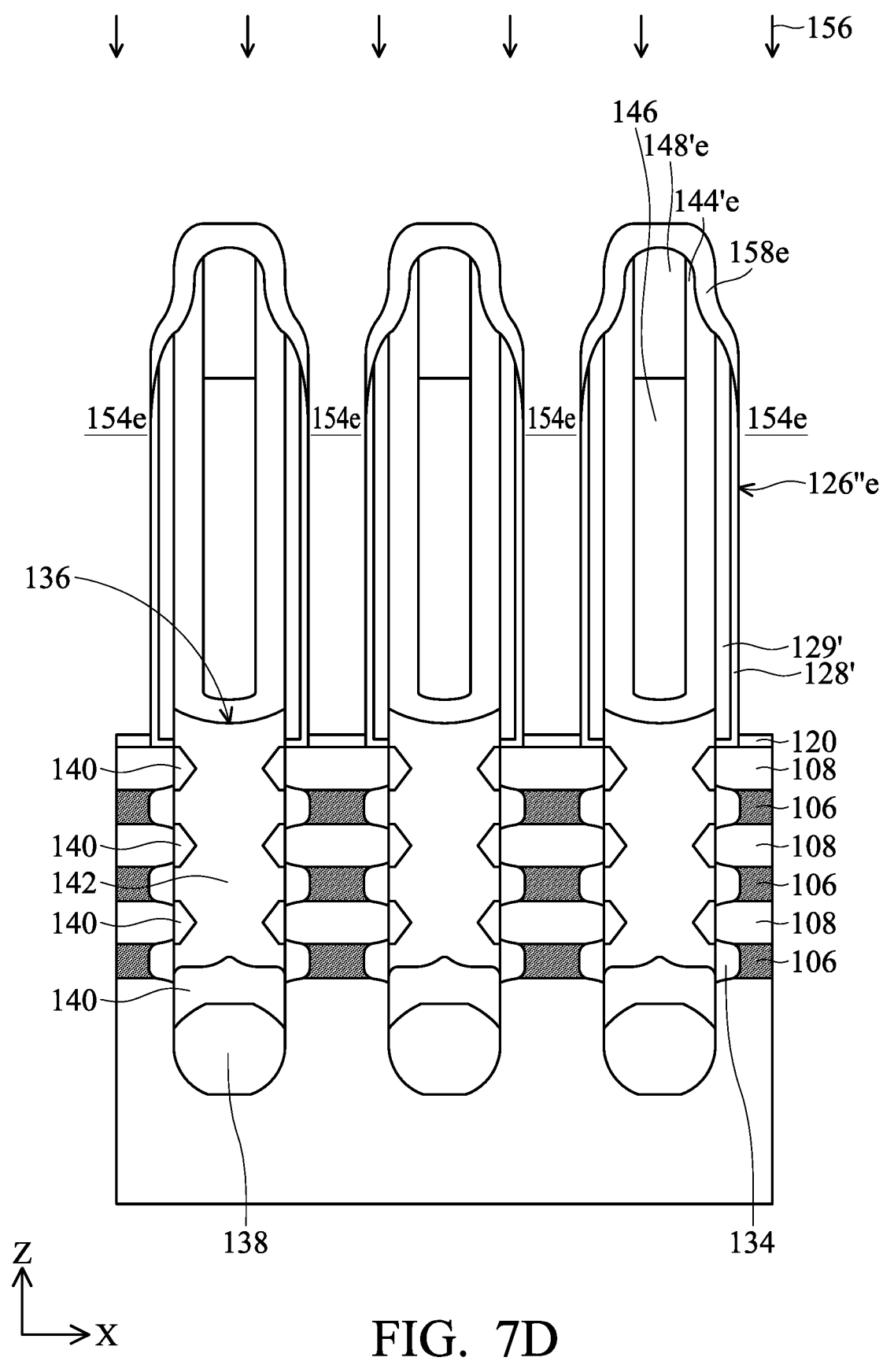

Afterwards, the oxidation treatment 156 is performed to form oxide layers 158e, as shown in FIG. 7D in accordance with some embodiments. More specifically, the exposed portions of the shortened gate spacers 126'e, the contact etch stop layer 144, and the mask structures 148 are partially oxidized during the oxidation treatment 156, and the oxide layers 158e are formed over modified gate spacers 126"e, modified contact etch stop layer 144'e, and modified mask structures 148'e in accordance with some embodiments.

Since the shortened gate spacers 126'e are relatively high, compared to those in FIG. 2H, most of the gate trenches 154e are relatively narrower, compared to those in FIG. 2I. Therefore, the oxide layers 158e are mainly formed over the top portion of the modified gate spacers 126"e, and the widths of the bottom portions of the modified gate spacers 126"e are substantially the same as the width of the bottom portions of the original gate spacers 126 in accordance with some embodiments. In some embodiments, the bottom portions of the modified gate spacers 126"e have substantially straight sidewalls. In some embodiments, each of the oxide layers 158e has the greatest thickness over the top surface of the modified mask structures 148'.

Figure 7E:
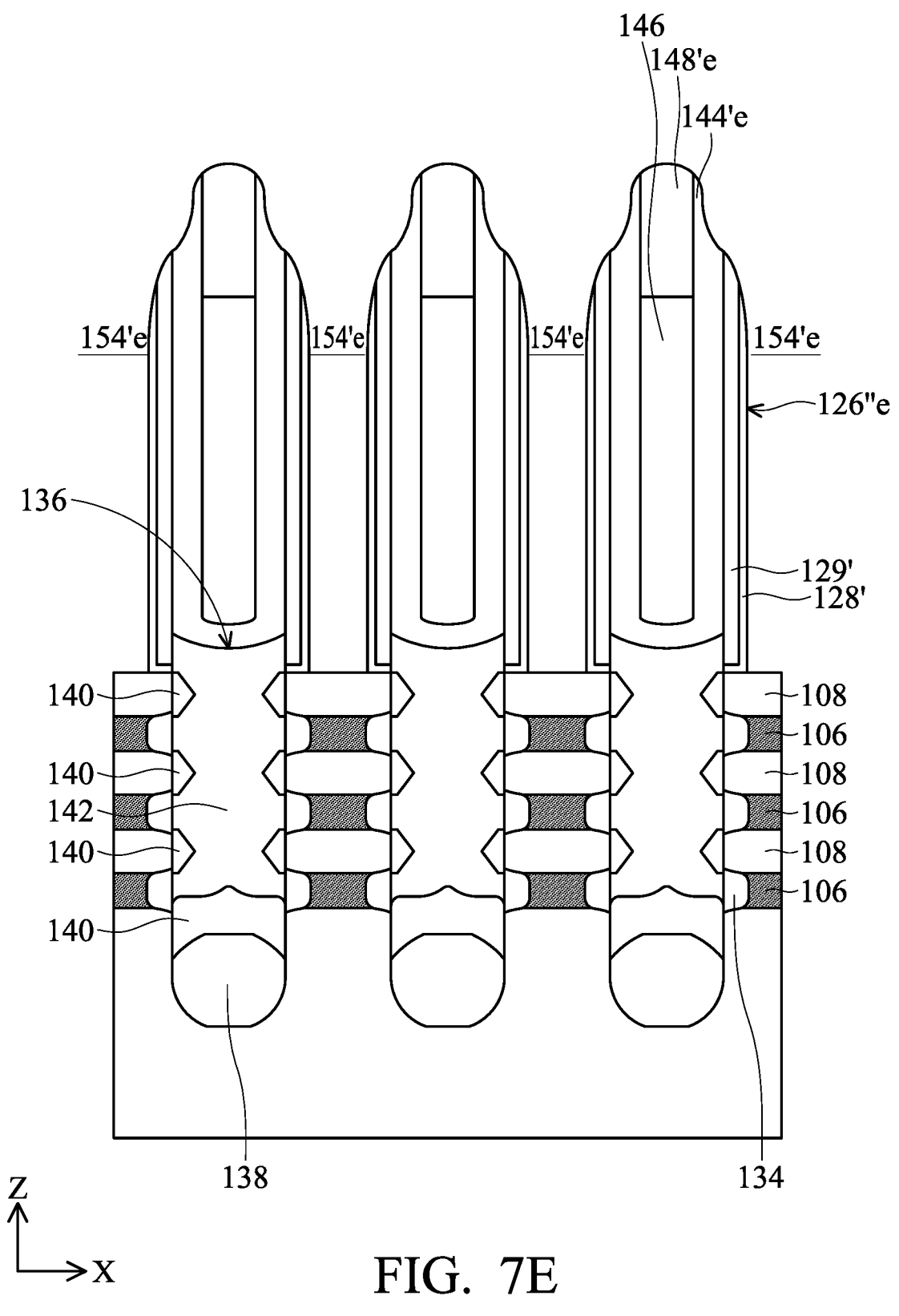
Figure 7F:
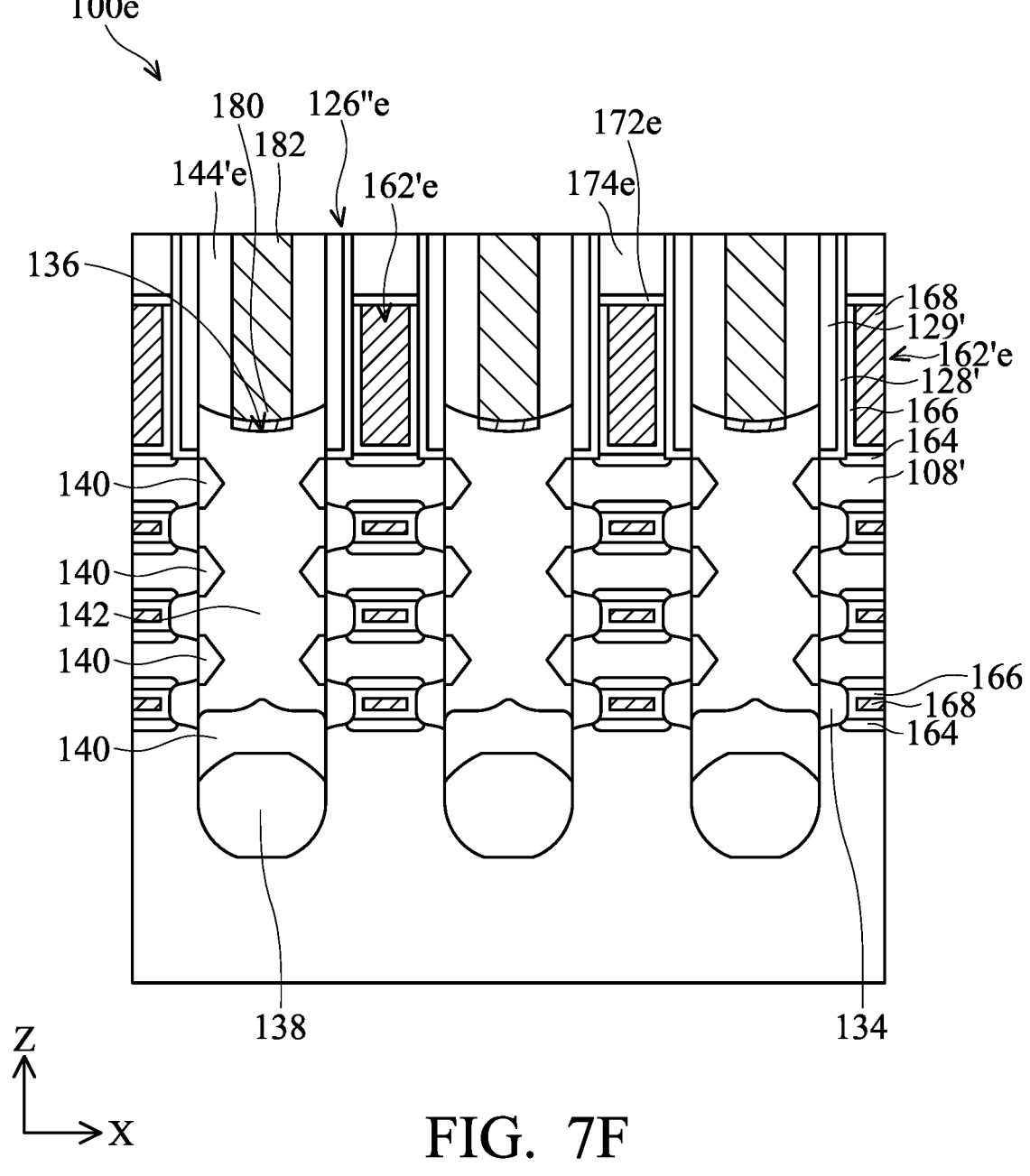

After the oxidation treatment 156 is performed, the oxide layers 158e and the dummy gate dielectric layers 120 are removed to expose the modified gate spacers 126"e, the modified contact etch stop layer 144'e, the modified mask structures 148'e, and the topmost layer of the second semiconductor material layers 108, as shown in FIG. 7E in accordance with some embodiments. Since the oxide layers 158e are formed by oxidizing the shortened gate spacers 126'e, the contact etch stop layer 144, and the mask structures 148, the size of the modified gate spacers 126"e, the modified contact etch stop layer 144'e, and the modified mask structures 148'e are smaller than those before performing the oxidation treatment 156 in accordance with some embodiments. Accordingly, after the oxide layers 158e are removed, the gate trenches 154e are enlarged to form the modified gate trenches 154'e in accordance with some embodiments.

Afterwards, the processes shown in FIGS. 2K to 2O described previously are performed to form the semiconductor structure 100e, as shown in FIG. 2F in accordance with some embodiments. Since the bottom portions of the modified gate spacers 126"e have substantially straight sidewalls, the gate structures 162'e also have substantially straight sidewalls in accordance with some embodiments. In some embodiments, the capping layers 172e are in contact with modified gate spacers 126"e. In some embodiments, the mask structures 174e are in contact with the modified gate spacers 126"e.

Processes and materials for forming the semiconductor structure 100e may be similar to, or the same as, those for forming the semiconductor structure 100 described previously and are not repeated herein. In addition, the processes and materials for forming the shortened dummy gate electrode layers 122'e of the shortened dummy gate structures 118'e, the trenches 150e/the enlarged trenches 150'e/the gate trenches 154e, the shortened gate spacers 126'e/the modified gate spacers 126"e, the oxide layers 158e, the modified contact etch stop layers 144'e, the modified mask structures 148'e, the gate structures 162'e, the capping layers 172e, and the mask structures 174e are similar to, or the same as, those for forming the shortened dummy gate electrode layers 122' of the shortened dummy gate structures 118', the trenches 150/the enlarged trenches 150'/the gate trenches 154, the shortened gate spacers 126'/the modified gate spacers 126", the oxide layers 158e, the modified contact etch stop layers 144', the modified mask structures 148', the gate structures 162', the capping layers 172, and the mask structures 174 described previously and are not repeated herein.

FIGS. 8A to 8D illustrate intermediate stages of manufacturing a semiconductor structure 100f in accordance with some embodiments. The semiconductor structure 100f may be similar to the semiconductor structure 100 described previously, except the upper portions of the gate spacers are not removed as the dummy gate structures are not partially, but completely, removed in a single etching process before performing the oxidation treatment in accordance with some embodiments.

Figure 8A:
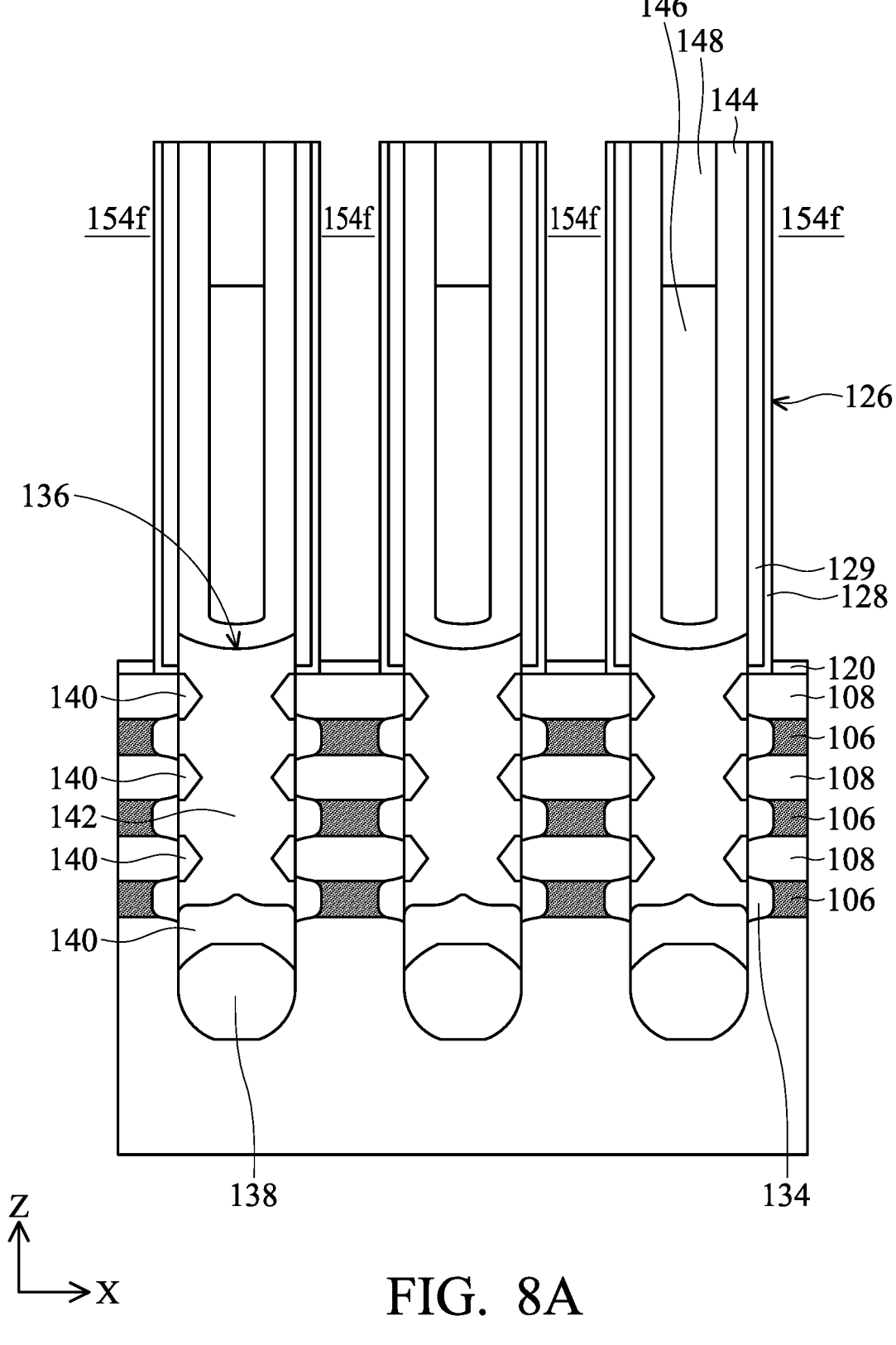

More specifically, the processes shown in FIGS. 2A to 2E described previously are performed, and then the dummy gate electrode layers (e.g. the dummy gate electrode layers 122 shown in FIG. 2E) are completely removed to form gate trenches 154f, as shown in FIG. 8A in accordance with some embodiments. That is, the processes shown in FIGS. 2F to 2G for forming the semiconductor structure 100 described previously are omitted.

Figure 8B:
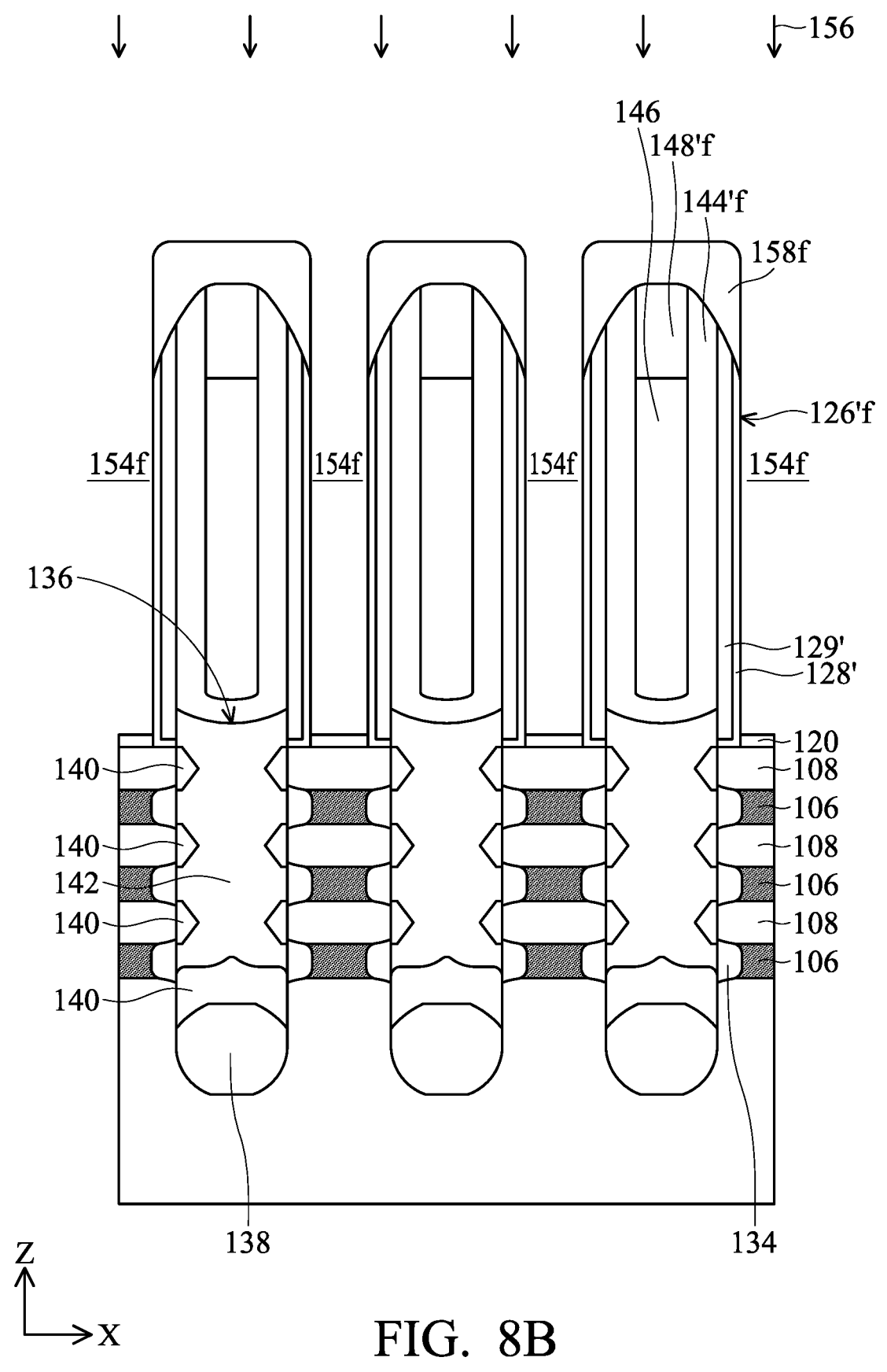

Afterwards, the oxidation treatment 156 is performed to form oxide layers 158f, as shown in FIG. 8B in accordance with some embodiments. More specifically, the gate spacers 126, the contact etch stop layer 144, and the mask structures 148 are partially oxidized during the oxidation treatment 156, and the oxide layers 158f are formed over modified gate spacers 126"f, modified contact etch stop layer 144'f, and modified mask structures 148'f in accordance with some embodiments.

Since the gate spacers 126 are not shortened before performing the oxidation treatment 156, the oxide layers 158f are mainly formed over the top portion of the modified gate spacers 126"f in accordance with some embodiments. In some embodiments, the bottommost portions of the oxide layers 158f are higher than the bottom surfaces of the modified mask structures 148'f. Therefore, the widths of the portions of the modified gate spacers 126"f no higher than the bottom surfaces of the modified mask structures 148'f are substantially the same as the width of the bottom portions of the original gate spacers 126. In some embodiments, the portions of the modified gate spacers 126"f no higher than the bottom surfaces of the modified mask structures 148'f have substantially straight sidewalls. In some other embodiments, the bottommost portions of the oxide layers 158f are substantially level with, or lower than, the bottom surfaces of the modified mask structures 148'f.

Figure 8C:
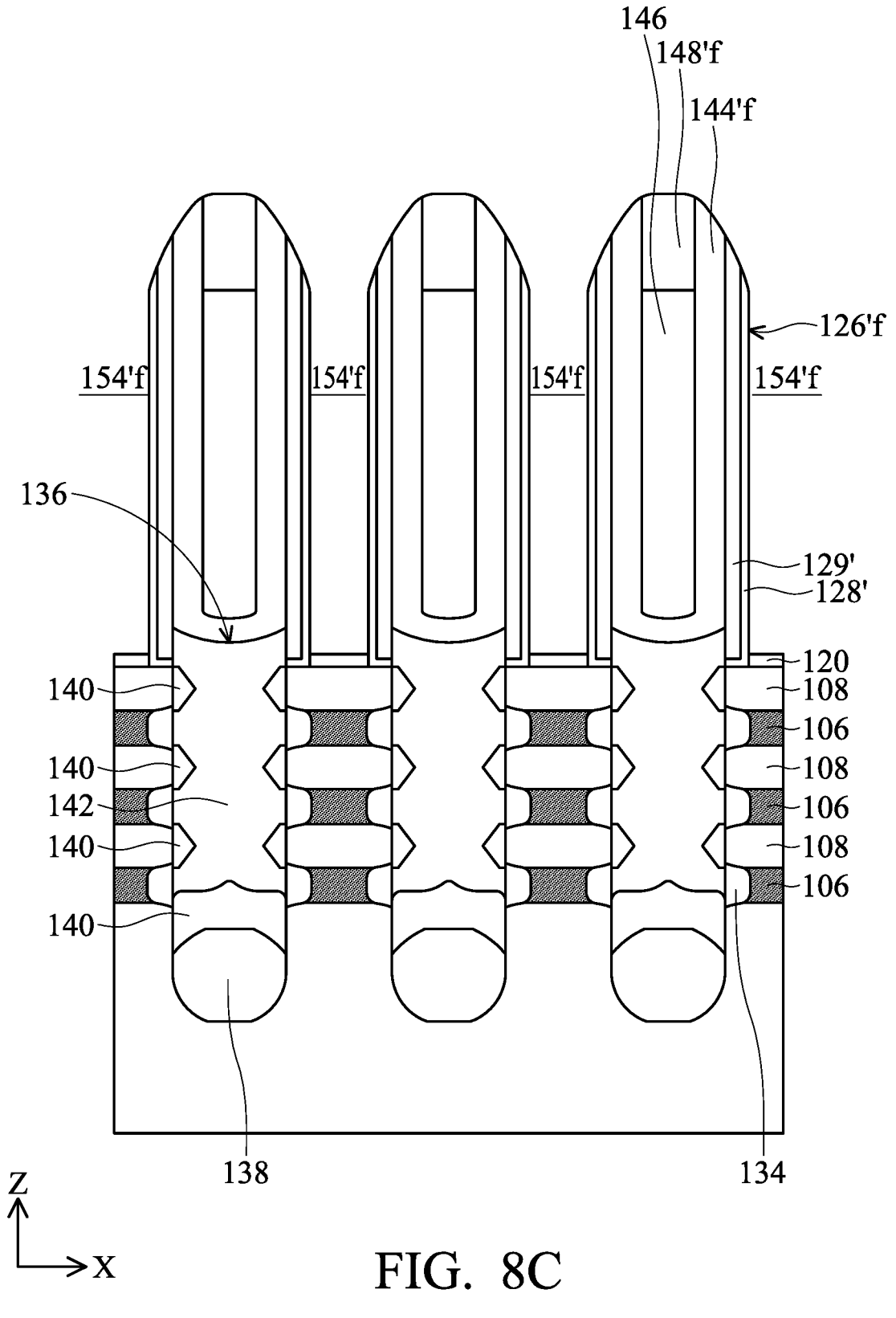

After the oxidation treatment 156 is performed, the oxide layers 158f and the dummy gate dielectric layers 120 are removed to expose the modified gate spacers 126"f, the modified contact etch stop layer 144'f, the modified mask structures 148'f, and the topmost layer of the second semiconductor material layers 108, as shown in FIG. 8C in accordance with some embodiments. Although the gate spacers 126 are not shortened before the oxidation treatment 156, the upper portions of the gate trenches 154f can still be enlarged to form the modified gate trenches 154'f by performing the oxidation treatment 156 in accordance with some embodiments.

Figure 8D:
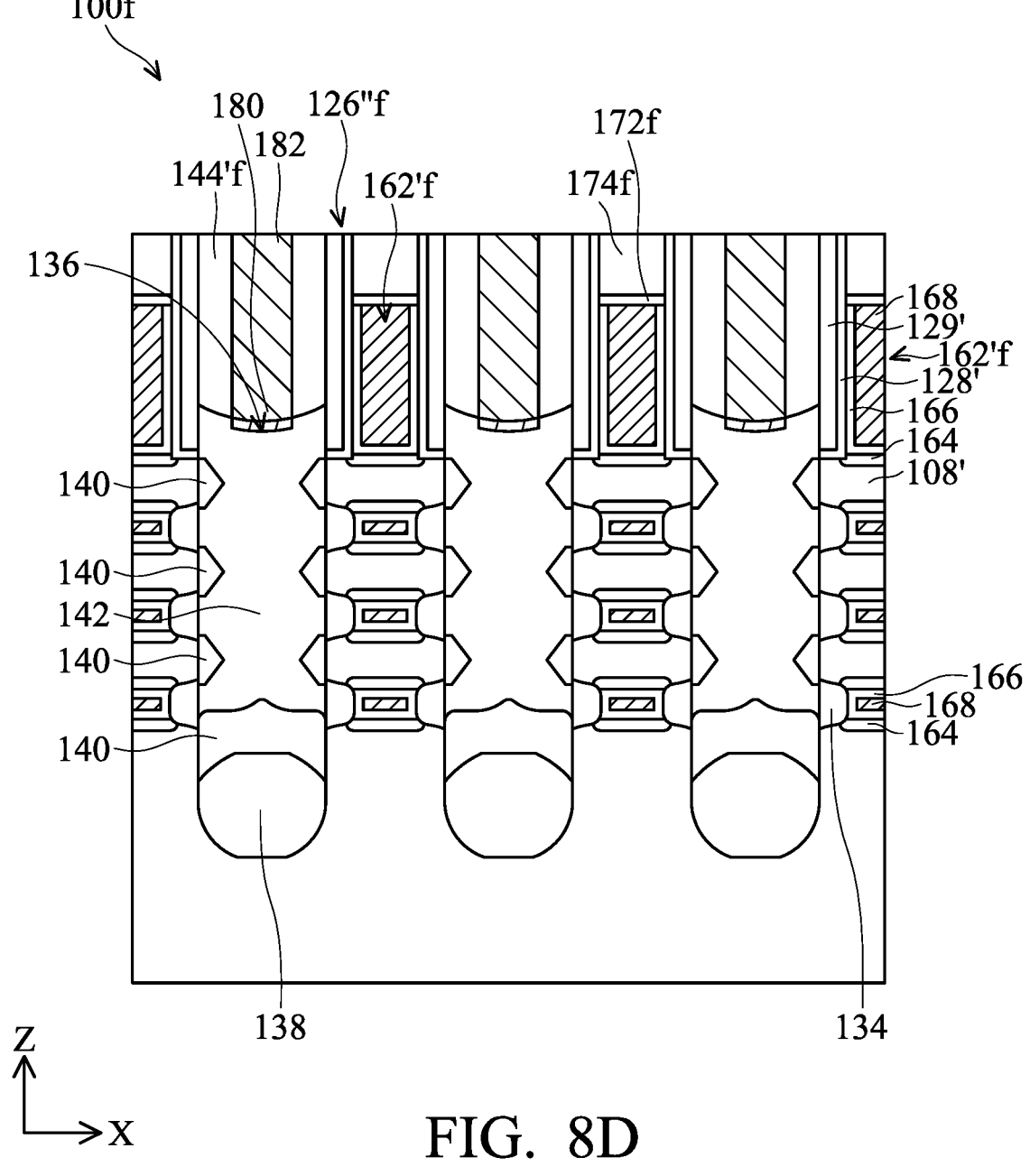

Afterwards, the processes shown in FIGS. 2K to 2O described previously are performed to form the semiconductor structure 100f, as shown in FIG. 8D in accordance with some embodiments. Since the bottom portions of the modified gate spacers 126"f have substantially straight sidewalls, the gate structures 162'f also have substantially straight sidewalls in accordance with some embodiments. In some embodiments, the capping layers 172f are in contact with the modified gate spacers 126"f. In some embodiments, the mask structures 174f are also in contact with the modified gate spacers 126"f.

Processes and materials for forming the semiconductor structure 100f may be similar to, or the same as, those for forming the semiconductor structure 100 described previously and are not repeated herein. In addition, the processes and materials for forming the gate trenches 154f/the modified gate trenches 154'f, the oxide layers 158f, the modified contact etch stop layers 144'f, the mask structures 148'f, the modified gate spacers 126"f, the capping layers 172f, the mask structures 174f, and the gate structures 162'f are similar to, or the same as, those for forming the gate trenches 154/the modified gate trenches 154', the oxide layers 158, the modified contact etch stop layers 144', the mask structures 148', the modified gate spacers 126", the capping layers 172, the mask structures 174, and the gate structures 162' described previously and are not repeated herein.

Figure 9A:
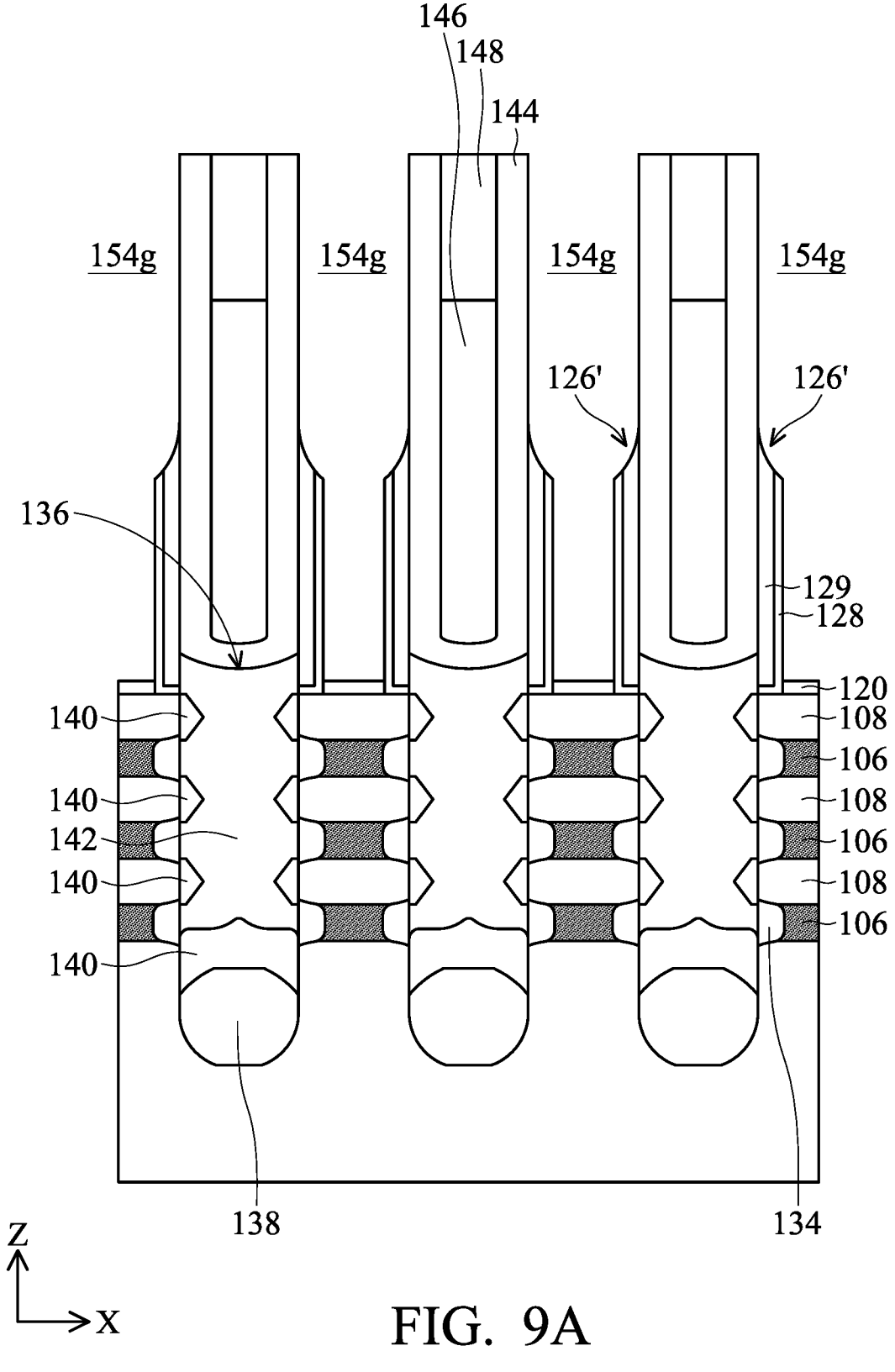
FIGS. 9A and 9B illustrate intermediate stages of manufacturing a semiconductor structure in accordance with some embodiments.
Figure 9B:
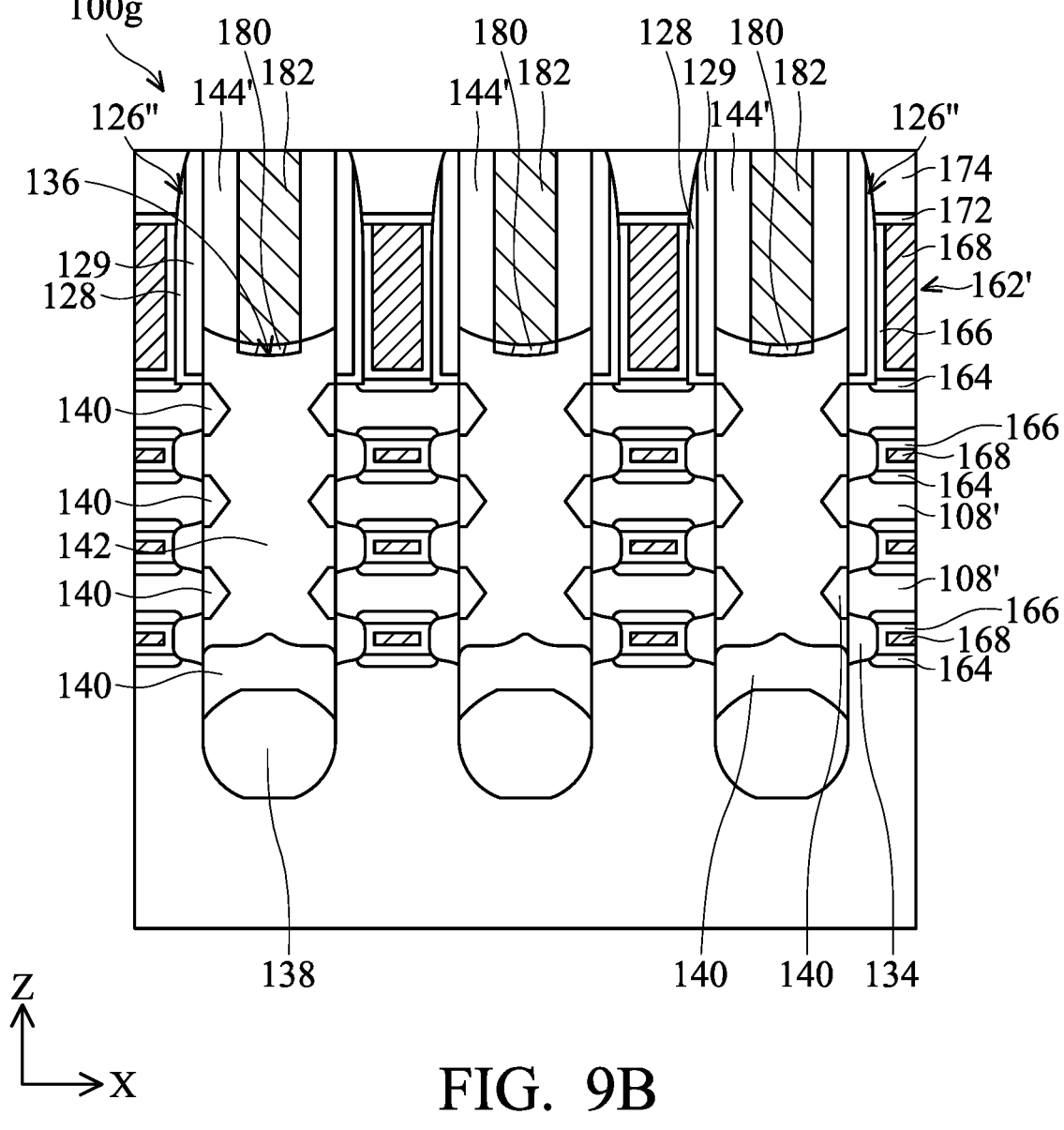

FIGS. 9A and 9B illustrate intermediate stages of manufacturing a semiconductor structure 100g in accordance with some embodiments. The semiconductor structure 100g may be similar to the semiconductor structure 100 described previously, except the dummy gate electrode layers are completely removed when shortening the gate spacers in accordance with some embodiments.

More specifically, the processes shown in FIGS. 2A to 2F described previously are performed, and then the gate spacers (e.g. the gate spacers 126 shown in FIG. 2F) and the shortened dummy gate electrode layers (e.g. the shortened dummy gate electrode layers 122' shown in FIG. 2F) are both etched to form gate trenches 154g in accordance with some embodiments. In addition, the gate spacers are partially removed to form the shortened gate spacers 126' while the shortened dummy gate electrode layers are completely removed to expose the dummy gate dielectric layers 120 by the etching process in accordance with some embodiments. The etching selectivity between the gate spacers and the shortened dummy gate electrode layers during the etching process shown in FIG. 9A may be less than the etching selectivity between the gate spacers and the shortened dummy gate electrode layers during the etching process shown in FIG. 2G, such that the shortened dummy gate electrode layers may be completely removed when the gate spacers are partially etched. Accordingly, additional etching process (e.g. the process shown in FIG. 2H) for removing the shortened dummy gate electrode layers may not be required.

Afterwards, the processes shown in FIGS. 2I to 2O described previously are performed to form the semiconductor structure 100g, as shown in FIG. 9B in accordance with some embodiments. The resulting semiconductor structure 100g may be the same as the semiconductor structure 100 described previously. Processes and materials for forming the semiconductor structure 100g may be similar to, or the same as, those for forming the semiconductor structure 100 described previously and are not repeated herein.

FIGS. 10A to 10F illustrate intermediate stages of manufacturing a semiconductor structure 100h in accordance with some embodiments. The semiconductor structure 100h may be similar to the semiconductor structure 100 described previously, except its contact etch stop layers and mask structures are also partially removed when forming the shortened gate spacers in accordance with some embodiments.

Figure 10A:
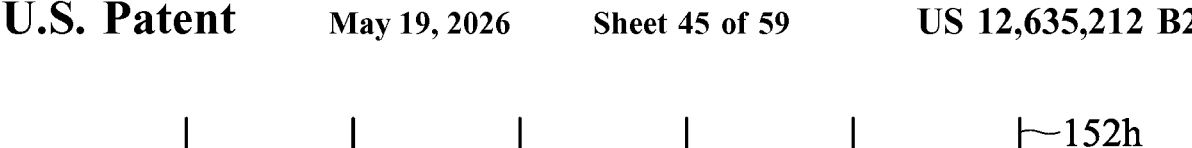
FIGS. 10A to 10F illustrate intermediate stages of manufacturing a semiconductor structure in accordance with some embodiments.

More specifically, the processes shown in FIGS. 2A to 2F described previously are performed, and then the gate spacers (e.g. the gate spacers 126 shown in FIG. 2F), the contact etch stop layers (e.g. the contact etch stop layers 144 shown in FIG. 2F), and the mask structures (e.g. the mask structures 148 shown in FIG. 2F) are etched to form the shortened gate spacers 126', etched contact etch stop layers 144h and etched mask structures 148h by performing an etching process 152h, as shown in FIG. 10A in accordance with some embodiments. The etching selectivity of the contact etch stop layers and the mask structures with the gate spacers in the etching process 152h may be less than the etching selectivity between the contact etch stop layers and the mask structures with the gate spacers in the etching process 152, so that the contact etch stop layers and the mask structures are also partially etched during the etching process 152h. Accordingly, the etched contact etch stop layers 144h also have sloped sidewalls at the upper portions in accordance with some embodiments. In addition, the etched mask structures 148h have rounded top portions in accordance with some embodiments.

Figure 10B:
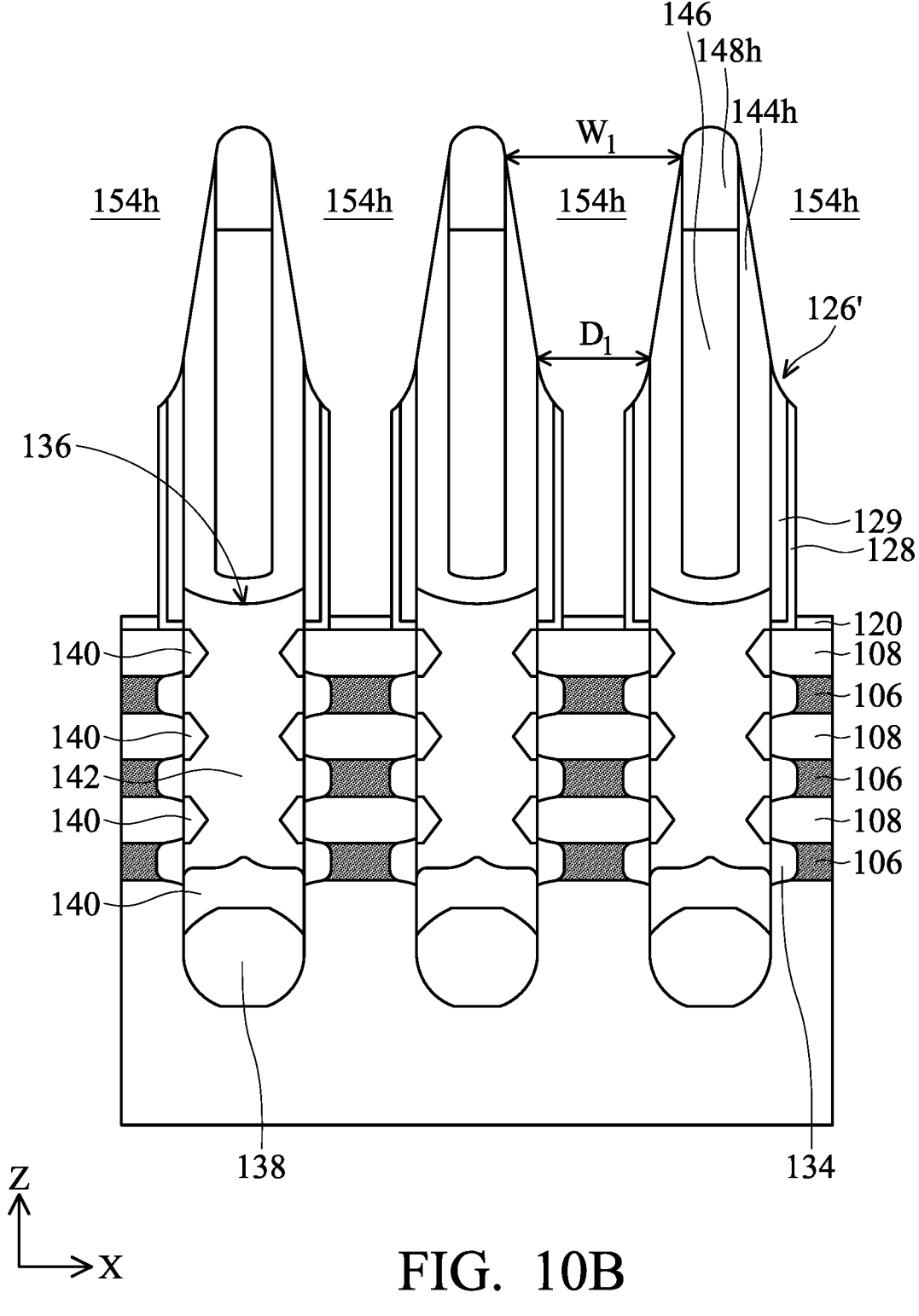

Next, the shortened dummy gate electrode layers 122' are completely removed to form gate trenches 154h, as shown in FIG. 10B in accordance with some embodiments. Since the upper portions of the gate trenches 154h are defined by the etched contact etch stop layers 144h and the etch mask structures 148h, the upper portions of the gate trenches 154h are wider than the upper portions of the gate trenches 154 shown in FIG. 2H. In some embodiments, the top width $W_1$ of the gate trench 154h measured along the X direction is greater than the greatest distance $D_1$ between two sides of the shortened gate spacers 126' measured along the X direction.

Figure 10C:
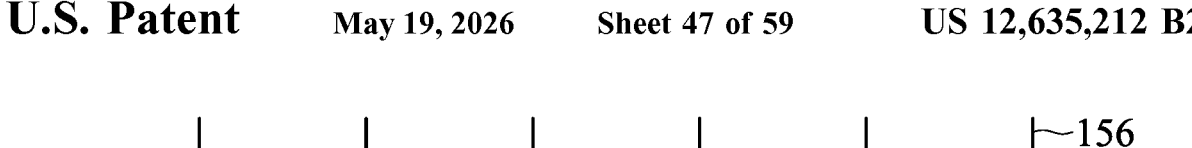

Afterwards, the oxidation treatment 156 is performed to form oxide layers 158h, as shown in FIG. 10C in accordance with some embodiments. More specifically, the shortened gate spacers 126', the etched contact etch stop layer 144h, the interlayer dielectric layers 146, and the etched mask structures 148h are all partially oxidized during the oxidation treatment 156, and the oxide layers 158h are formed over modified gate spacers 126"h, modified contact etch stop layer 144'h, modified interlayer dielectric layers 146'h, and modified mask structures 148'h in accordance with some embodiments.

Figure 10D:
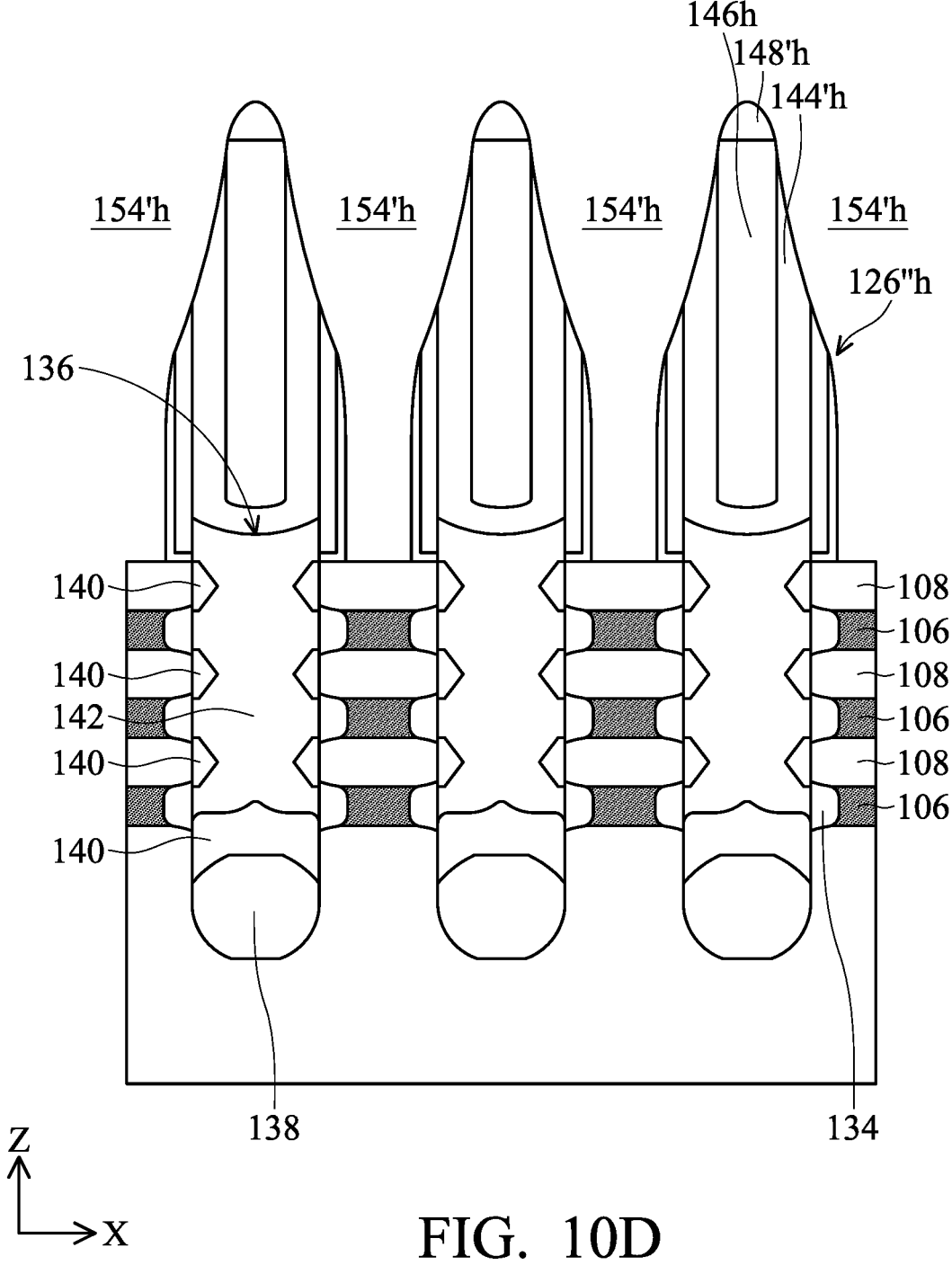

After the oxidation treatment 156 is performed, the oxide layers 158h and the dummy gate dielectric layers 120 are removed to expose the modified gate spacers 126"h, the modified contact etch stop layer 144'h, the modified mask structures 148'h, the modified interlayer dielectric layers 146'h, and the topmost layer of the second semiconductor material layers 108, as shown in FIG. 10D in accordance with some embodiments.

Since the oxide layers 158h are formed by oxidizing the shortened gate spacers 126', the etched contact etch stop layer 144h, the etched mask structures 148h, and the interlayer dielectric layers 146, the size of the modified gate spacers 126", the modified contact etch stop layer 144'h, the modified interlayer dielectric layers 146'h, and the modified mask structures 148'h are smaller than those before performing the oxidation treatment 156 in accordance with some embodiments. Accordingly, after the oxide layers 158h are removed, the gate trenches 154h are enlarged to form the modified gate trenches 154'h in accordance with some embodiments. In some embodiments, portions of the modified interlayer dielectric layers 146'h are also exposed by the modified gate trenches 154'h. In some embodiments, the modified mask structures 148'h are not in contact with the modified contact etch stop layers 144'h.

Figure 10E:
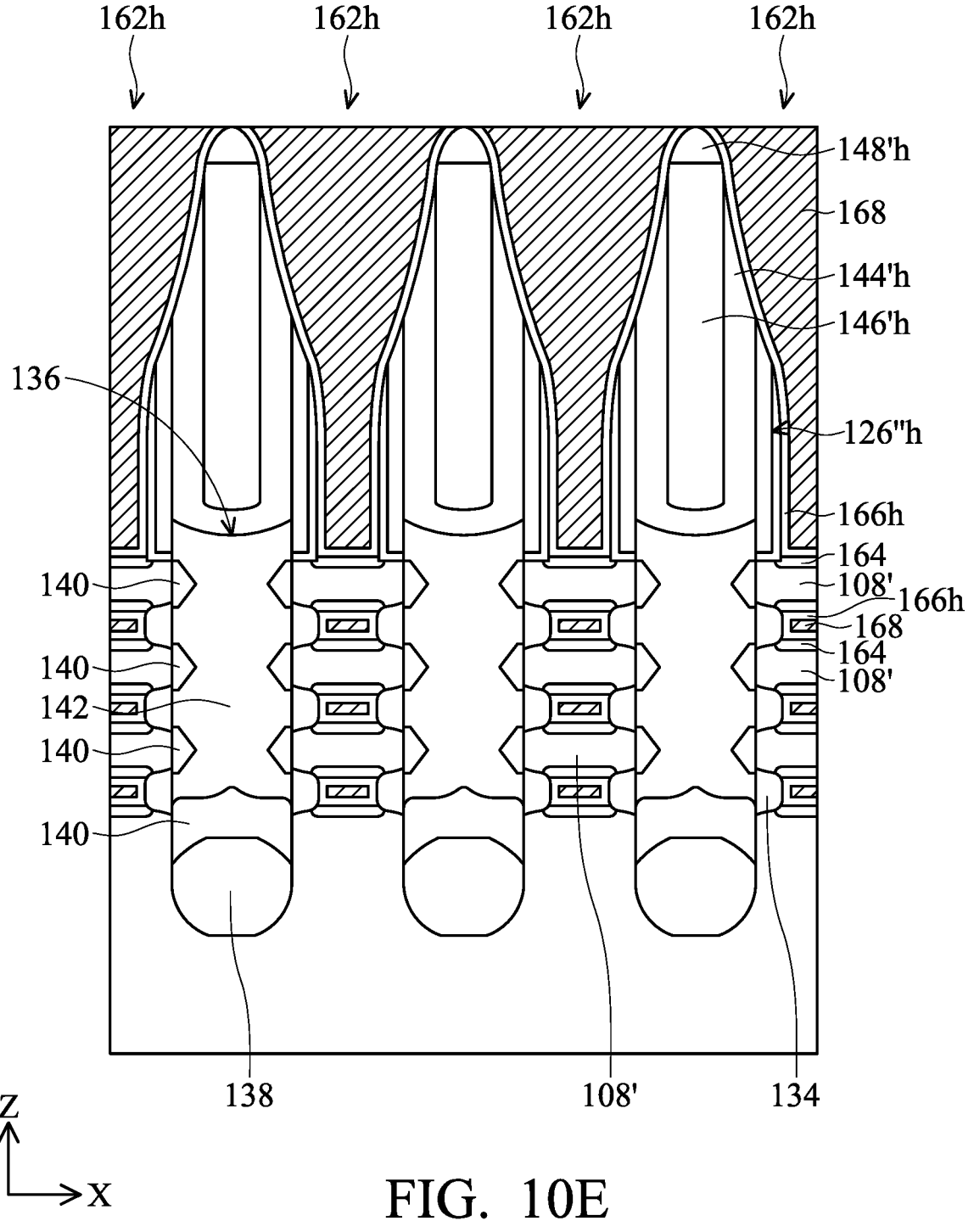

Next, the processes shown in FIGS. 2K to 2L described previously are performed to form gate stacks 162h in the modified gate trenches 154'h and the gaps between the channel layers 108', as shown in FIG. 10E in accordance with some embodiments. The gate stacks 162h wrap around the channel layers 108' to form gate-all-around transistor structures in accordance with some embodiments. In some embodiments, portions of the gate dielectric layers 166h are in contact with the modified mask structures 148'h, the modified interlayer dielectric layers 146'h, the modified contact etch stop layers 144'h, and the modified gate spacers 126"h.

Figure 10F:
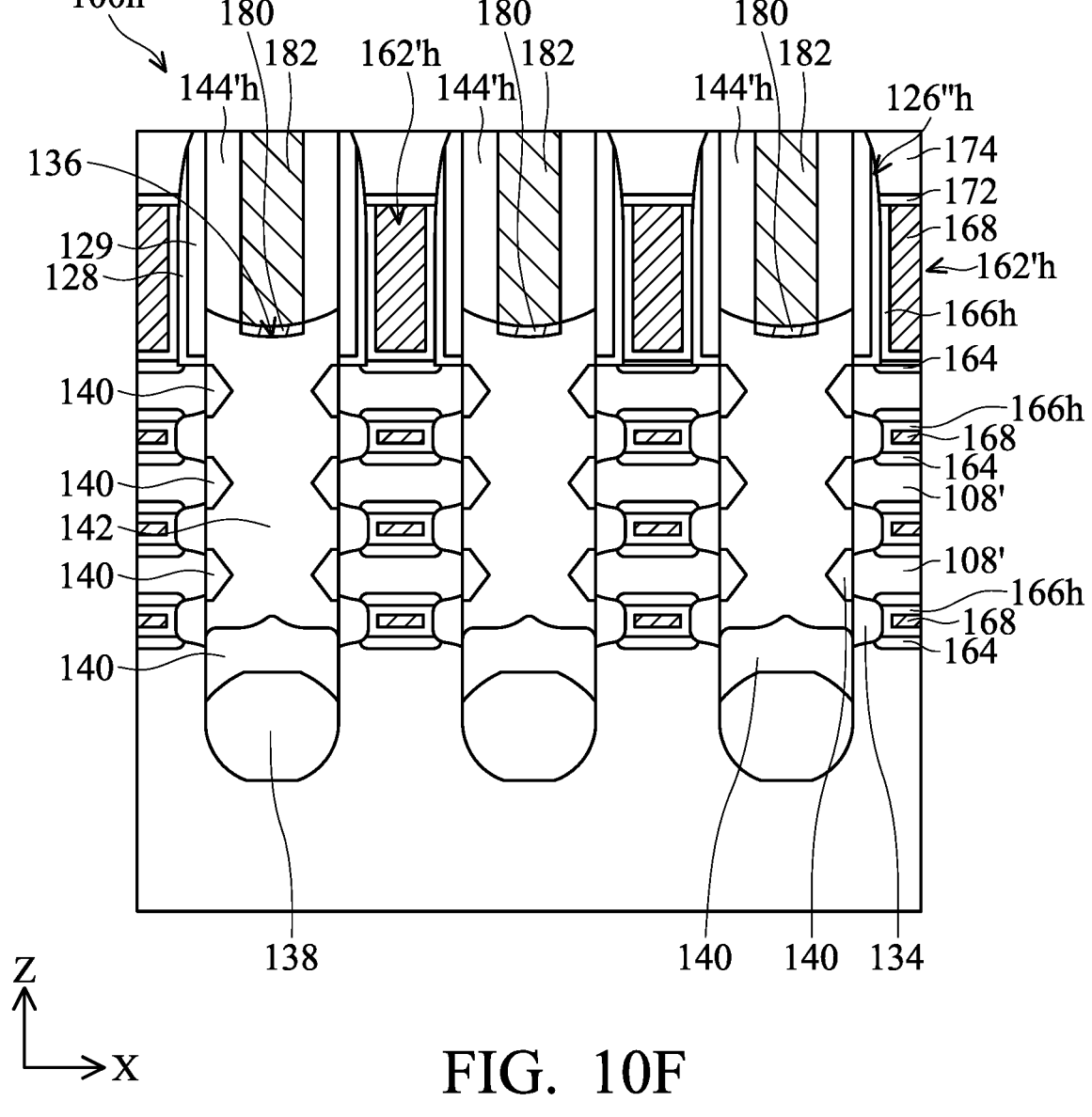

Afterwards, the processes shown in FIGS. 2M to 2O described previously are performed to form the semiconductor structure 100h, as shown in FIG. 10F in accordance with some embodiments. Since the upper portions of the gate stacks 162h are removed, the resulting gate structures 162'h may be substantially the same as the gate structures 162' shown in FIG. 2O.

Processes and materials for forming the semiconductor structure 100h may be similar to, or the same as, those for forming the semiconductor structure 100 described previously and are not repeated herein. In addition, the processes and materials for forming the enlarged trenches 150'h/the gate trenches 154h/the modified gate trenches 154'h, the etched contact etch stop layers 144h/the modified contact etch stop layers 144'h, the etched mask structures 148h/the modified mask structures 148'h, the oxide layers 158h, the modified gate spacers 126"h, the etched interlayer dielectric layers 146'h, and the gate structures 162h/162'h are similar to, or the same as, those for forming the enlarged trenches 150'/the gate trenches 154/the modified gate trenches 154', the etched contact etch stop layers 144/the modified contact etch stop layers 144', the etched mask structures 148/the modified mask structures 148', the oxide layers 158, the modified gate spacers 126", the etched interlayer dielectric layers 146', and the gate structures 162/162' described previously and are not repeated herein.

Some variations and/or modifications may be made to the embodiments described above. For example, the shapes of the dummy gate structures may be different from those shown in the semiconductor structures 100 and 100a to 100h, while other processes may still be the same as those described above.

FIGS. 11A to 11G illustrate intermediate stages of manufacturing a semiconductor structure 100i in accordance with some embodiments. The semiconductor structure 100i may be similar to the semiconductor structure 100 described previously, except its dummy gate structures have wider bottom portions than the top portions in accordance with some embodiments.

Figure 11A:
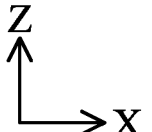

More specifically, the processes shown in FIGS. 1A to 1C described previously are performed, and then dummy gate structures 118i are formed across the fin structure 104 and gate spacers 126i are formed on the sidewalls of the dummy gate structures 118i, as shown in FIG. 11A in accordance with some embodiments. Similar to the dummy gate structures 118, each of the dummy gate structures 118i includes a dummy gate dielectric layer 120 and a dummy gate electrode layer 122, and the hard mask layers 124 are formed over the dummy gate structures 118i.

Meanwhile, the dummy gate structures 118i have sloped sidewalls and the top portions of the dummy gate structures 118i are narrower than the bottom portions in accordance with some embodiments. That is, the top surface of the dummy gate structures 118*i* is wider than the bottom surface of the dummy gate structures 118*i* in accordance with some embodiments.

Furthermore, the gate spacers 126*i* formed on the sloped sidewalls of the dummy gate structures 118*i* also have sloped sidewalls in accordance with some embodiments. In some embodiments, each of the gate spacers 126*i* includes the first spacer layer 128 and the second spacer layer 129, and the first spacer layers 128 and the second spacer layers 129 also have sloped sidewalls.

Figure 11B:
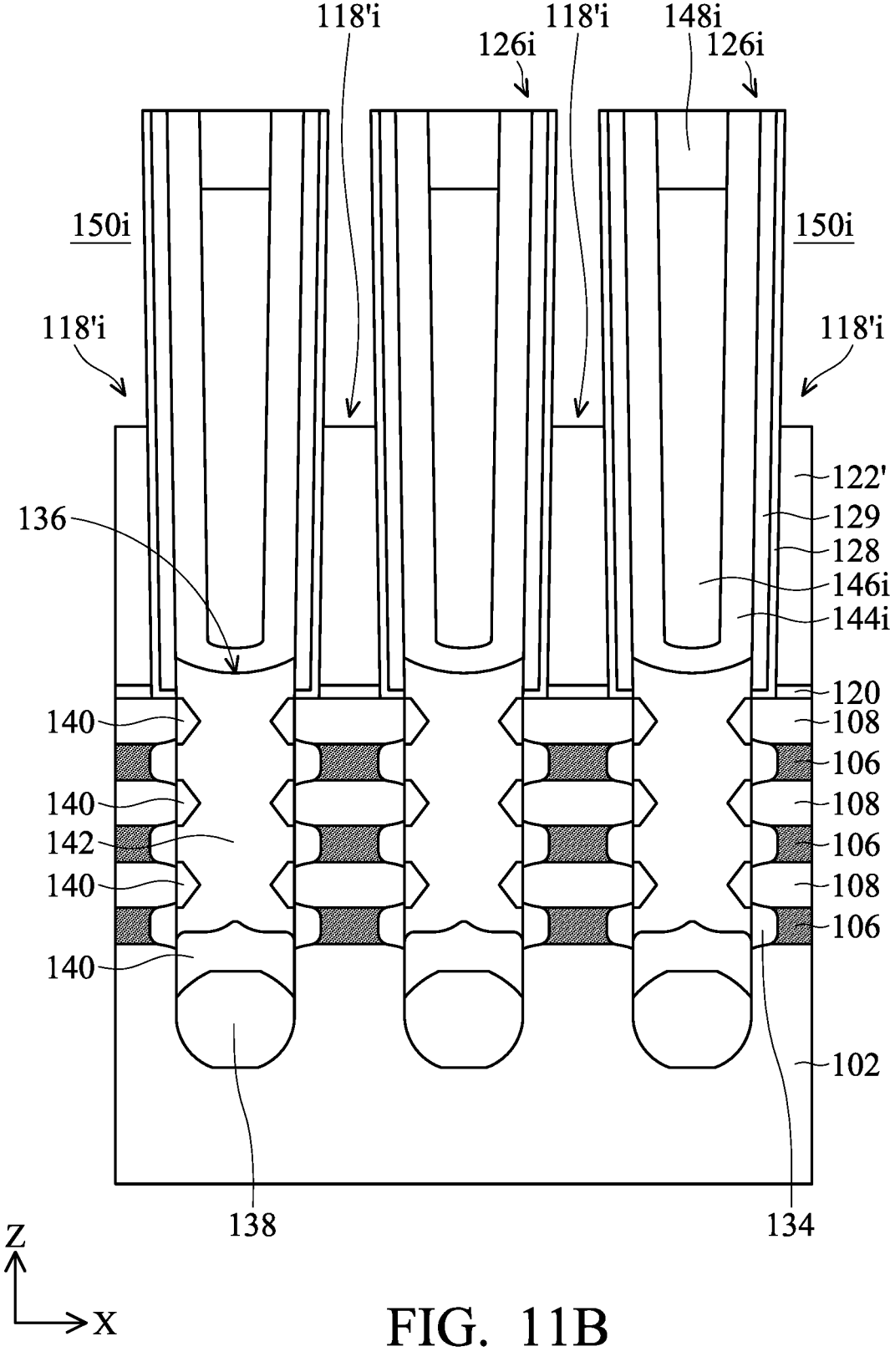

Next, the processes shown in FIGS. 2B to 2F are performed to form the source/drain structures 136, contact etch stop layers 144*i*, interlayer dielectric layers 146*i*, and mask structures 148*i*, as shown in FIG. 11B in accordance with some embodiments. More specifically, the source/drain structures 136 are formed in the fin structure 104, and the contact etch stop layers 144*i* are conformally formed over the source/drain structures and the sloped sidewalls of the gate spacers 126*i* in accordance with some embodiments. Afterwards, the interlayer dielectric layers 146*i* and the mask structures 148*i* are formed over the contact etch stop layers 144*i* in accordance with some embodiments. In addition, since the dummy gate structures 118*i* have tapered shapes, the distance between the top portions of adjacent dummy gate structures 118*i* is wider than the distance between the bottom portions of adjacent dummy gate structures 118*i* in accordance with some embodiments. Accordingly, the interlayer dielectric layers 146*i* have wider top portions and narrower bottom portions in accordance with some embodiments.

Next, the upper portions of the dummy gate structures 118*i* are removed to form trenches 150*i* over shortened dummy gate structures 118'*i*, as shown in FIG. 11B in accordance with some embodiments. The gate electrode layers 122 are etched to form shortened gate electrode layers 122' of the shortened dummy gate structures 118'*i* in accordance with some embodiments. In some embodiments, trenches 150*i* over the shortened dummy gate structures 118'*i* have narrower top portions and wider bottom portions.

Figure 11C:
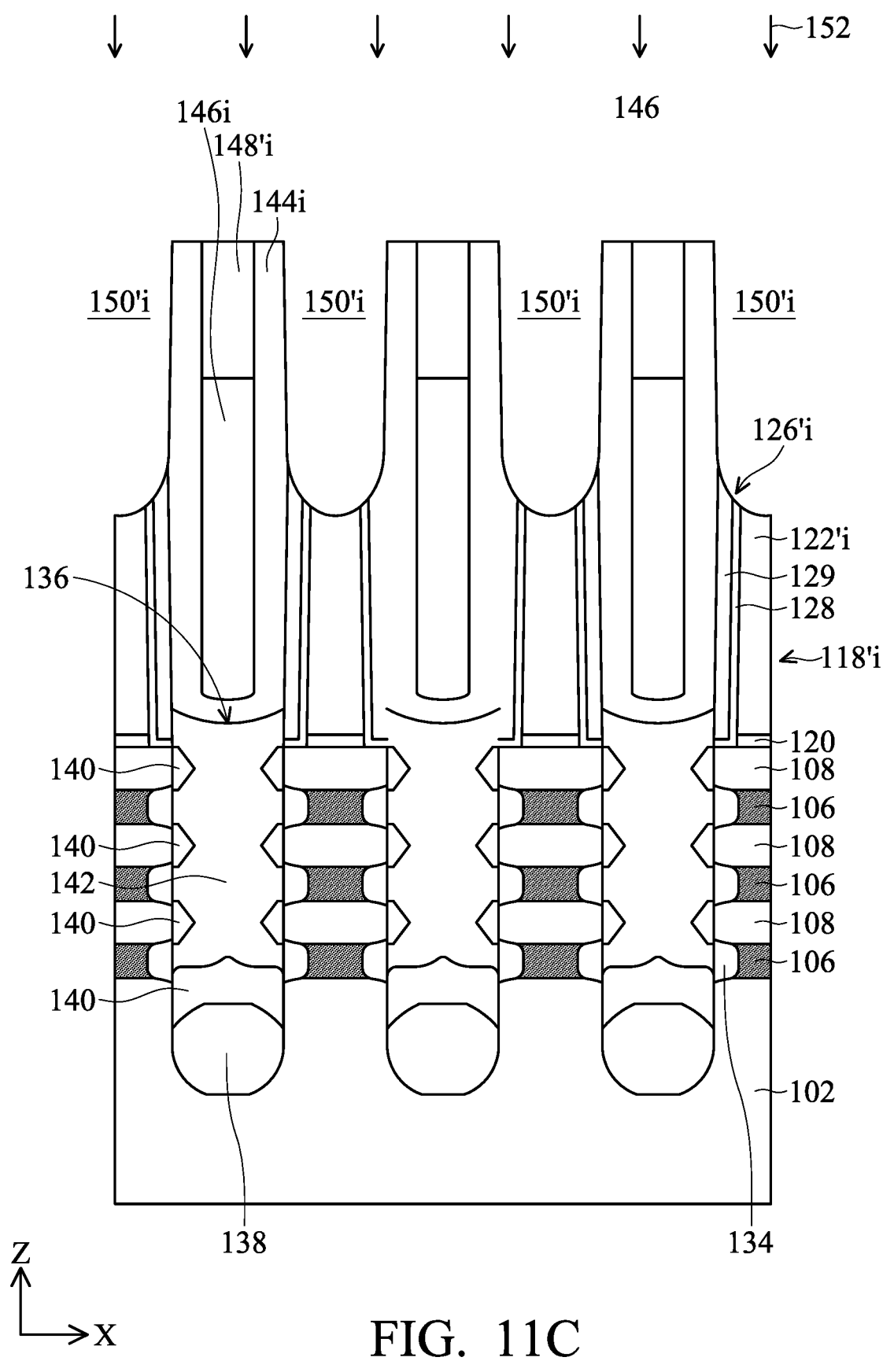
Figure 11D:
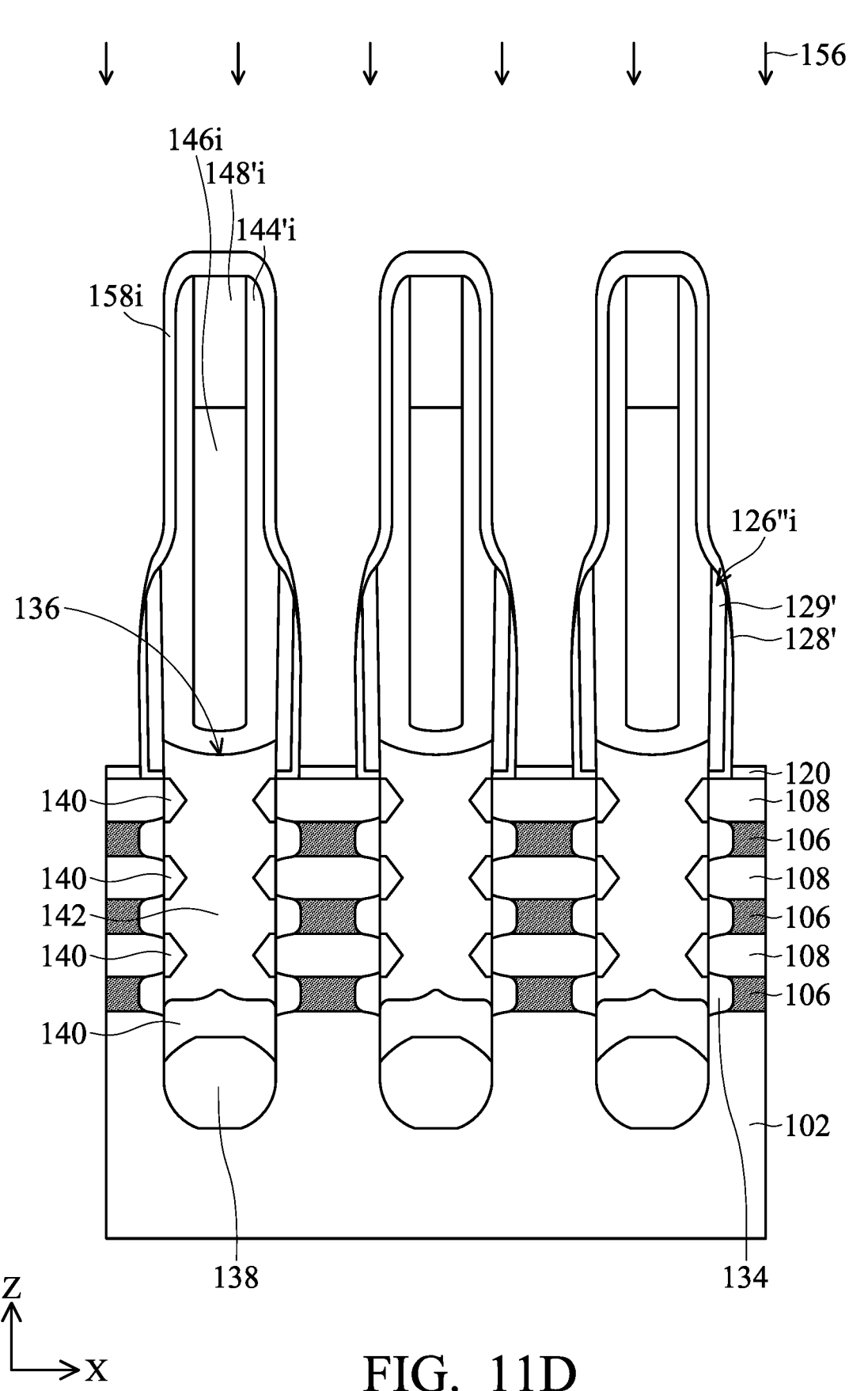

Next, the processes shown in FIG. 2G described previously are performed, and the gate spacers 126*i* are etched to form enlarged trenches 150'*i* by performing the etching process 152, as shown in FIG. 11C in accordance with some embodiments. Afterwards, the processes shown in FIGS. 2H and 2I described previously are performed to form oxide layers 158*i*, as shown in FIG. 11D in accordance with some embodiments. More specifically, the shortened gate spacers 126'*i*, the contact etch stop layer 144*i*, and the mask structures 148*i* are partially oxidized during the oxidation treatment 156, and the oxide layers 158*i* are formed over modified gate spacers 126''*i*, modified contact etch stop layer 144'*i*, and modified mask structures 148'*i* in accordance with some embodiments.

Figure 11E:
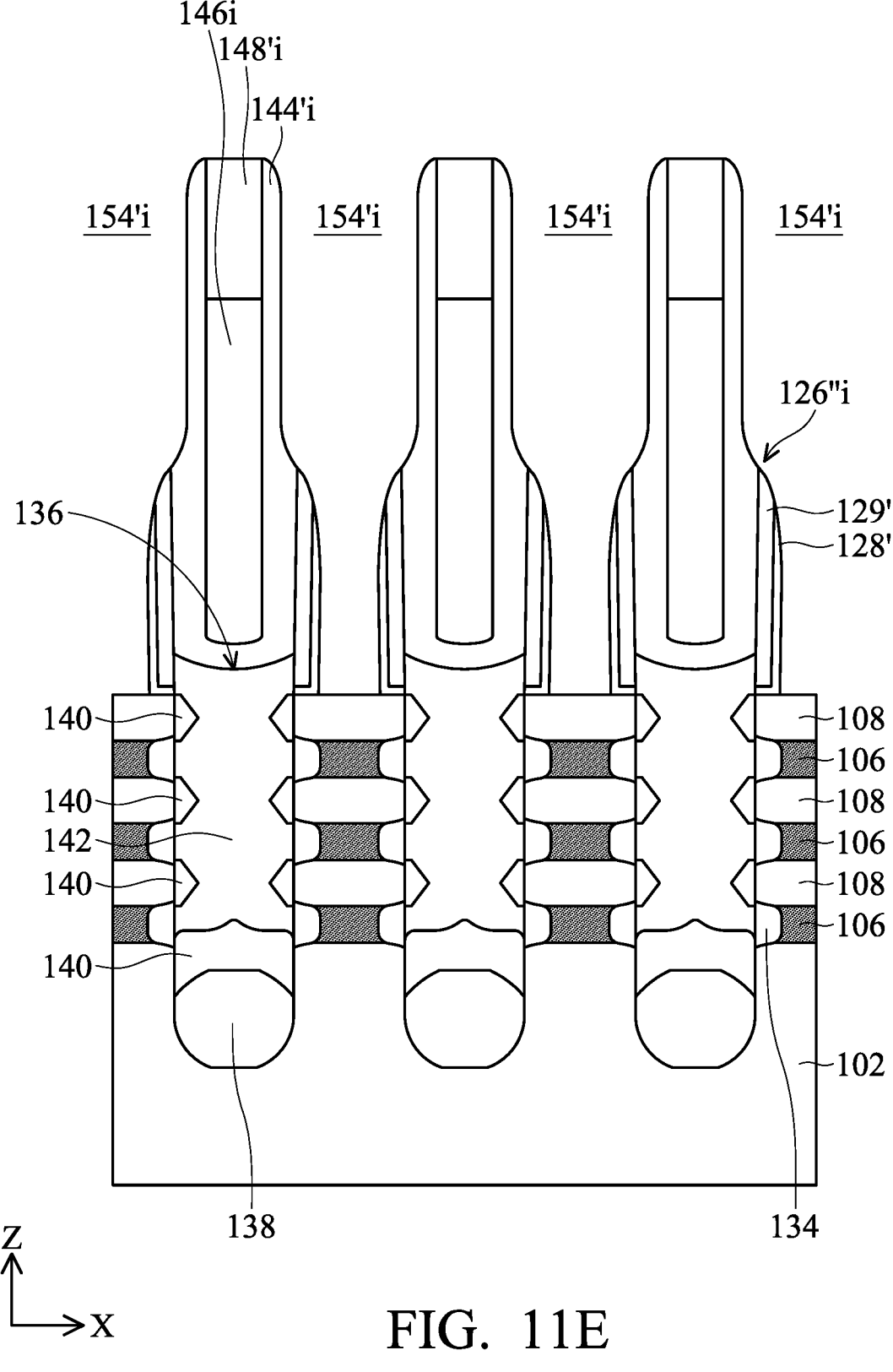

After the oxidation treatment 156 is performed, the oxide layers 158*i* and the dummy gate dielectric layers 120 are removed to expose the modified gate spacers 126''*i*, the modified contact etch stop layer 144'*i*, the modified mask structures 148'*i*, and the topmost layer of the second semiconductor material layers 108, as shown in FIG. 11E in accordance with some embodiments. After the oxide layers 158*i* are removed, the gate trenches 154*i* are enlarged to form modified gate trenches 154'*i* in accordance with some embodiments.

As described previously, the dummy gate structures 118*i* have narrower top portions, and therefore the original gate trenches may also have narrower top portions. However, since the profile of the gate trenches have been modified to form the modified gate trenches 154*i*, the topmost portions of the modified gate trenches 154*i* may still be greater than the bottom portions of the modified gate trenches 154*i*. In some embodiments, the top portions of the modified gate trenches 154*i* are wider than the bottom portions of the modified gate trenches 154*i*, and the bottom portions of the modified gate trenches 154*i* are wider than the middle portions of the modified gate trenches 154*i*.

Figure 11F:
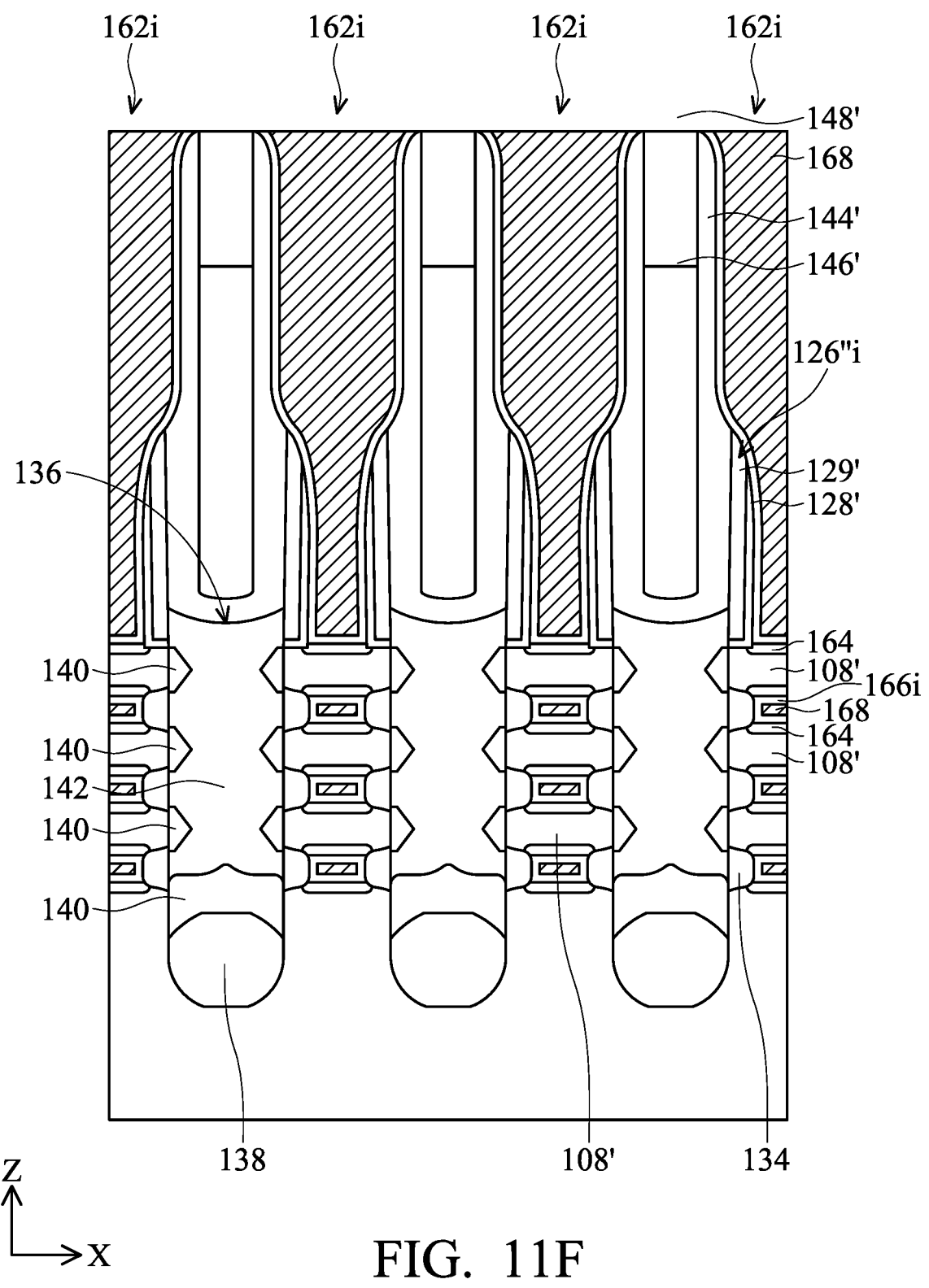
Figure 11G:
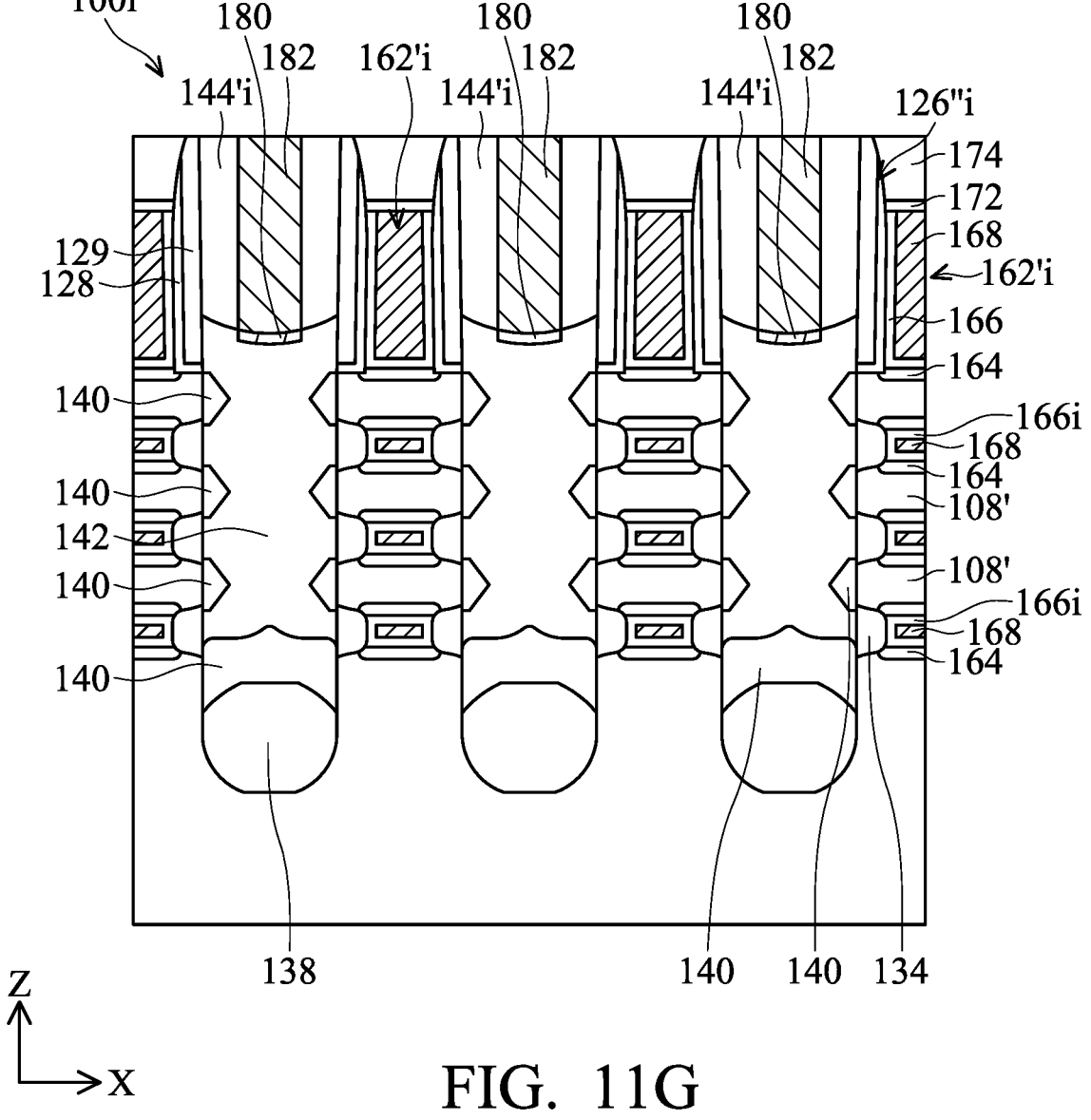

Next, the processes shown in FIGS. 2K and 2L described previously are performed to form gate stacks 162*i* are formed in the modified gate trenches 154'*i* and the gaps between the channel layers 108', as shown in FIG. 11F in accordance with some embodiments. Afterwards, the processes shown in FIGS. 2M to 2O described previously are performed to form the semiconductor structure 100*i*, as shown in FIG. 11G in accordance with some embodiments. As described previously, although the dummy gate structures 118*i* have slope sidewalls, the formation of voids or seams in gate structures 162'*i* may still be prevented since the gate structures 162'*i* are formed in the modified gate trenches 154'*i*.

Processes and materials for forming the semiconductor structure 100*i* may be similar to, or the same as, those for forming the semiconductor structure 100 described previously and are not repeated herein. In addition, the processes and materials for forming the dummy gate structures 118*i*/ the shortened dummy gate structures 118'*i*, the gate spacers 126*i*/the shortened gate spacers 126'*i*/the modified gate spacers 126''*i*, the contact etch stop layers 144*i*, the interlayer dielectric layers 146*i*, the mask structures 148*i*, the trenches 150*i*/the enlarged trenches 150'*i*/the gate trenches 154*i*/the modified gate trenches 154'*i*, the oxide layers 158*i*, and the gate stacks 162*i*/the gate structures 162'*i* are similar to, or the same as, those for forming the dummy gate structures 118*i*/the shortened dummy gate structures 118', the gate spacers 126/the shortened gate spacers 126'/the modified gate spacers 126'', the contact etch stop layers 144, the interlayer dielectric layers 146, the mask structures 148, the trenches 150/the enlarged trenches 150'/the gate trenches 154/the modified gate trenches 154', the oxide layers 158, and the gate stacks 162/the gate structures 162' described previously and are not repeated herein.

Figure 12:
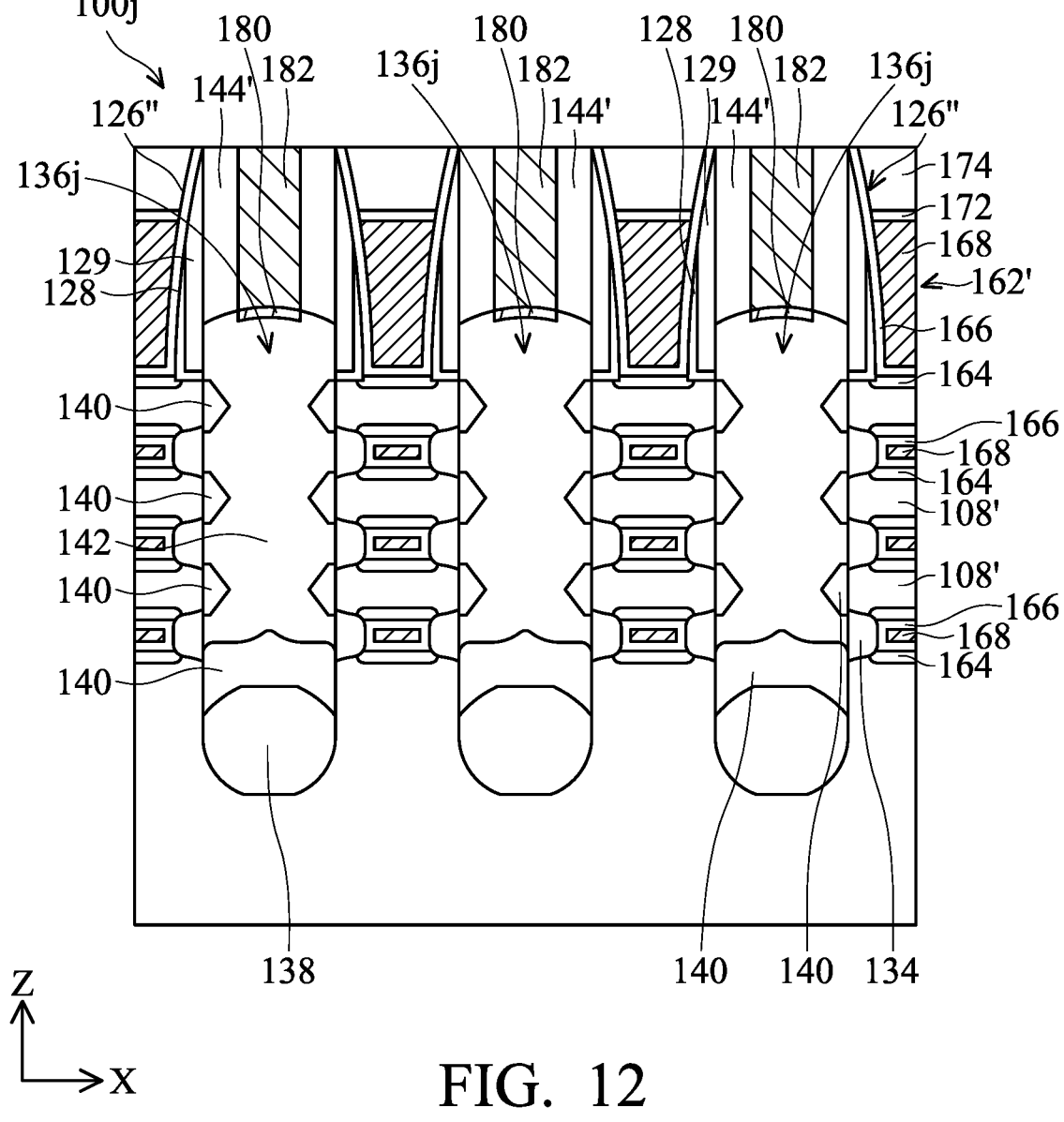
FIG. 12 illustrates a cross-sectional view of a semiconductor structure in accordance with some embodiments.

Other variations and/or modifications may be made to the embodiments described above. For example, the shapes of the source/drain structures may be different from those shown in the semiconductor structures 100 and 100*a* to 100*i*, while other processes may still be the same as those described above. FIG. 12 illustrates a cross-sectional view of a semiconductor structure 100*j* in accordance with some embodiments. The semiconductor structure 100*j* may be similar to the semiconductor structure 100 described previously, except the shapes of its source/drain structures 136*j* are different from those in the semiconductor structure 100 in accordance with some embodiments.

More specifically, the top portions of the source/drain structures 136*j* are not recessed before forming the contact etch stop layer in accordance with some embodiments. In some embodiments, the source/drain structures 136*j* have convex top surfaces in contact with the modified contact etch stop layers 144' and the silicide layers 180. Processes and materials for forming the semiconductor structure 100*j* may be similar to, or the same as, those for forming the semiconductor structure 100 described previously and are not repeated herein. In addition, the processes and materials for forming the source/drain structures 136*j* are similar to, or the same as, those for forming the source/drain structures 136 described previously and are not repeated herein.

Figure 13:
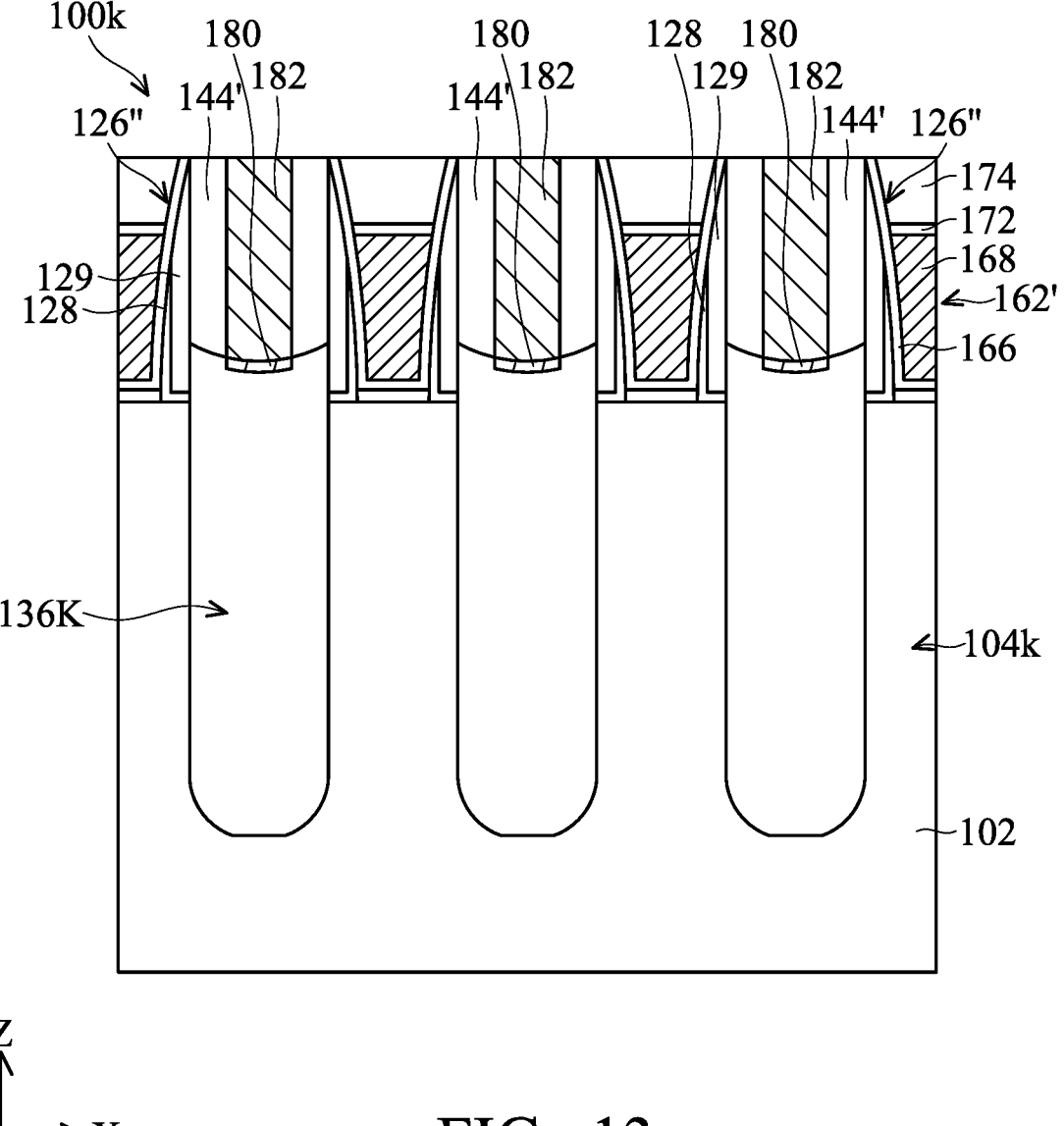
FIG. 13 illustrates a cross-sectional view of a semiconductor structure in accordance with some embodiments.

Furthermore, the processes for forming the semiconductor structures 100 and 100*a* to 100*j* described above may also be applied to FinFET structures. FIG. 13 illustrates a cross-sectional view of a semiconductor structure 100*k* in accordance with some embodiments. The semiconductor structure 100*k* may be similar to the semiconductor structure 100 described previously, except the fin structures 104*k* are formed by patterning the substrate 102 without forming the semiconductor material stacks in accordance with some embodiments.

More specifically, the processes shown in FIGS. 2C, 2D, and 2K are not performed when forming a FinFET structures, and source/drain structures 136*k* are formed in the recesses of the fin structure 104*k* in accordance with some embodiments. Other processes and materials for forming the semiconductor structure 100*k* may be similar to, or the same as, those for forming the semiconductor structure 100 described previously and are not repeated herein.

It should be appreciated that the alternatives shown in semiconductor structures 100*i*, 100*j*, and 100*k* may also be applied to the semiconductor structures 100*a* to 100*h*. For example, the tapered dummy gate structures 118*i* and the gate structures 162*i*/162'*i* shown in FIGS. 11A to 11G may also be applied to the semiconductor structures 100*a* to 100*h*. In addition, the semiconductor structures described above may be used in logic regions, SRAM regions, or both in semiconductor devices.

Generally, dummy gate structures may be formed first and then may be replaced by gate structures. However, the gate trenches formed by removing the dummy gate structures may have sharp corners and/or high aspect ratio as the size of the semiconductor devices continuously decreases, such that voids and seams may be formed in the gate structures, resulting in poor performance (e.g. low R, more defects) and yield.

Accordingly, in some embodiments of the disclosure, the profile of the gate trenches are modified (e.g. to form the modified gate trenches 154', 154'*e*, 154'*f*, 154'*h*, and 154'*i*) before forming the gate structures (e.g. the gate structures 162', 162'*b*, 162'*c*, 162'*d*, 162'*e*, 162'*f*, 162'*h*, and 162'*i*). More specifically, the oxidation treatment (e.g. the oxidation treatment 156, 156*c*, and 156*d*) are performed, so that the corners of the material layer in the gate trenches are rounded and therefore the modified gate trenches have smooth profiles in which the gate stacks can be filled more easily without the formation of voids and seams. Since the voids and seams formed in the gate structures may result in higher resistance or the damage of the gate structures during the gate etching back process, the semiconductor structures described above may have improved performance and uniformity.

Furthermore, the profile of the modified gate trenches may be adjusted according to the application. For example, when the aspect ratio of the originally gate trenches are relatively high, the gate spacers may be shortened and/or oxidized more, so the modified gate trenches may have wider top portion, so that the formation of the gate structures may be easier. In some other examples, the modified gate spacer may have substantially the same thickness as the originally formed gate spacer, so that the separation between the gate structures and the contacts may be ensured.

It should be noted that elements in FIGS. 1A to 13 that are the same may be designated by the same numerals, may include similar materials, and may be formed by similar processes; therefore such redundant details are omitted in the interest of brevity. In addition, although FIGS. 1A to 13 are described in relation to the method, it will be appreciated that the structures disclosed in FIGS. 1A to 13 are not limited to the method but may stand alone as structures independent of the method. Similarly, the methods shown in FIGS. 1A to 13 are not limited to the disclosed structures but may stand alone independent of the structures. Furthermore, the channel layers described above may include nanostructures such as nanowires, nanosheets, or other applicable nanostructures in accordance with some embodiments.

Also, while the disclosed methods are illustrated and described below as a series of acts or events, it will be appreciated that the illustrated ordering of such acts or events may be altered in some other embodiments. For example, some acts may occur in a different order or concurrently with other acts or events apart from those illustrated and/or described above. In addition, not all illustrated acts may be required to implement one or more aspects or embodiments of the description above. Furthermore, one or more of the acts depicted above may be carried out in one or more separate acts and/or phases.

Furthermore, the terms "approximately," "substantially," "substantial" and "about" used above account for small variations and may be varied in different technologies and may be within the deviation range understood by those skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The formation of the semiconductor structure may include forming a dummy gate structure and gate spacers over the dummy gate structures. The dummy gate structure may be removed and the profile of the gate trench may be modified. The gate structure formed in the modified gate trench may have less or no voids and seams, and therefore the performance of the semiconductor structure may be improved.

In some embodiments, a method for manufacturing a semiconductor structure is provided. The method for manufacturing the semiconductor structure includes forming a fin structure protruding from a substrate. In addition, the fin structure includes first semiconductor material layers and second semiconductor material layers alternately stacked. The method for manufacturing the semiconductor structure also includes forming a dummy gate structure across the fin structure and forming a gate spacer on a sidewall of the dummy gate structure. The method for manufacturing the semiconductor structure also includes partially oxidizing the gate spacer to form an oxide layer and removing the oxide layer to form a modified gate spacer. The method for manufacturing the semiconductor structure also includes removing the first semiconductor material layers to form gaps and forming a gate structure in the gaps to wrap around the second semiconductor material layers and over the second semiconductor material layers to cover the modified gate spacer.

In some embodiments, a method for manufacturing a semiconductor structure is provided. The method for manufacturing the semiconductor structure includes alternately stacking first semiconductor material layers and second semiconductor material layers to form a semiconductor stack over a substrate and patterning the semiconductor stack to form a fin structure. The method also includes forming a dummy gate structure across the fin structure. In addition, the dummy gate structure comprises a dummy oxide layer and a dummy gate electrode layer. The method also includes forming gate spacers on sidewalls of the dummy gate structure and removing an upper portion of dummy gate electrode layer to form a trench. The method also includes etching the gate spacers from the trench and oxidizing the gate spacers to form an oxide layer. The method also includes removing the oxide layer and removing the first semiconductor material layers. The method also includes forming a gate structure wrapping around the second semiconductor material layers.

In some embodiments, a semiconductor structure is provided. The semiconductor structure includes a substrate and channel layers formed over the substrate. The semiconductor structure also includes a gate structure wrapping around the channel layers and a gate spacer formed over a topmost layer of the channel layers. The semiconductor structure also includes a mask structure formed over the gate structure. In addition, the gate spacer has a curved sidewall in contact with both the gate structure and the mask structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a fin structure protruding from a substrate, wherein the fin structure comprises first semiconductor material layers and second semiconductor material layers alternately stacked;

forming a dummy gate structure across a channel region of the fin structure;

forming a gate spacer on a sidewall of the dummy gate structure;

recessing a source/drain region of the fin structure to form a source/drain recess;

forming a source/drain feature over the source/drain recess;

depositing a contact etch stop layer (CESL) over the source/drain recess;

depositing an interlayer dielectric (ILD) layer over the CESL;

replacing a top portion of the ILD layer with a mask feature;

recessing the dummy gate structure until a top surface of the dummy gate structure is lower than a bottom surface of the mask feature;

after the recessing the dummy gate structure, etching the gate spacer above the recessed dummy gate structure to form shortened gate spacer;

after the etching of the gate spacer, removing the recessed dummy gate structure;

after the removing of the recessed dummy gate structure, partially oxidizing the gate spacer to form an oxide layer;

removing the oxide layer to form a modified gate spacer;

removing the first semiconductor material layers over the channel region to form gaps; and forming a gate structure in the gaps to wrap around the second semiconductor material layers and over the second semiconductor material layers to cover the modified gate spacer.

2. The method for manufacturing the semiconductor structure as claimed in claim 1, wherein the modified gate spacer has a sloped sidewall in direct contact with the gate structure.

3. The method for manufacturing the semiconductor structure as claimed in claim 2, wherein a bottom portion of the modified gate spacer is wider than a top portion of modified gate spacer.

4. The method for manufacturing the semiconductor structure as claimed in claim 3, further comprising:

removing an upper portion of the gate structure to form a recess; and forming a mask structure in the recess, wherein a top surface of the mask structure is wider than a bottom surface of the mask structure.

5. The method for manufacturing the semiconductor structure as claimed in claim 4, wherein the mask structure is in contact with the modified gate spacer.

6. The method for manufacturing the semiconductor structure as claimed in claim 1, further comprising:

recessing the dummy gate structure to form a trench exposing a first sidewall of the gate spacer before partially oxidizing the gate spacer to form the oxide layer; and partially removing the gate spacer from the trench.

7. The method for manufacturing the semiconductor structure as claimed in claim 6, further comprising:

forming a source/drain structure attached to the second semiconductor material layers;

forming a contact etch stop layer over the source/drain structure and covering a second sidewall of the gate spacer; and forming an interlayer dielectric layer over the contact etch stop layer, wherein the contact etch stop layer is exposed by the trench after partially removing the gate spacer from the trench and is also partially oxidized to form the oxide layer.

8. The method for manufacturing the semiconductor structure as claimed in claim 7, wherein a portion of the interlayer dielectric layer is exposed by the trench after removing the oxide layer to form the modified gate spacer.

9. A method for manufacturing a semiconductor structure, comprising:

alternately stacking first semiconductor material layers and second semiconductor material layers to form a semiconductor stack over a substrate;

patterning the semiconductor stack to form a fin structure;

forming a dummy gate structure across a channel region of the fin structure, wherein the dummy gate structure comprises a dummy oxide layer and a dummy gate electrode layer;

forming gate spacers on sidewalls of the dummy gate structure;

recessing a source/drain region of the fin structure to form a source/drain recess;

forming a source/drain feature over the source/drain recess;

depositing a contact etch stop layer (CESL) over the source/drain recess;

depositing an interlayer dielectric (ILD) layer over the CESL;

replacing a top portion of the ILD layer with a mask feature;

removing an upper portion of dummy gate electrode layer to form a trench over a lower portion of the dummy gate electrode layer, a top surface of the lower portion being lower than a bottom surface of the mask feature;

after the removing of the upper portion of the dummy gate electrode layer, etching the gate spacers from the trench to form shortened gate spacers;

oxidizing the shortened gate spacers to form an oxide layer;

removing the oxide layer;

removing the first semiconductor material layers over the channel region of the fin structure; and forming a gate structure wrapping around the second semiconductor material layers.

10. The method for manufacturing the semiconductor structure as claimed in claim 9, further comprising:

removing a bottom portion of the dummy gate electrode layer to expose the dummy oxide layer before oxidizing the gate spacers to form the oxide layer.

11. The method for manufacturing the semiconductor structure as claimed in claim 9, further comprising:

oxidizing a topmost layer of the second semiconductor material layers to form a thickened dummy oxide layer; and removing the thickened dummy oxide layer.

12. The method for manufacturing the semiconductor structure as claimed in claim 11, wherein the topmost layer of the second semiconductor material layers is thicker than a bottommost layer of the second semiconductor material layers before patterning the semiconductor stack to form the fin structure.

13. The method for manufacturing the semiconductor structure as claimed in claim 11, wherein a portion of the topmost layer of the second semiconductor material layers in contact with the gate structure is thinner than a bottommost layer of the second semiconductor material layers after removing the thickened dummy oxide layer.

14. The method for manufacturing the semiconductor structure as claimed in claim 9, further comprising:

forming source/drain structures attached to opposite sides of the second semiconductor material layers;

forming a contact etch stop layer over the source/drain structures and covering sidewalls of the gate spacers; and partially oxidizing the contact etch stop layer to form the oxide layer.

15. A method, comprising:

forming, over a substrate, a fin-shaped structure that includes first semiconductor layers interleaved by second semiconductor layers;

forming a dummy gate structure over a channel region of the fin-shaped structure;

depositing a spacer layer over the dummy gate structure and the fin-shaped structure;

anisotropically etching a source/drain region of the fin-shaped structure to form a source/drain recess and to pattern the spacer layer to form a gate spacer along a sidewall of the dummy gate structure;

forming a source/drain feature over the source/drain recess;

depositing a contact etch stop layer over the source/drain feature;

depositing an interlayer dielectric layer over the contact etch stop layer;

partially removing a top portion of the interlayer dielectric layer to form a top recess;

after the partially removing, depositing a mask layer over the top recess;

after the depositing of the mask layer, removing an upper portion of dummy gate electrode layer to form a trench over a lower portion of the dummy gate electrode layer;

after the removing of the upper portion of the dummy gate electrode, etching the gate spacer from the trench to form shortened gate spacer;

after the etching of the gate spacers, oxidizing the shortened gate spacers to form an oxide layer;

removing the oxide layer;

selectively removing the first semiconductor layers in the channel region of the fin-shaped structure to form a plurality of channel layers from the second semiconductor layers; and forming a gate structure to wrap around each of the plurality of channel layers.

16. The method of claim 15, further comprising:

laterally recessing the first semiconductor layers to form notches; and forming inner spacers in the notches.

17. The method of claim 15, wherein the forming of the source/drain feature comprises:

depositing a leakage blocking layer to interface the substrate; and depositing first epitaxial layer to interface the leakage blocking layer and sidewalls of the second semiconductor layers exposed in the source/drain recess.

18. The method of claim 15, wherein the mask layer comprises SiN, SiCN, SiOC, SiOCN, $HfO_2$, $ZrO_2$, HfAlO, HfSiO, or $Al_2O_3$.

19. The method of claim 15, wherein the etching of the gate spacer comprises use of $CF_4$ or HF.

20. The method of claim 15, wherein the oxidizing comprises use of a decoupled plasma oxide (DPO) process.

* * * * *